United States Patent
Kim et al.

(10) Patent No.: US 10,452,257 B2
(45) Date of Patent: Oct. 22, 2019

(54) VEHICLE USER INTERFACE APPARATUS AND VEHICLE

(71) Applicant: LG ELECTRONICS INC., Seoul (KR)

(72) Inventors: Jonghoon Kim, Seoul (KR); Yeonji Lee, Seoul (KR); Heonsuk Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 412 days.

(21) Appl. No.: 15/388,701

(22) Filed: Dec. 22, 2016

(65) Prior Publication Data

US 2017/0228126 A1 Aug. 10, 2017

Related U.S. Application Data

(60) Provisional application No. 62/294,155, filed on Feb. 11, 2016, provisional application No. 62/271,010, filed on Dec. 22, 2015.

(30) Foreign Application Priority Data

Aug. 29, 2015 (KR) ........................ 10-2016-0110292

(51) Int. Cl.
*G06F 3/048* (2013.01)
*G06F 3/0488* (2013.01)
(Continued)

(52) U.S. Cl.
CPC ............ *G06F 3/0488* (2013.01); *B60K 35/00* (2013.01); *B60Q 3/16* (2017.02); *B60R 1/00* (2013.01); *B60W 50/082* (2013.01); *B60W 50/10* (2013.01); *B60W 50/16* (2013.01); *G01S 19/13* (2013.01); *G02B 6/005* (2013.01);
(Continued)

(58) Field of Classification Search
CPC combination set(s) only.
See application file for complete search history.

(56) References Cited

U.S. PATENT DOCUMENTS 6,104,101 A * 8/2000 Miller .................... B60K 35/00
307/10.1
2006/0175900 A1 8/2006 Ono et al.
(Continued)

FOREIGN PATENT DOCUMENTS

CN 203046907 U * 7/2013
CN 103870772 A * 6/2014 ......... G06F 3/03547
(Continued)

*Primary Examiner* — Pei Yong Weng
(74) *Attorney, Agent, or Firm* — Birch, Stewart, Kolasch & Birch, LLP

(57) ABSTRACT

A vehicle user interface apparatus for a vehicle including a light emitting unit configured to emit light; a touch sensor configured to sense a touch; a processor configured to control the light emitting unit to emit the light in response to an event, activate the touch sensor when the light is emitted, and provide a signal to control a vehicle device corresponding to a touch input received through the activated touch sensor; and a cover covering the light emitting unit, the touch sensor, and the processor, the cover configured to transmit the light into a passenger compartment with a specific shape when the light is emitted.

27 Claims, 44 Drawing Sheets

(51) Int. Cl.
*B60Q 3/16* (2017.01)
*B60R 1/00* (2006.01)
*B60W 50/08* (2012.01)
*B60W 50/10* (2012.01)
*B60W 50/16* (2012.01)
*G01S 19/13* (2010.01)
*F21V 8/00* (2006.01)
*G05D 1/00* (2006.01)
*G05D 1/02* (2006.01)
*B60K 35/00* (2006.01)
*B60W 50/14* (2012.01)

(52) U.S. Cl.
CPC ......... *G02B 6/0055* (2013.01); *G02B 6/0076* (2013.01); *G05D 1/0088* (2013.01); *G05D 1/0248* (2013.01); *B60K 2370/143* (2019.05); *B60K 2370/146* (2019.05); *B60K 2370/148* (2019.05); *B60K 2370/1438* (2019.05); *B60K 2370/152* (2019.05); *B60K 2370/16* (2019.05); *B60K 2370/186* (2019.05); *B60K 2370/1868* (2019.05); *B60K 2370/21* (2019.05); *B60K 2370/333* (2019.05); *B60K 2370/349* (2019.05); *B60R 2300/207* (2013.01); *B60R 2300/301* (2013.01); *B60R 2300/8006* (2013.01); *B60R 2300/8066* (2013.01); *B60R 2300/8093* (2013.01); *B60W 2050/146* (2013.01); *B60W 2420/42* (2013.01); *B60W 2420/52* (2013.01)

(56) References Cited

U.S. PATENT DOCUMENTS

| 2007/0171674 | A1 | 7/2007 | Deutsch | |
|---|---|---|---|---|
| 2007/0183635 | A1* | 8/2007 | Weidhaas | B60R 25/25 382/118 |
| 2008/0212215 | A1* | 9/2008 | Schofield | B60C 23/00 359/844 |
| 2014/0126177 | A1* | 5/2014 | Geyl | B60K 37/06 362/23.05 |
| 2015/0066238 | A1* | 3/2015 | Todd | B60K 28/063 701/1 |

FOREIGN PATENT DOCUMENTS

| DE | 102012101314 A1 | 8/2013 |
|---|---|---|
| FR | 2963839 A1 | 2/2012 |
| GB | 2108189 A | 5/1983 |
| GB | 2489795 A | 10/2012 |
| WO | WO 2012/175369 A1 | 12/2012 |
| WO | WO 2015/109216 A1 | 7/2015 |

\* cited by examiner

VEHICLE USER INTERFACE APPARATUS AND VEHICLE

CROSS-REFERENCE TO RELATED APPLICATION

This application claims the priority benefit of U.S. Provisional Applications (i) Nos. 62/271,010, filed on Dec. 22, 2015, and (ii) No. 62/294,155, filed on Feb. 11, 2016. This application also claims the priority benefit of Korean Patent Application No. 10-2016-0110292, filed in the Republic of Korea on Aug. 29, 2016. The entire contents of the above applications are incorporated herein by reference.

BACKGROUND OF THE INVENTION

1. Field of the Invention

The present invention relates to a vehicle user interface apparatus and a vehicle.

2. Description of the Related Art

A representative example of a vehicle may be an automobile. Further, a variety of sensors and electronic devices have been mounted in vehicles for the convenience of a user who uses the vehicle. In particular, for user driving convenience, an Advanced Driver Assistance System (ADAS) has been actively studied. In addition, efforts have been being made to develop autonomous vehicles.

A vehicle may also include a user interface apparatus to support an interface between the vehicle and a user. The user interface apparatus include various input units and output units. However, in some cases, an input undesired by the user can be received via an input unit. In addition, the input unit sometimes hinders vehicle interior design.

SUMMARY OF THE INVENTION

Accordingly, one object of the present invention is to address the above-noted and other problems of the related art.

Another object of the present invention is to provide a vehicle user interface apparatus which outputs light only when necessary, and to receive a user's input via a touch sensor so as to control a vehicle device.

Still another object of the present invention to provide a vehicle including the aforementioned vehicle user interface apparatus.

To achieve these and other advantages and in accordance with the purpose of the present invention, as embodied and broadly described herein, the present invention provides in one aspect a vehicle user interface apparatus for a vehicle including a light emitting unit configured to emit light; a touch sensor configured to sense a touch; a processor configured to control the light emitting unit to emit the light in response to an event, activate the touch sensor when the light is emitted, and provide a signal to control a vehicle device corresponding to a touch input received through the activated touch sensor; and a cover covering the light emitting unit, the touch sensor, and the processor, the cover configured to transmit the light into a passenger compartment with a specific shape when the light is emitted.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The embodiments will be described in detail with reference to the following drawings in which like reference numerals refer to like elements wherein.

DETAILED DESCRIPTION OF THE PREFERRED EMBODIMENTS

Figure 1:
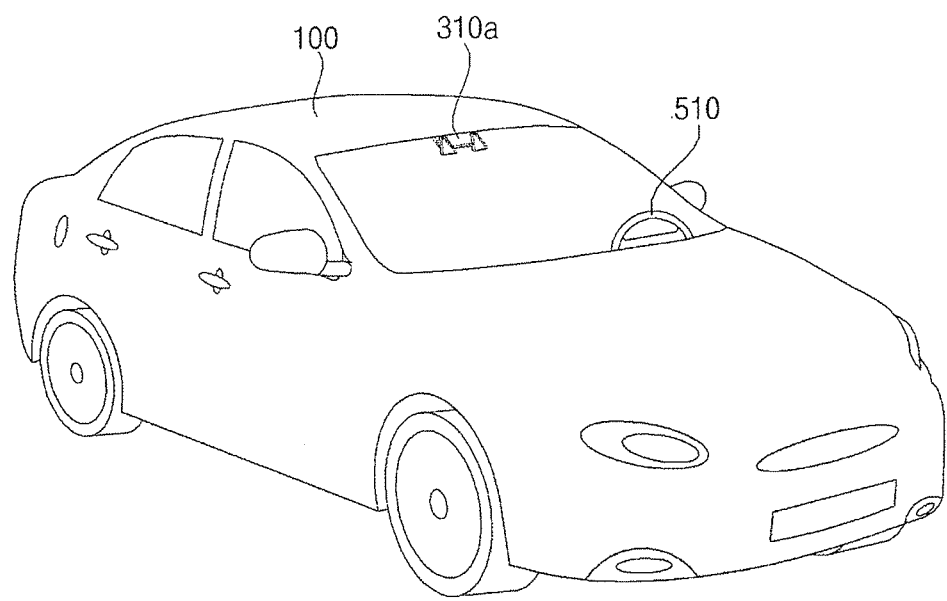
FIG. 1 is a view illustrating the external appearance of a vehicle according to an embodiment of the present invention.
Figure 1:
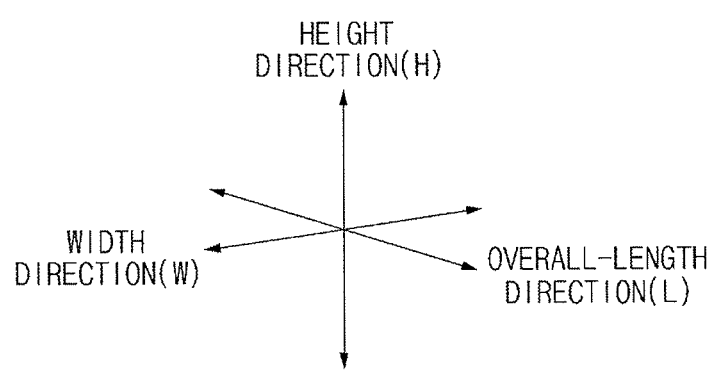
Figure 2:
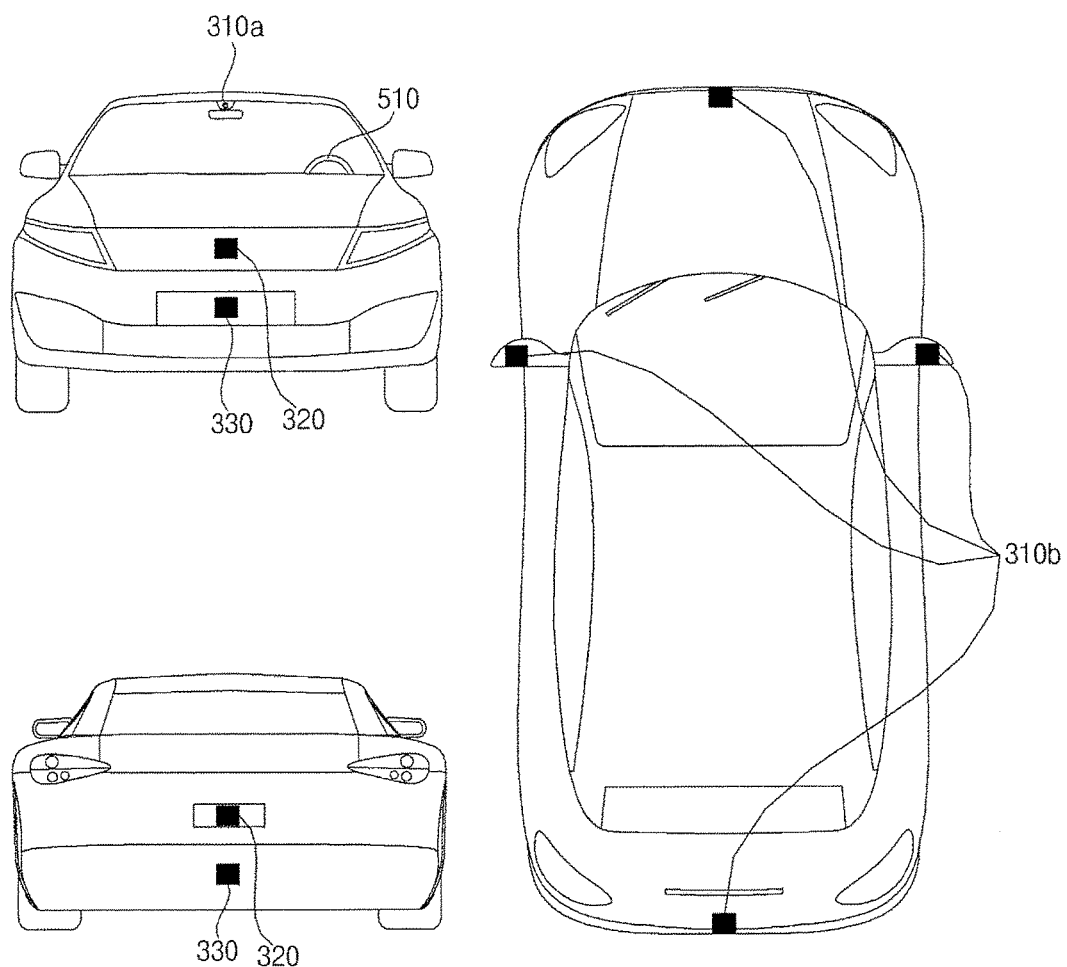
FIG. 2 are different angled views of the external appearance of a vehicle according to an embodiment of the present invention.
Figure 3:
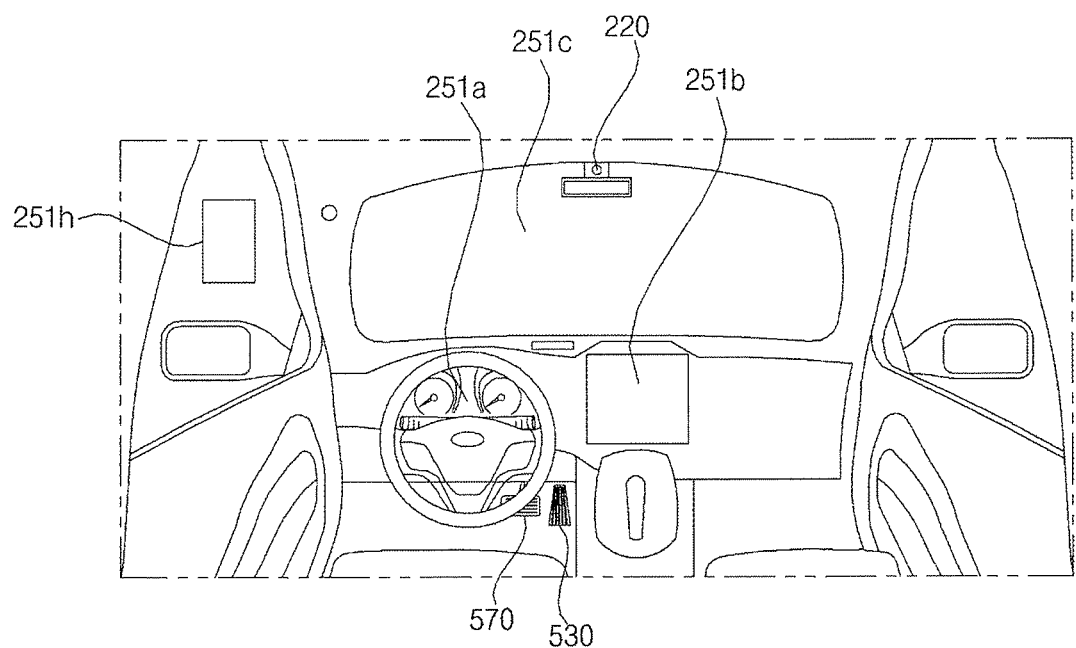
FIGS. 3 and 4 are views illustrating the interior configuration of a vehicle according to an embodiment of the present invention.
Figure 4:
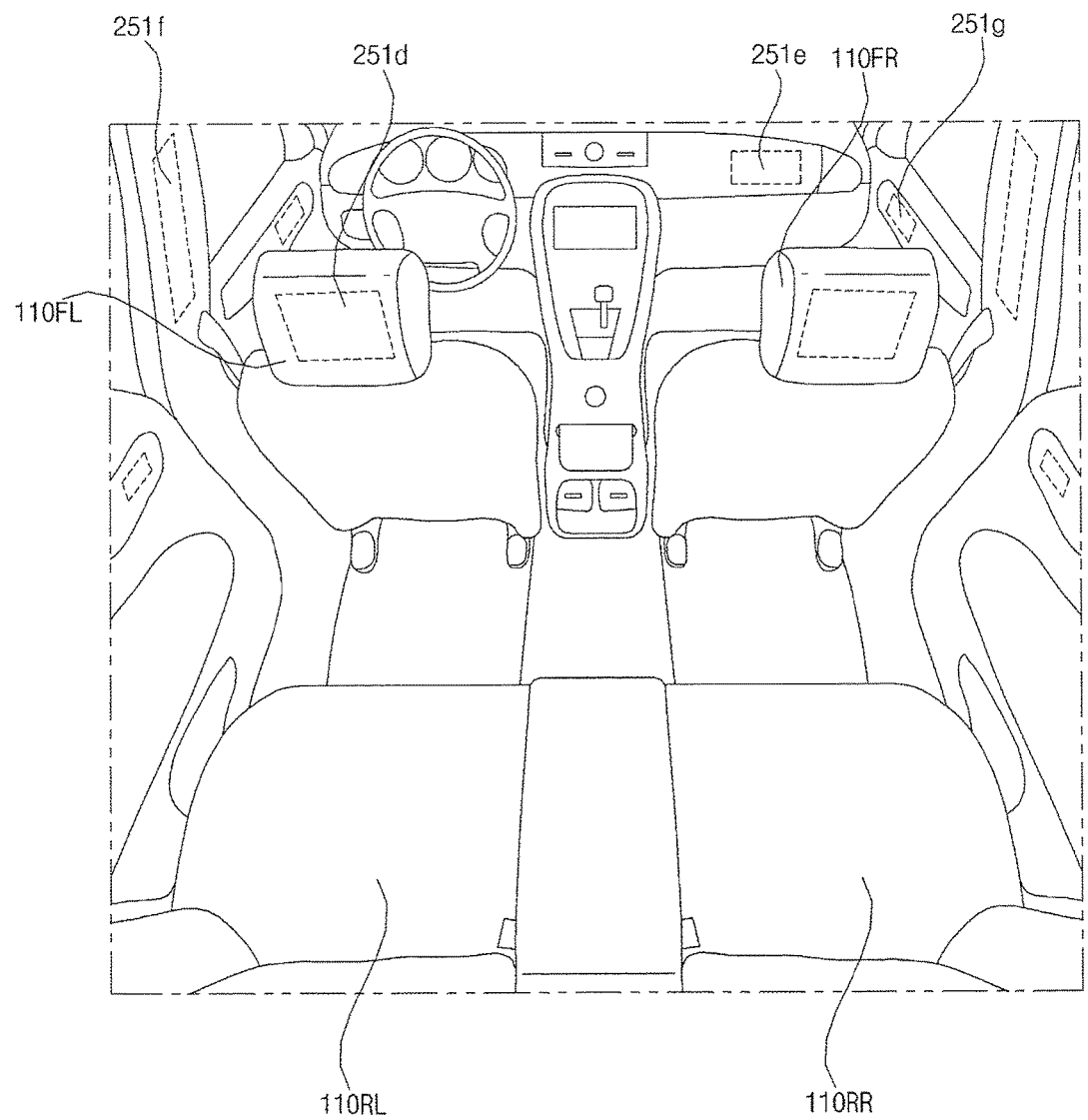

Hereinafter, the embodiments disclosed in the present specification will be described in detail with reference to the accompanying drawings, and the same or similar elements are denoted by the same reference numerals even though they are depicted in different drawings and redundant descriptions thereof will be omitted. In the following description, with respect to constituent elements used in the following description, the suffixes "module" and "unit" are used or combined with each other only in consideration of ease in the preparation of the specification, and do not have or serve as different meanings.

Accordingly, the suffixes "module" and "unit" may be interchanged with each other. In addition, in the following description of the embodiments disclosed in the present specification, a detailed description of known functions and configurations incorporated herein will be omitted when it may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, the accompanying drawings include all modifications, equivalents and substitutions included in the scope and sprit of the present invention.

Although the terms "first," "second," etc., may be used herein to describe various components, these components should not be limited by these terms. These terms are only used to distinguish one component from another component. When a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise. In the present application, it will be further understood that the terms "comprises", "includes," etc. specify the presence of stated features, integers, steps, operations, elements, components, or combinations thereof, but do not preclude the presence or addition of one or more other features, integers, steps, operations, elements, components, or combinations thereof.

A vehicle as described in this specification may include an automobile and a motorcycle. Hereinafter, a description will be given based on an automobile. A vehicle as described in this specification may include all of an internal combustion engine vehicle including an engine as a power source, a hybrid vehicle including both an engine and an electric motor as a power source, and an electric vehicle including an electric motor as a power source. In the following description, "the left side of the vehicle" refers to the left side in the forward driving direction of the vehicle, and "the right side of the vehicle" refers to the right side in the forward driving direction of the vehicle.

As shown in FIGS. 1 to 7, a vehicle 100 includes a plurality of wheels rotated by a power source, and a steering input device 510 for controlling a driving direction of the vehicle 100. The vehicle 100 may be an autonomous vehicle and be switched to an autonomous driving mode or a manual mode in response to a user input.

Figure 7:
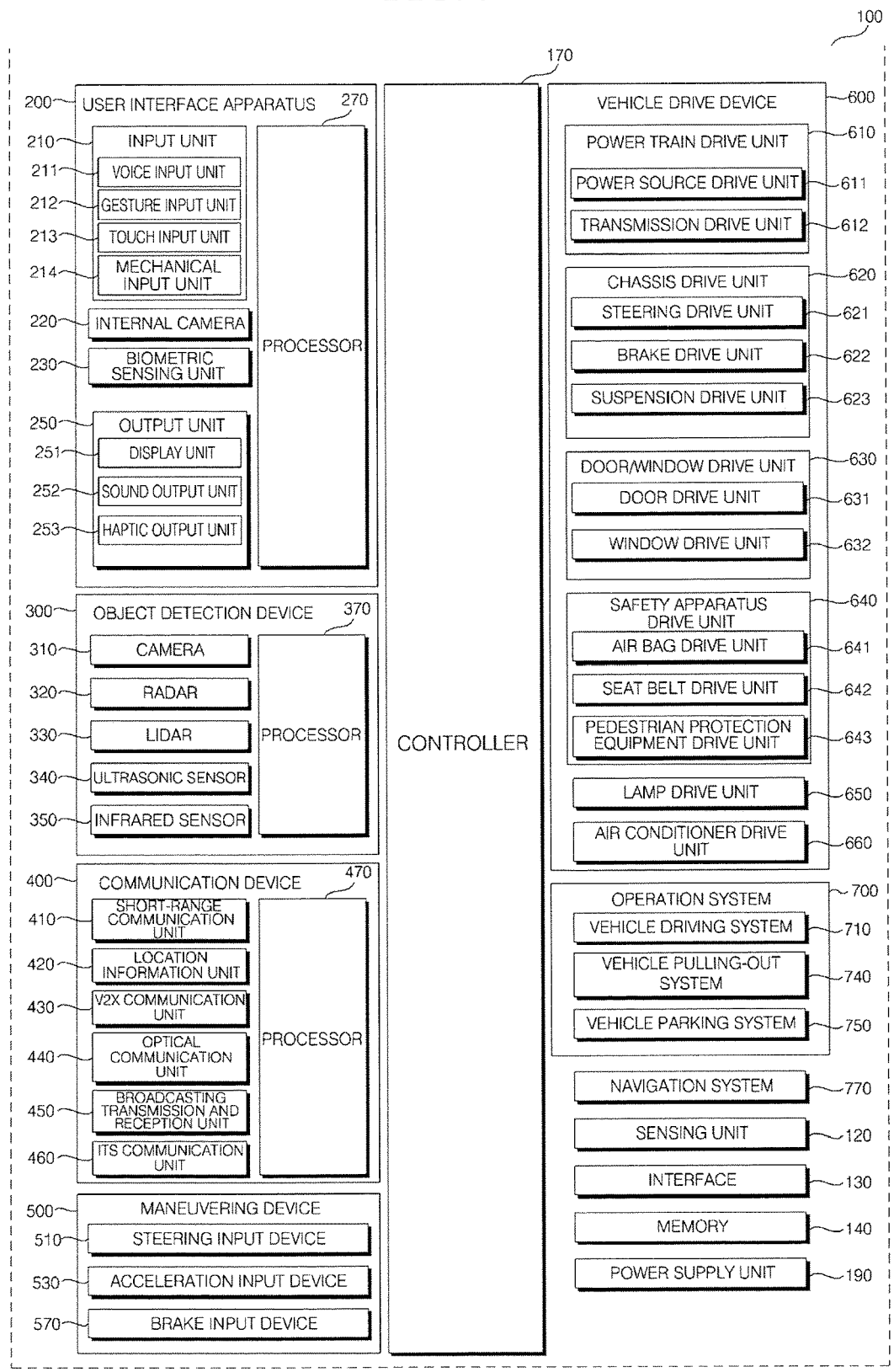
FIG. 7 is a block diagram illustrating a vehicle according to an embodiment of the present invention.

For example, in response to a user input received through a user interface apparatus 200 (FIG. 7), the vehicle 100 can be switched from a manual mode to an autonomous driving mode, or vice versa. The vehicle 100 may also be switched to the autonomous driving mode or to the manual mode based on driving environment information. In particular, the driving environment information may be generated based on object information provided by an object detection device 300 (FIG. 7).

For example, the vehicle 100 may be switched from the manual mode to the autonomous driving mode, or vice versa, based on driving environment information generated by the object detection device 300. In another example, the vehicle 100 may be switched from the manual mode to the autonomous driving mode, or vice versa, based on driving environment information received through a communication device 400.

The vehicle 100 can also be switched from the manual mode to the autonomous driving mode, or vice versa, based on information, data, and a signal provided from an external device. When the vehicle 100 operates in the autonomous driving mode, the autonomous vehicle 100 operates based on an operation system 700. For example, the autonomous vehicle 100 can operate based on information, data, or signals generated by a vehicle driving system 710, a vehicle pulling-out system 740, and a vehicle parking system 750.

While operating in the manual mode, the vehicle 100 can receive a user input for driving of the vehicle 100 through a maneuvering device 500. In response to the user input received through the maneuvering device 500, the vehicle 100 operates. The term "overall length" means the length from the front end to the rear end of the vehicle 100, the term "overall width" means the width of the vehicle 100, and the term "overall height" means the height from the bottom of the wheel to the roof.

In the following description, the term "overall length direction L" may mean the reference direction for the measurement of the overall length of the vehicle 100, the term "overall width direction W" may mean the reference direction for the measurement of the overall width of the vehicle 100, and the term "overall height direction H" may mean the reference direction for the measurement of the overall height of the vehicle 100.

As illustrated in FIG. 7, the vehicle 100 may include the user interface apparatus 200, the object detection device 300, the communication device 400, the maneuvering device 500, a vehicle drive device 600, the operation system 700, a navigation system 770, a sensing unit 120, an interface 130, a memory 140, a controller 170, and a power supply unit 190.

In some embodiments, the vehicle 100 may further include other components in addition to the aforementioned components, or may not include some of the aforementioned components. The user interface apparatus 200 is provided to support communication between the vehicle 100 and a user. The user interface apparatus 200 may receive a user input, and provide information generated in the vehicle 100 to the user. The vehicle 100 may enable User Interfaces (UI) or User Experience (UX) through the user interface apparatus 200.

The user interface apparatus 200 may include an input unit 210, an internal camera 220, a biometric sensing unit 230, an output unit 250, and a processor 270. In some embodiments, the user interface apparatus 200 may further include other components in addition to the aforementioned components, or may not include some of the aforementioned components.

The input unit 210 is configured to receive information from a user, and data collected in the input unit 210 may be analyzed by the processor 270 and then processed into a control command of the user. The input unit 210 may be disposed inside the vehicle 100 such as in a region of a steering wheel, a region of an instrument panel, a region of a seat, a region of each pillar, a region of a door, a region of a center console, a region of a head lining, a region of a sun visor, a region of a windshield, or a region of a window.

The input unit 210 may include a voice input unit 211, a gesture input unit 212, a touch input unit 213, and a mechanical input unit 214. The voice input unit 211 converts a voice input of a user into an electrical signal and the electrical signal is provided to the processor 270 or the controller 170. The voice input unit 211 may include one or more microphones.

The gesture input unit 212 converts a gesture input of a user into an electrical signal and the electrical signal is provided to the processor 270 or the controller 170. The gesture input unit 212 may include at least one selected from among an infrared sensor and an image sensor for sensing a gesture input of a user.

In some embodiments, the gesture input unit 212 can sense a three-dimensional (3D) gesture input of a user. Thus, the gesture input unit 212 can include a plurality of light emitting units for outputting infrared light, or a plurality of image sensors. The gesture input unit 212 may also sense the 3D gesture input by employing a Time of Flight (TOF) scheme, a structured light scheme, or a disparity scheme.

Further, the touch input unit 213 converts a user's touch input into an electrical signal and the converted electrical signal is provided to the processor 270 or the controller 170. The touch input unit 213 may include a touch sensor for sensing a touch input of a user.

In some embodiments, the touch input unit 210 may be formed to be integral with a display unit 251 to implement a touch screen. In more detail, the touch screen can provide an input interface and an output interface between the vehicle 100 and the user. The mechanical input unit 214 may include a button, a dome switch, a jog wheel, a jog switch, etc. and an electrical signal generated by the mechanical input unit 214 is provided to the processor 270 or the controller 170.

Further, the mechanical input unit 214 may be located on a steering wheel, a center fascia, a center console, a cockpit module, a door, etc. Also, an internal camera 220 can acquire images of the inside of the vehicle 100 and the processor 270 can sense a user's condition based on the images of the inside of the vehicle 100. The processor 270 can also acquire information on an eye gaze of the user and sense a gesture of the user from the images of the inside of the vehicle 100.

In addition, the biometric sensing unit 230 acquires biometric information of the user and includes a sensor for acquiring biometric information of the user, and can utilize the sensor to acquire finger print information, heart rate information, etc. of the user. The biometric information can also be used for user authentication.

Further, the output unit 250 is configured to generate a visual, audio, or tactile output and may include the display unit 251, a sound output unit 252, and a haptic output unit 253. The display unit 251 can display graphic objects corresponding to various types of information.

The display unit 251 may include a Liquid Crystal Display (LCD), a Thin Film Transistor-Liquid Crystal Display (TFT LCD), an Organic Light-Emitting Diode (OLED), a flexible display, a 3D display, and an e-ink display. The display unit 251 can also form an inter-layer structure together with the touch input unit 213, or be formed to be integral with the touch input unit 213 to implement a touch screen.

The display unit 251 may also be implemented as a Head Up Display (HUD). When implemented as a HUD, the display unit 251 includes a projector module in order to output information through an image projected on a windshield or a window. The display unit 251 also includes a transparent display that may be attached on the windshield or the window.

The transparent display can display a predetermined screen with a predetermined transparency. In order to achieve the transparency, the transparent display may include a transparent Thin Film Electroluminescent (TFEL) display, an Organic Light Emitting Diode (OLED) display, a transparent Liquid Crystal Display (LCD), a transmissive transparent display, and a transparent Light Emitting Diode (LED) display. The transparency of the transparent display may be adjustable.

Further, the user interface apparatus 200 may include a plurality of display units 251a to 251g. The display unit 251 may be disposed in a region 251a of a steering wheel, a region 251b or 251e of an instrument panel, a region 251d of a seat, a region 251f of each pillar, a region 251g of a door, a region of a center console, a region of a head lining, a region of a sun visor, a region 251c of a windshield, or a region 251h of a window.

In addition, the sound output unit 252 converts an electrical signal from the processor 270 or the controller 170 into an audio signal, and outputs the audio signal. Thus, the sound output unit 252 may include one or more speakers. Further, the haptic output unit 253 generates a tactile output and can operate to vibrate a steering wheel, a safety belt, and seats 110FL, 110FR, 110RL, and 110RR so as to allow a user to recognize the output.

The processor 270 controls the overall operation of each unit of the user interface apparatus 200. In some embodiments, the user interface apparatus 200 may include a plurality of processors 270 or may not include the processor 270. When the user interface apparatus 200 does not include the processor 270, the user interface apparatus 200 operates under the control of the controller 170 or a processor of a different device inside the vehicle 100.

Further, the user interface apparatus 200 may be referred to as a display device for vehicle. The user interface apparatus 200 may operate under the control of the controller 170. In addition, the object detection device 300 is configured to detect an object outside the vehicle 100. The object may include various objects related to travelling of the vehicle 100.

Figure 5:
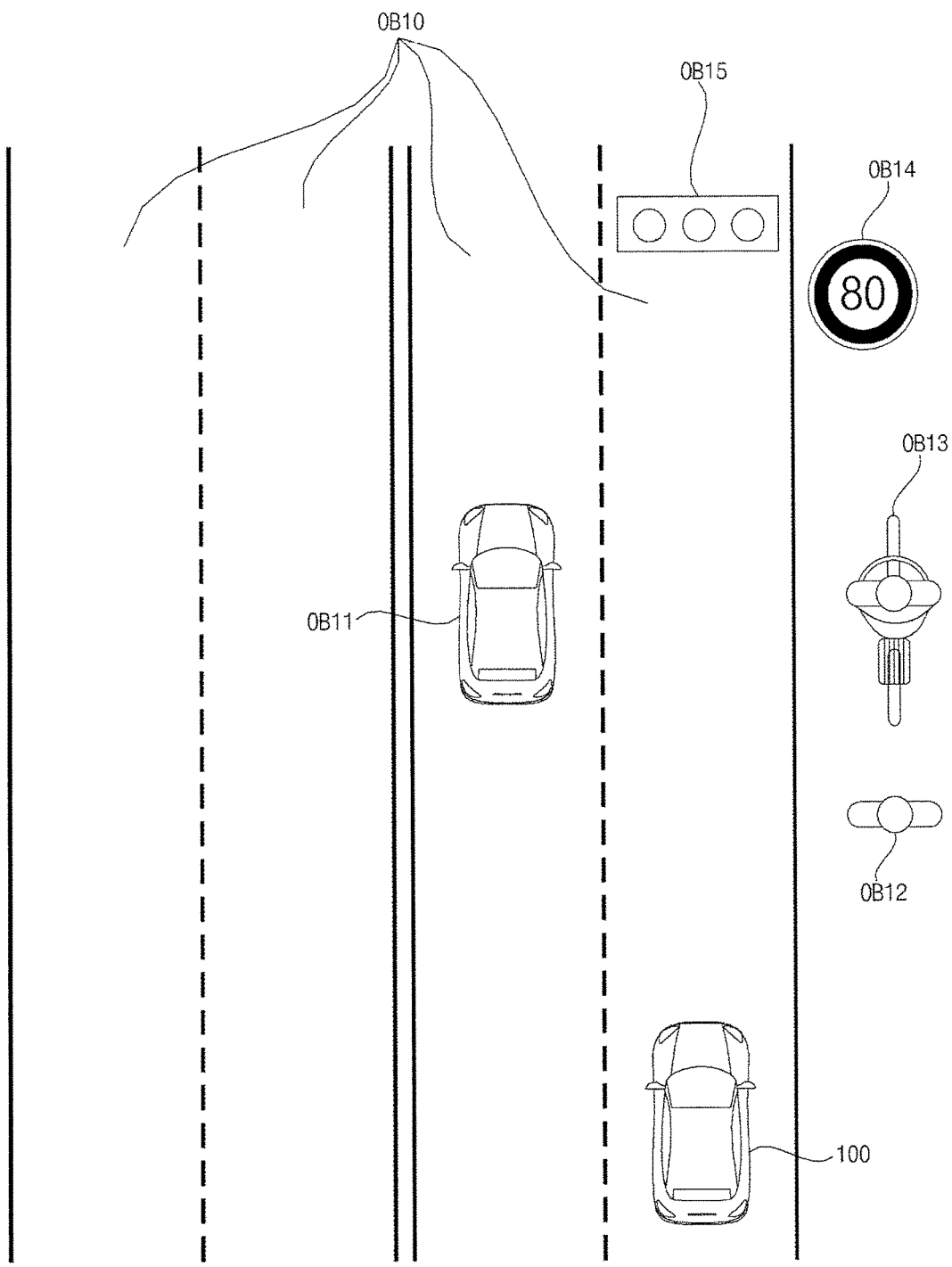
FIGS. 5 and 6 are views illustrating an object according to an embodiment of the present invention.
Figure 6:
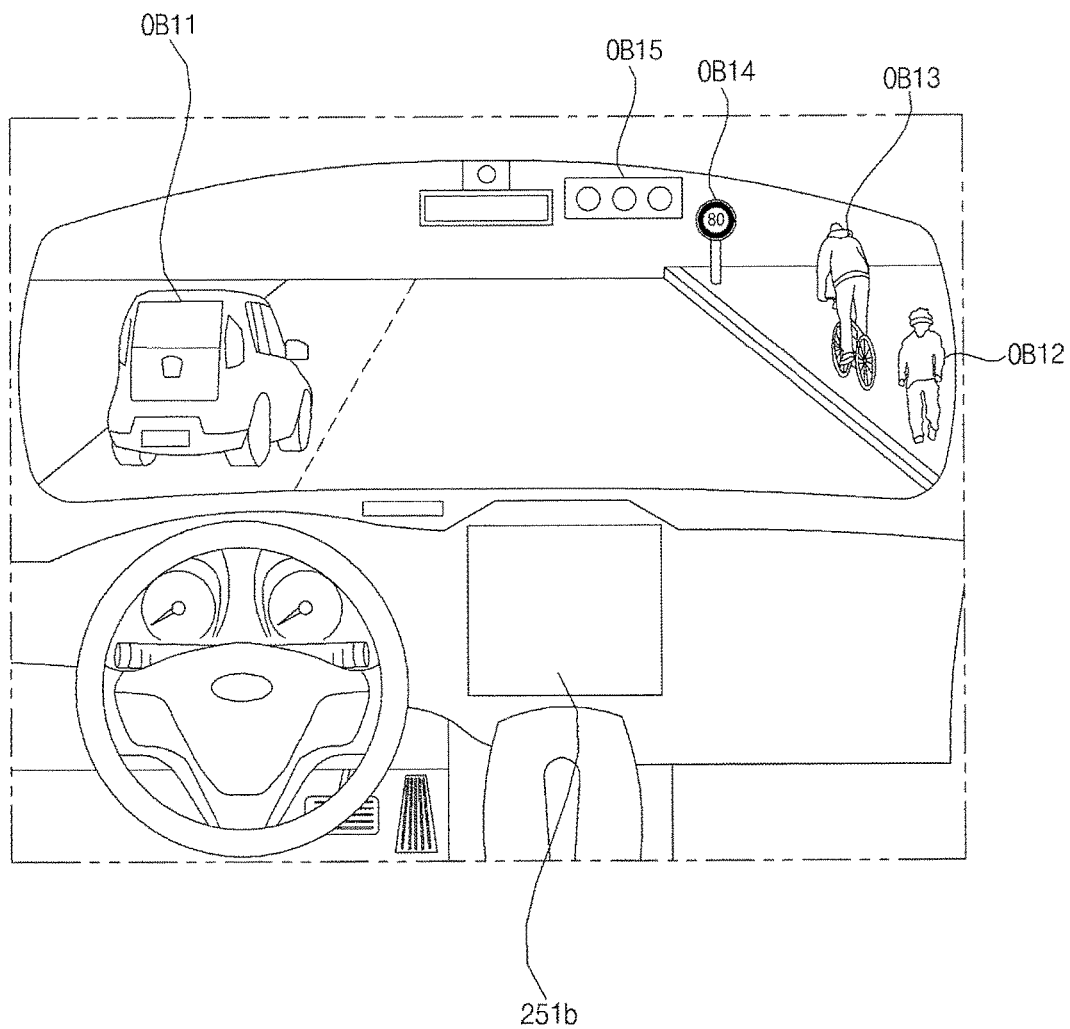

Referring to FIGS. 5 and 6, an object "O" may include a lane OB10, a nearby vehicle OB11, a pedestrian OB12, a two-wheeled vehicle OB13, a traffic signal OB14 and OB15, a light, a road, a structure, a bump, a geographical feature, an animal, etc. The lane OB10 may be a lane in which the vehicle 100 is traveling or a lane next to the lane in which the vehicle 100 is traveling. The lane OB10 may also include left and right lines that define the lane.

The nearby vehicle OB11 may be a vehicle that is travelling in the vicinity of the vehicle 100. The nearby vehicle OB11 may be a vehicle within a predetermined distance from the vehicle 100. For example, the nearby vehicle OB11 may be a vehicle that is preceding or following the vehicle 100. In addition, the pedestrian OB12 may be a person in the vicinity of the vehicle 100, may be a person within a predetermined distance from the vehicle 100 or a person on a sidewalk or on the roadway.

The two-wheeled vehicle OB13 is a vehicle that is located in the vicinity of the vehicle 100 and moves with two wheels. The two-wheeled vehicle OB13 may be a vehicle that has two wheels and is within a predetermined distance from the vehicle 100. For example, the two-wheeled vehicle OB13 may be a motorcycle or a bike on a sidewalk or the roadway.

The traffic signal may include a traffic light OB15, a traffic sign plate OB14, and a pattern or text painted on a road surface. The light may be light generated by a lamp provided in the nearby vehicle, a street light, solar light, etc. The road may include a road surface, a curve, and slopes, such as an upward slope and a downward slope.

The structure may be a body located around the road and is fixed onto the ground. For example, the structure may include a streetlight, a roadside tree, a building, a traffic light, and a bridge. The geographical feature may include a mountain and a hill.

Further, the object may be classified as a movable object or a stationary object. For example, the movable object may include a nearby vehicle and a pedestrian. For example, the stationary object may include a traffic signal, a road, and a structure. The object detection device 300 may include a camera 310, a radar 320, a lidar 330, an ultrasonic sensor 340, an infrared sensor 350, and a processor 370.

In some embodiments, the object detection device 300 may further include other components in addition to the aforementioned components, or may not include some of the aforementioned components. In addition, the camera 310 may be located at an appropriate position outside the vehicle 100 in order to acquire images of the outside of the vehicle 100. The camera 310 may be a mono camera, a stereo camera 310a, an Around View Monitoring (AVM) camera 310b, or a 360-degree camera.

For example, the camera 310 can be disposed near a front windshield in the vehicle 100 in order to acquire images of the front of the vehicle 100. Alternatively, the camera 310 can be disposed around a front bumper or a radiator grill. In another example, the camera 310 may be disposed near a rear glass in the vehicle 100 in order to acquire images of the rear of the vehicle 100. Alternatively, the camera 310 can be disposed around a rear bumper, a trunk, or a tailgate.

In yet another example, the camera 310 can be disposed near at least one of the side windows in the vehicle 100 in order to acquire images of the side of the vehicle 100. Alternatively, the camera 310 can be disposed around a side mirror, a fender, or a door. The camera 310 provides an acquired image to the processor 370.

Further, the radar 320 may include an electromagnetic wave transmission unit and an electromagnetic wave reception unit. The radar 320 can be realized as a pulse radar or a continuous wave radar depending on the principle of emission of an electronic wave. In addition, the radar 320 may be realized as a Frequency Modulated Continuous Wave (FMCW) type radar or a Frequency Shift Keying (FSK) type radar depending on the waveform of a signal.

The radar 320 can detect an object through the medium of an electromagnetic wave by employing a time of flight (TOF) scheme or a phase-shift scheme, and detect a location of the detected object, the distance to the detected object, and the speed relative to the detected object. The radar 320 can be located at an appropriate position outside the vehicle 100 in order to sense an object located in front of the vehicle 100, an object located to the rear of the vehicle 100, or an object located to the side of the vehicle 100.

The lidar 330 includes a laser transmission unit and a laser reception unit. The lidar 330 may be implemented by the TOF scheme or the phase-shift scheme and may be implemented as a drive type lidar or a non-drive type lidar. When implemented as the drive type lidar, the lidar 300 rotates by a motor and detect an object in the vicinity of the vehicle 100.

When implemented as the non-drive type lidar, the lidar 300 utilizes a light steering technique to detect an object located within a predetermined distance from the vehicle 100. The lidar 330 can detect an object through the medium of laser light by employing the TOF scheme or the phase-shift scheme, and detect a location of the detected object, the distance to the detected object, and the speed relative to the detected object.

The lidar 330 may be located at an appropriate position outside the vehicle 100 in order to sense an object located in front of the vehicle 100, an object located to the rear of the vehicle 100, or an object located to the side of the vehicle 100. The ultrasonic sensor 340 may include an ultrasonic wave transmission unit and an ultrasonic wave reception unit. The ultrasonic sensor 340 can detect an object based on an ultrasonic wave, and detect a location of the detected object, the distance to the detected object, and the speed relative to the detected object.

Further, the ultrasonic sensor 340 can be located at an appropriate position outside the vehicle 100 in order to detect an object located in front of the vehicle 100, an object located to the rear of the vehicle 100, and an object located to the side of the vehicle 100. The infrared sensor 350 includes an infrared light transmission unit and an infrared light reception unit. The infrared sensor 340 detects an object based on infrared light, and detects a location of the detected object, the distance to the detected object, and the speed relative to the detected object.

The infrared sensor 350 is located at an appropriate position outside the vehicle 100 in order to sense an object located in front of the vehicle 100, an object located to the rear of the vehicle 100, or an object located to the side of the vehicle 100. Further, the processor 370 controls the overall operation of each unit of the object detection device 300. For example, the processor 370 can detect and track an object based on acquired images, calculate the distance to the object and the speed relative to the object, acquire information on the distance to the object and information on the speed relative to the object based on a variation in size of the object over time in acquired images, etc.

In another example, the processor 370 can acquire information on the distance to the object or information on the speed relative to the object by employing a pin hole model or by profiling a road surface. In yet another example, the processor 370 can acquire information on the distance to the object and information on the speed relative to the object based on information on disparity in stereo images acquired from the stereo camera 310a.

Further, the processor 370 can detect and track an object based on a reflection electromagnetic wave which is formed as a result of reflection a transmission electromagnetic wave by the object. Based on the electromagnetic wave, the processor 370 can, for example, calculate the distance to the object and the speed relative to the object.

The processor 370 can also detect and track an object based on a reflection laser light which is formed as a result of reflection of transmission laser by the object. Based on the laser light, the processor 370 can, for example, calculate the distance to the object and the speed relative to the object. Further, the processor 370 can detect and track an object based on a reflection ultrasonic wave which is formed as a result of reflection of a transmission ultrasonic wave by the object. Based on the ultrasonic wave, the processor 370 can, for example, calculate the distance to the object and the speed relative to the object.

In addition, the processor 370 can detect and track an object based on reflection infrared light which is formed as a result of reflection of transmission infrared light by the object. Based on the infrared light, the processor 370 can, for example, calculate the distance to the object and the speed relative to the object. In some embodiments, the object detection device 300 may include a plurality of processors 370 or may not include the processor 370. For example, each of the camera 310, the radar 320, the lidar 330, the ultrasonic sensor 340, and the infrared sensor 350 may include its own processor.

When the object detection device 300 does not include the processor 370, the object detection device 300 operates under the control of the controller 170 or a processor inside the vehicle 100. The object detection device 300 can also operate under the control of the controller 170.

Further, the communication device 400 is configured to perform communication with an external device such as a nearby vehicle, a mobile terminal, or a server. The communication device 400 includes a transmission antenna, a reception antenna, a Radio Frequency (RF) circuit capable of implementing various communication protocols, and an RF device.

In more detail, the communication device 400 may include a short-range communication unit 410, a location information unit 420, a V2X communication unit 430, an optical communication unit 440, a broadcasting transmission and reception unit 450, an Intelligent Transport Systems (ITS) communication unit 460, and a processor 470. In some embodiments, the communication device 400 may further include other components in addition to the aforementioned components, or may not include some of the aforementioned components.

The short-range communication unit 410 is configured to perform short-range communication. The short-range communication unit 410 can support short-range communication using Bluetooth™, Radio Frequency IDdentification (RFID), Infrared Data Association (IrDA), Ultra-WideBand (UWB), ZigBee, Near Field Communication (NFC), Wireless-Fidelity (Wi-Fi), Wi-Fi Direct, and Wireless USB (Wireless Universal Serial Bus). The short-range communication unit 410 can form wireless area networks to perform short-range communication between the vehicle 100 and at least one external device.

Further, the location information unit 420 is configured to acquire location information of the vehicle 100. For example, the location information unit 420 may include a Global Positioning System (GPS) module or a Differential Global Positioning System (DGPS) module. The V2X communication unit 430 is configured to perform wireless communication between a vehicle and a server (that is, vehicle to infra (V2I) communication), wireless communication between a vehicle and a nearby vehicle (that is, vehicle to vehicle (V2V) communication), or wireless communication between a vehicle and a pedestrian (that is, vehicle to pedestrian (V2P) communication).

The optical communication unit 440 is configured to perform communication with an external device through the medium of light. The optical communication unit 440 includes a light emitting unit, which converts an electrical signal into an optical signal and transmits the optical signal to the outside, and a light receiving unit which converts a received optical signal into an electrical signal.

In some embodiments, the light emitting unit may be formed to be integral with a lamp provided included in the vehicle 100. In addition, the broadcasting transmission and reception unit 450 is configured to receive a broadcast signal from an external broadcasting management server or transmit a broadcast signal to the broadcasting management server through a broadcasting channel. The broadcasting channel may include a satellite channel, and a terrestrial channel, and the broadcast signal may include a TV broadcast signal, a radio broadcast signal, and a data broadcast signal.

In addition, the ITS communication unit 460 can exchange information, data, or signals with a traffic system. The ITS communication unit 460 can provide acquired information or data to the traffic system, receive information, data, or signals from the traffic system, receive traffic information from the traffic system and provide the traffic information to the controller 170. In another example, the ITS communication unit 460 can receive a control signal from the traffic system, and provide the control signal to the controller 170 or a processor provided in the vehicle 100.

Further, the processor 470 can control the overall operation of each unit of the communication device 400. In some embodiments, the communication device 400 may include a plurality of processors 470, or may not include the processor 470. When the communication device 400 does not include the processor 470, the communication device 400 may operate under the control of the controller 170 or a processor of a device inside of the vehicle 100.

Further, the communication device 400 can implement a vehicle display device, together with the user interface apparatus 200. In this instance, the vehicle display device can be referred to as a telematics device or an Audio Video Navigation (AVN) device. The communication device 400 can operate under the control of the controller 170.

In addition, the maneuvering device 500 is configured to receive a user input for driving the vehicle 100. As discussed above, in the manual mode, the vehicle 100 operates based on a signal provided by the maneuvering device 500. The maneuvering device 500 may include a steering input device 510, an acceleration input device 530, and a brake input device 570.

In more detail, the steering input device 510 receives a user input with regard to the direction of travel of the vehicle 100 and may take the form of a wheel to enable a steering input through the rotation thereof. In some embodiments, the steering input device may be provided as a touchscreen, a touch pad, or a button.

Further, the acceleration input device 530 receives a user input for acceleration of the vehicle 100, and the brake input device 570 receives a user input for deceleration of the vehicle 100. Each of the acceleration input device 530 and the brake input device 570 may take the form of a pedal. In some embodiments, the acceleration input device or the break input device can be configured as a touch screen, a touch pad, or a button. The maneuvering device 500 operates under the control of the controller 170.

In addition, the vehicle drive device 600 is configured to electrically control the operation of various devices of the vehicle 100. In more detail, the vehicle drive device 600 may include a power train drive unit 610, a chassis drive unit 620, a door/window drive unit 630, a safety apparatus drive unit 640, a lamp drive unit 650, and an air conditioner drive unit 660.

In some embodiments, the vehicle drive device 600 may further include other components in addition to the aforementioned components, or may not include some of the aforementioned components. Further, the vehicle drive device 600 may include a processor. Each unit of the vehicle drive device 600 may include its own processor.

The power train drive unit 610 controls the operation of a power train and may include a power source drive unit 611 and a transmission drive unit 612. The power source drive unit 611 controls a power source of the vehicle 100. When a fossil fuel-based engine is the power source, the power source drive unit 611 performs electronic control of the engine. Thus, the power source drive unit 611 can control, for example, the output torque of the engine and adjust the output toque of the engine under the control of the controller 170.

When an electric motor is the power source, the power source drive unit 611 controls the motor. The power source drive unit 610 can control, for example, the RPM and toque of the motor under the control of the controller 170. In addition, the transmission drive unit 612 can adjust the state of the transmission such as adjust a state of the transmission to a drive (D), reverse (R), neutral (N), or park (P) state. Further, when an engine is the power source, the transmission drive unit 612 can adjust a gear-engaged state to the drive position D.

The chassis drive unit 620 controls the operation of a chassis and 620 may include a steering drive unit 621, a brake drive unit 622, and a suspension drive unit 623. The steering drive unit 621 also performs electronic control of a steering apparatus provided inside the vehicle 100 and can change the direction of travel of the vehicle 100.

Further, the brake drive unit 622 performs electronic control of a brake apparatus provided inside the vehicle 100. For example, the brake drive unit 622 can reduce the speed of the vehicle 100 by controlling the operation of a brake located at a wheel. The brake drive unit 622 can also control a plurality of brakes individually and apply a different degree-braking force to each wheel.

The suspension drive unit 623 performs electronic control of a suspension apparatus inside the vehicle 100. For example, when the road surface is uneven, the suspension drive unit 623 controls the suspension apparatus so as to reduce the vibration of the vehicle 100.

Further, the suspension drive unit 623 controls a plurality of suspensions individually. In addition, the door/window drive unit 630 performs electronic control of a door apparatus or a window apparatus inside the vehicle 100 and may include a door drive unit 631 and a window drive unit 632.

The door drive unit 631 controls the door apparatus. For example, the door drive unit 631 controls opening or closing of a plurality of doors included in the vehicle 100, controls opening or closing of a trunk or a tail gate, and controls opening or closing of a sunroof. The window drive unit 632 can also perform electronic control of the window apparatus and control opening or closing of a plurality of windows included in the vehicle 100.

In addition, the safety apparatus drive unit 640 performs electronic control of various safety apparatuses provided inside the vehicle 100. In more detail, the safety apparatus drive unit 640 can include an airbag drive unit 641, a safety belt drive unit 642, and a pedestrian protection equipment drive unit 643. The airbag drive unit 641 performs electronic control of an airbag apparatus inside the vehicle 100. For example, upon detection of a dangerous situation, the airbag drive unit 641 controls an airbag to be deployed.

The safety belt drive unit 642 performs electronic control of a seatbelt apparatus inside the vehicle 100. For example, upon detection of a dangerous situation, the safety belt drive unit 642 controls passengers to be fixed onto seats 110FL, 110FR, 110RL, and 110RR with safety belts.

In addition, the pedestrian protection equipment drive unit 643 performs electronic control of a hood lift and a pedestrian airbag. For example, upon detection of a collision with a pedestrian, the pedestrian protection equipment drive unit 643 controls a hood lift and a pedestrian airbag to be deployed.

The lamp drive unit 650 performs electronic control of various lamp apparatuses provided inside the vehicle 100. Also, the air conditioner drive unit 660 performs electronic control of an air conditioner inside the vehicle 100. For example, when the inner temperature of the vehicle 100 is high, an air conditioner drive unit 660 can operate the air conditioner so as to supply cool air to the inside of the vehicle 100.

In addition, the vehicle drive device 600 may include a processor and each unit of the vehicle drive device 600 may include its own processor. The vehicle drive device 600 operates under the control of the controller 170. Further, the operation system 700 controls the overall driving operation of the vehicle 100 and can operate in the autonomous driving mode.

In more detail, the operation system 700 may include the vehicle driving system 710, the vehicle pulling-out system 740, and the vehicle parking system 750. In some embodiments, the operation system 700 may further include other components in addition to the aforementioned components, or may not include some of the aforementioned component.

Further, the operation system 700 may include a processor and each unit of the operation system 700 may include its own processor. Also, in some embodiments, when the operation system 700 is implemented as software, the operation system 700 can be a subordinate concept of the controller 170. The operation system 700 may also be a concept including the user interface apparatus 200, the object detection device 300, the communication device 400, the vehicle drive device 600, and the controller 170.

In addition, the vehicle driving system 710 performs driving of the vehicle 100 by providing a control signal to the vehicle drive device 600 in response to reception of navigation information from the navigation system 770. The vehicle driving system 710 performs driving of the vehicle 100 by providing a control signal to the vehicle drive device 600 in response to reception of object information from the object detection device 300. The vehicle driving system 710 also performs driving of the vehicle 100 by providing a control signal to the vehicle drive device 600 in response to reception of a signal from an external device through the communication device 400.

The vehicle pulling-out system 740 performs an operation of pulling the vehicle 100 out of a parking space by providing a control signal to the vehicle drive device 600 in response to reception of navigation information from the navigation system 770. The vehicle pulling-out system 740 may perform an operation of pulling the vehicle 100 out of a parking space, by providing a control signal to the vehicle drive device 600 in response to reception of object information from the object detection device 300. The vehicle pulling-out system 740 may perform an operation of pulling the vehicle 100 out of a parking space, by providing a control signal to the vehicle drive device 600 in response to reception of a signal from an external device.

In addition, the vehicle parking system 750 performs an operation of parking the vehicle 100 in a parking space by providing a control signal to the vehicle drive device 600 in response to reception of navigation information from the navigation system 770.

The vehicle parking system 750 may perform an operation of parking the vehicle 100 in a parking space, by providing a control signal to the vehicle drive device 600 in response to reception of object information from the object detection device 300. The vehicle parking system 750 may perform an operation of parking the vehicle 100 in a parking space, by providing a control signal to the vehicle drive device 600 in response to reception of a signal from an external device.

Further, the navigation system 770 provides navigation information including map information, information on a set destination, information on a route to the set destination, information on various objects along the route, lane information, and information on a current location of the vehicle.

In addition, the navigation system 770 may include a memory and a processor. The memory can store navigation information and the processor controls the operation of the navigation system 770. In some embodiments, the navigation system 770 can update pre-stored information by receiving information from an external device through the communication device 400. In some embodiments, the navigation system 770 may be classified as an element of the user interface apparatus 200.

Further, the sensing unit 120 can sense the state of the vehicle and may include an attitude sensor (for example, a yaw sensor, a roll sensor, or a pitch sensor), a collision sensor, a wheel sensor, a speed sensor, a gradient sensor, a weight sensor, a heading sensor, a yaw sensor, a gyro sensor, a position module, a vehicle forward/reverse movement sensor, a battery sensor, a fuel sensor, a tire sensor, a steering sensor based on the rotation of the steering wheel, an in-vehicle temperature sensor, an in-vehicle humidity sensor, an ultrasonic sensor, an illumination sensor, an accelerator pedal position sensor, and a brake pedal position sensor.

In addition, the sensing unit 120 can acquire sensing signals with regard to, for example, vehicle attitude information, vehicle collision information, vehicle driving direction information, vehicle location information (GPS information), vehicle angle information, vehicle speed information, vehicle acceleration information, vehicle tilt information, vehicle forward/reverse movement information, battery information, fuel information, tire information, vehicle lamp information, in-vehicle temperature information, in-vehicle humidity information, steering-wheel rotation angle information, out-of-vehicle illumination information, information about the pressure applied to an accelerator pedal, and information about the pressure applied to a brake pedal.

The sensing unit 120 may further include, for example, an accelerator pedal sensor, a pressure sensor, an engine speed sensor, an Air Flow-rate Sensor (AFS), an Air Temperature Sensor (ATS), a Water Temperature Sensor (WTS), a Throttle Position Sensor (TPS), a Top Dead Center (TDC) sensor, and a Crank Angle Sensor (CAS).

In addition, the interface 130 serves as a passage for various kinds of external devices that are connected to the vehicle 100. For example, the interface 130 may have a port that is connectable to a mobile terminal and be connected to the mobile terminal via the port. In this instance, the interface 130 can exchange data with the mobile terminal.

Further, the interface 130 can serve as a passage for the supply of electrical energy to a mobile terminal connected thereto. When the mobile terminal is electrically connected to the interface 130, the interface 130 can provide electrical energy, supplied from the power supply unit 190, to the mobile terminal under the control of the controller 170.

In addition, the memory 140 is electrically connected to the controller 170 and may store basic data for each unit, control data for the operational control of each unit, and input/output data. The memory 140 may be any of various hardware storage devices, such as a ROM, a RAM, an EPROM, a flash drive, and a hard drive. The memory 140 may store various data for the overall operation of the vehicle 100, such as programs for the processing or control of the controller 170. In some embodiments, the memory 140 may be formed to be integral with the controller 170, or may be provided as an element of the controller 170. In addition, the controller 170 controls the overall operation of each unit inside the vehicle 100. The controller 170 may be referred to as an Electronic Control Unit (ECU).

Further, the power supply unit 190 supplies power required to operate each component under the control of the controller 170. In particular, the power supply unit 190 can receive power from, for example, a battery inside the vehicle 100. At least one processor and the controller 170 included in the vehicle 100 may be implemented using Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, and electric units for the implementation of other functions.

Figure 8A:
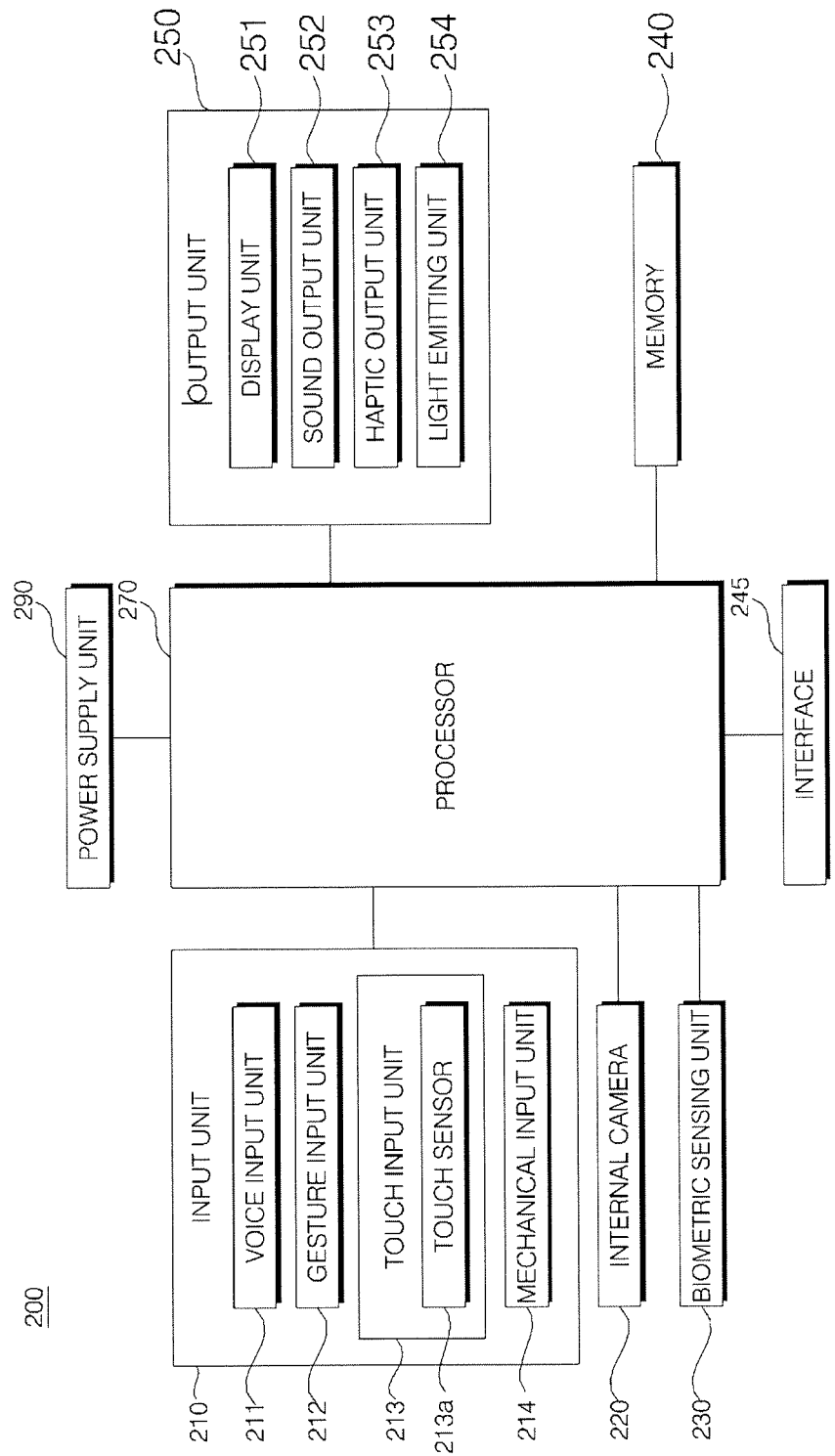
FIG. 8A is a block diagram illustrating a vehicle user interface apparatus according to an embodiment of the present invention.

Next, FIG. 8A is a block diagram illustrating a vehicle user interface according to an embodiment of the present invention. Referring to FIG. 8A, a vehicle user interface 200 may include an input unit 210, an internal camera 220, a biometric sensing unit 230, a memory 240, an interface 245, an output unit 250, a processor 270, and a power supply unit 290.

In some embodiments, the user interface apparatus 200 may further include other components to the aforementioned components, or may not include some of the aforementioned components. Further, the same descriptions used to explain the user interface apparatus shown in FIG. 7 may be applied to the user interface apparatus described with reference to FIG. 8. Referring to FIG. 8A, the differences of the user interface apparatuses are mainly described.

The input unit 210 may include a voice input unit 211, a gesture input unit 212, a touch input unit 213, and a mechanic input unit 214. The touch input unit 213 may include a touch sensor 213a and can sense a user's touch. Further, the touch sensed by the touch sensor 213a may be defined as a touch input.

The touch sensor 213a is controlled by the processor 270 and can be activated or inactivated under the control of the processor 270. Further, the touch sensor 213a may be positioned to correspond to a location of a pattern PT formed on a pattern member 811. A plurality of touch sensors 213a can also be positioned to respectively correspond to locations of a plurality of patterns PT formed on the pattern member 811. For example, a first touch sensor may be positioned to correspond to a location of a first pattern, and a second touch sensor may be positioned to correspond to a location of a second pattern.

In addition, the touch sensor 213a may be positioned such that at least part of the touch sensor 213a vertically overlaps a pattern formed on the pattern member 811. For example, the touch sensor 213a may be positioned such that part of the touch sensor 213a overlaps the pattern PT formed on the pattern member 811 in a direction of an optical path. Also, the touch sensor 213a may be transparent and formed of silver nano paste, a conducting polymer (PEDOT), or an indium-tin oxide film. The touch sensor 213a may also be disposed on a transparent flexible printed circuit board.

Elements of the input unit 210 shown in FIG. 8A, except for the touch sensor 213a, are the same as those of the input unit described above with reference to FIG. 7. The internal camera 220 shown in FIG. 8A corresponds to the internal camera 220 described above with reference to FIG. 7 and the biometric sensing unit 230 shown in FIG. 8A corresponds to the biometric sensing unit 230 described above with reference to FIG. 7.

Further, the memory 240 is electrically connected to the processor 270 and can store basic data for each unit, control data for the operational control of each unit, and input/output data. The memory 240 may be any of various hardware storage devices, such as a ROM, a RAM, an EPROM, a flash drive, and a hard drive. The memory 240 also stores various data for the overall operation of the user interface 200, such as programs for the processing or control of the processor 270. In some embodiments, the memory may be formed to be integral with the processor 270, or may be an element of the processor 270.

In addition, the interface 245 can exchange information, signal, or data with a different device included in a vehicle 100. For example, the interface 245 may receive vehicle door opening information or vehicle starting-on information. Also, the output unit 250 may include a display unit 251, a sound output unit 252, a haptic output unit 253, and a light emitting unit 254. In particular, the light emitting unit 254 can generate light and output the light. Thus, the light emitting unit 254 may include at least one light source 254a.

In addition, the light source 254a may be positioned to correspond to a location of a pattern PT formed on the pattern member 811. A plurality of light sources 254a may be provided. Further, the light emitting unit 254 may include a plurality of light sources positioned to respectively correspond to locations of a plurality of patterns PT formed on the pattern member 811. For example, a first light source may be positioned to correspond to a location of a first pattern, and a second light source may be positioned to correspond to a location of a second pattern.

A light source may include at least one light emitting device. The light emitting device may include any of various devices which can convert electricity into a light. The light emitting device may include a Light Emitting Diode (LED). The light emitting unit 254 is also controlled by the processor 270 and can generate light and output the light under the control of the processor 270.

Further, the light emitting unit 254 may be disposed in any one of a vehicle dashboard, an inner surface of a door, an inner surface of a roof, a seat, a sun visor, an A-pillar, a B-pillar, and a C-pillar. Elements of the output unit 250 shown in FIG. 8A, except for the light emitting unit 254, are the same as those of the light emitting unit 254 shown in FIG. 7A.

In addition, the processor 270 controls the overall operation of each unit of the user interface apparatus 200. For example, the processor 270 controls the light emitting unit 254 to generate light in response to an event such as a user input received through the input unit 210, a signal generated by the internal camera 220 or the biometric sensing unit 230 and/or information, data, or a signal received via the interface 245 from a device included in the vehicle 100.

Further, the processor 270 can activate the touch sensor 213a when light is generated by the light emitting unit 254. If an event has not occurred, the processor 270 controls the touch sensor 213a not to be activated and when light is not generated by the light emitting unit 254, the processor 270 controls the touch sensor 213a not to be activated.

If an event has occurred, the processor 270 can activate the touch sensor 213a and when light is generated by the light emitting unit 254, the processor 270 can activate the touch sensor 213a. The processor 270 can also provide a signal to control a vehicle device in response to a touch input received through the activated touch sensor.

Further, the vehicle device indicates various devices included in a vehicle. For example, the vehicle device may be any one of the following: a vehicle multimedia device, a vehicle air conditioner, a vehicle window device, a vehicle lamp, a trunk opening/closing device, a hood opening/closing device, a sunroof opening/closing device, a gas tank door opening/closing device, a sun visor folding control device, a door lock device, and a seat adjustment device. In response to a touch input received via an activated touch sensor, the processor 270 can provide a signal to control any one of the following: the vehicle multimedia device, the vehicle air conditioner, the vehicle window device, the vehicle lamp, the trunk opening/closing device, the hood opening/closing device, the sunroof opening/closing device, the gas tank door opening/closing device, the sun visor folding control device, the door lock device, and the seat adjustment device.

The processor 270 can change a position of light output from the light emitting unit based on an event. For example, when a first event has occurred, the processor 270 performs a control operation to output light from a first light source positioned in a first region. When a second event has occurred, the processor 270 performs a control operation to output light from a second light source positioned in a second region. The first and second regions may be regions inside a vehicle and the first and second light sources are included in the light emitting unit 254.

In addition, the processor 270 can adjust a color of light output from the light emitting unit 254 based on an event. For example, when the first event has occurred, the processor 270 controls the light emitting unit 254 to output light of a first color. In addition, when the second event has occurred, the processor 270 controls the light emitting unit 254 to output light of a second color.

When vehicle door opening information or vehicle starting-on information is received via the interface 245, the processor 270 controls the light emitting unit 254 to generate light. In addition, the generated light may be in the form different from that of light for activating a touch sensor (for example, a different color, and different brightness). For example, when a user opens a door to get in a vehicle, the processor 270 performs a control operation to output light in order to cause a user to notice a location of the user interface apparatus 200.

In another example, when a user starts a vehicle, the processor 270 performs a control operation to output light in order to cause the user to notice a location of the user interface apparatus 200. In ordinary situations, the user interface apparatus 200 appears to be integral with vehicle interior design (e.g., a synthetic resin material, a fabric material, a wood material, a leather material, and a metal material), and thus, a user may not be able to notice a location of the user interface apparatus 200. When a vehicle door is open or when the vehicle is turned on, the processor 270 performs a control operation to output light in order to cause a user to notice the location of the user interface apparatus 200.

When a predetermined time passes after the vehicle door opening information or the vehicle starting-on information is received, the processor 270 controls dimming of light generated by the light emitting unit 254. Thus, the processor 270 can allow a user to notice the location of the user interface apparatus 200, and then render the user interface apparatus 200 appearing to be integral with vehicle interior design.

Also, under the control of the processor 270, the power supply unit 290 supplies power required for the operation of each component. In particular, the power supply unit 290 may be supplied with power from a battery inside the vehicle.

Figure 8B:
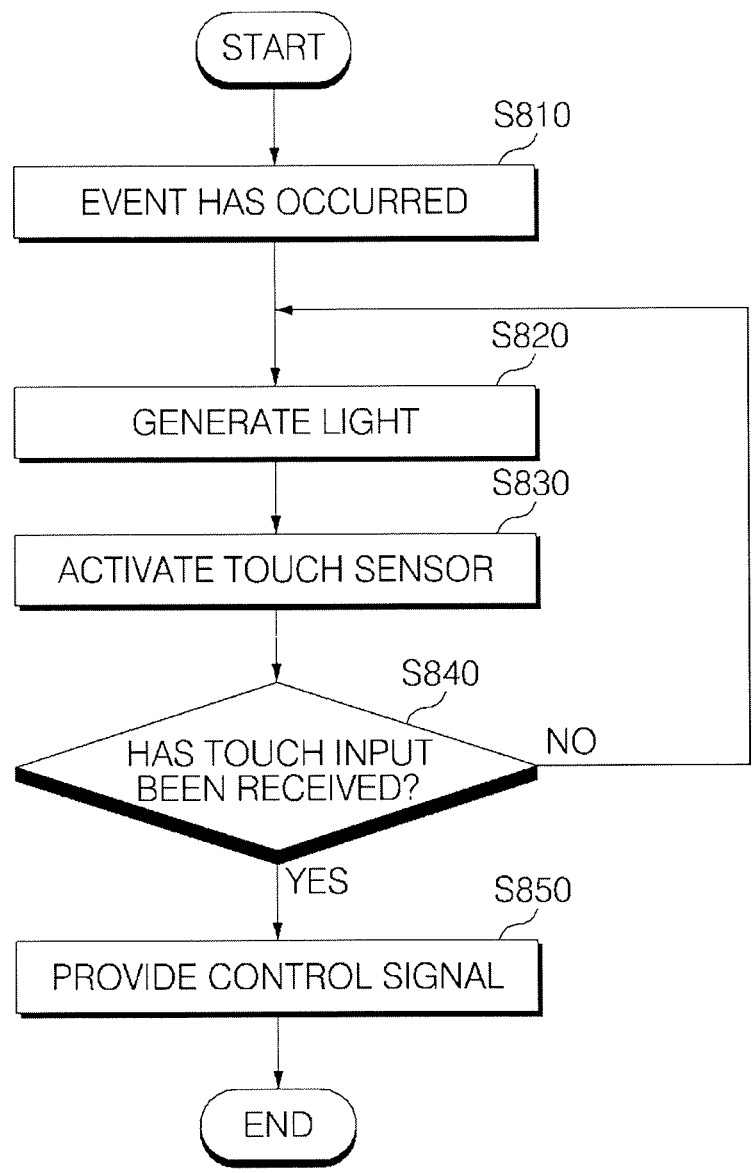
FIG. 8B is a flow chart illustrating a vehicle user interface apparatus according to an embodiment of the present invention.

Next, FIG. 8B is a flowchart illustrating a user interface apparatus according to an embodiment of the present invention. Referring to FIG. 8B, the processor 270 determines whether an event has occurred (S810). The processor 270 can determine, based on a user input received in the input unit 210, whether an event has occurred.

For example, when an audio input is received through the voice input, the processor 270 can determine that an event has occurred. In another example, when a gesture input is received through the gesture input unit 212, the processor 270 can determine that an event has occurred. In yet another example, when a touch input is received through the touch input unit 213, the processor 270 can determine that an event has occurred.

In still another example, when a mechanic input is received in the mechanic input unit 214, the processor 270 can determine that an event has occurred. The processor 270 can determine, based on information acquired by the internal camera 220, whether an event has occurred. For example, the processor 270 can determine, based on passenger information acquired by the internal camera 220, that an event has occurred. The passenger information may include information on a location of a passenger in a passenger compartment. Specifically, upon receiving information indicating that a passenger is located on a driver seat, the processor 270 can determine that an event has occurred.

The processor 270 can also determine, based on information acquired by the biometric sensing unit 230, that an event has occurred. For example, the processor 270 can determine, based on a passenger's biometric information acquired by the biometric sensing unit 230, that an event has occurred. Specifically, when the passenger's biometric information acquired by the biometric sensing unit 230 matches information pre-stored in the memory 240, the processor 270 can determine that an event has occurred.

The processor 270 can also determine, based on information received via the interface 245, that an event has occurred. For example, the processor 270 can determine, based on vehicle information received via the interface 245, that an event has occurred. The vehicle information may include at least one of the following: vehicle location information, vehicle speed information, gear lever position information, door opening/closing information, safety belt status information, brake pedal position information, Idle Stop and Go function on/off information, passenger information, driver's biometric information, seat position information, and audio volume control information.

For example, upon receiving information related to opening of a driver's seat door, the processor 270 can determine that an event has occurred. In another example, upon receiving information related to a fastened status of a safety belt of a driver seat, the processor 270 can determine that an event has occurred. In still another example, upon receiving information indicating a fastened status of safety belts of all seats on which passengers are located, the processor 270 can determine that an event has occurred.

In addition, upon receiving brake pedal position information based on a pressed brake pedal, the processor 270 can determine that an event has occurred. Also, upon receiving gear lever position information indicative of a park position P or a neutral position N, the processor 270 can determine that an event has occurred. Further, upon receiving gear lever position information indicative of a drive position D or a reverse position R, the processor 270 can determine that an event has not occurred.

Also, when a vehicle speed value is not zero, the processor 270 can determine that an event has not occurred. When an emergency situation has occurred when a vehicle speed value is not zero, the processor 270 can determine that an event has not occurred. For example, upon receiving information indicating an engine is not being operated based on an Idle Stop and Go function, the processor 270 can determine that an event has not occurred.

In another example, when a location of the vehicle corresponds to a pre-registered area, the processor 270 can determine that an event has occurred. If an event has occurred, the processor 270 controls the light emitting unit 254 to generate light (S820) and activates the touch sensor 213*a* (S830).

When a touch is sensed in which the touch sensor 213*a* is activated (Yes in S840), the processor 270 performs an operation corresponding to the touch. When a touch is sensed in which the touch sensor 213*a* is inactivated (No in S840), the processor 270 does not perform an operation corresponding to the touch. Also, when a touch input is received in which the touch sensor 213*a* is activated, the processor 270 can provide, to the vehicle device, a control signal corresponding to the touch input in S850.

In addition, the user interface apparatus 200 may be implemented as an ignition control apparatus. In this instance, the processor 270 can provide a control signal corresponding to a touch input to control any one function among a plurality of control functions of an ignition device.

The user interface apparatus 200 may also be implemented as a seat position control apparatus. In this instance, the processor 270 can provide a control signal corresponding to a touch input to control any one function among a plurality of control functions of a seat adjustment device. The user interface apparatus 200 may be implemented as an audio volume control apparatus. In this instance, the processor 270 can provide a control signal corresponding to a touch input to control volume of a multimedia device.

Figure 9:
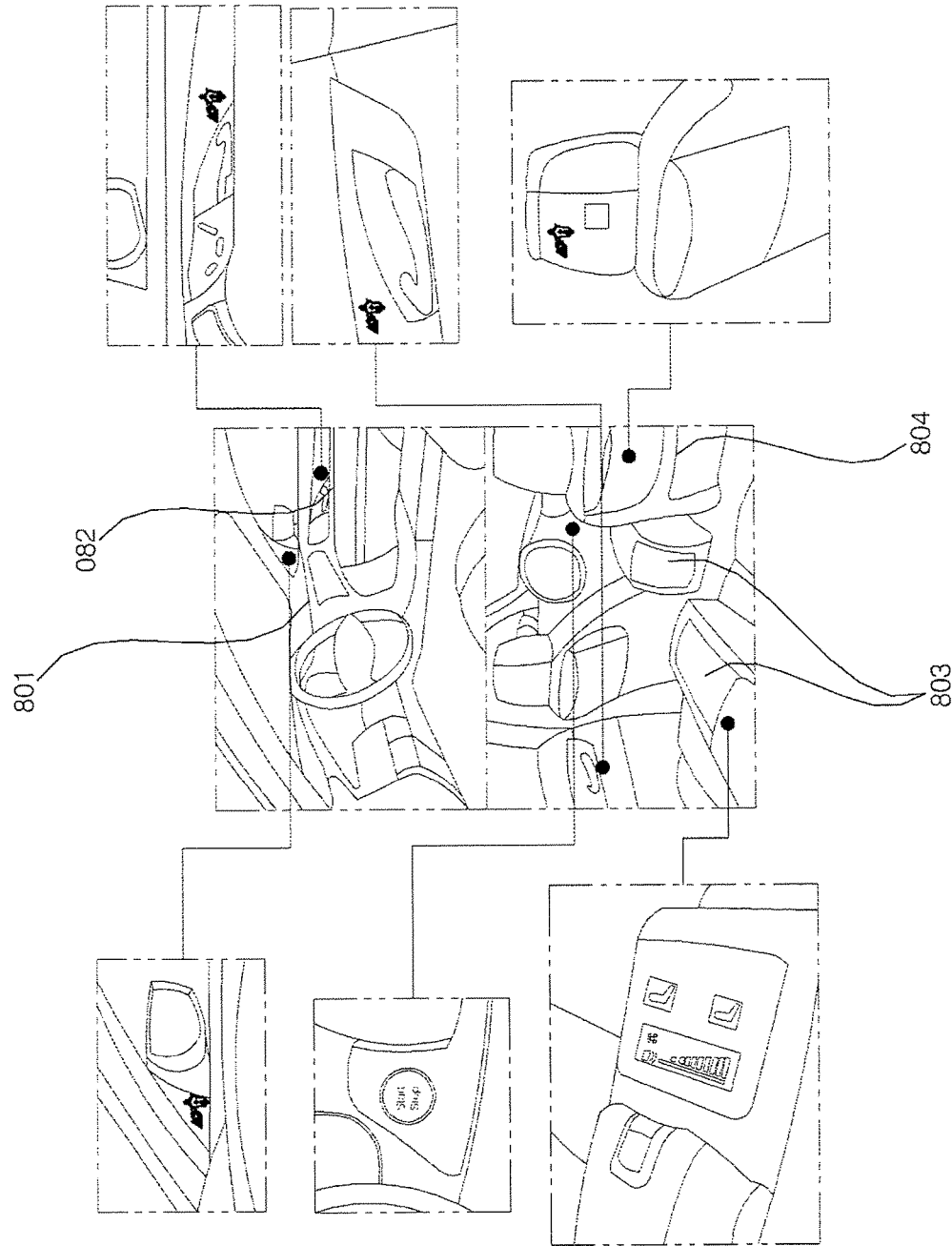
FIG. 9 is a view illustrating a location of a vehicle user interface apparatus according to an embodiment of the present invention.

Next, FIG. 9 is a diagram illustrating a location of a vehicle user interface apparatus according to an embodiment of the present invention. Referring to FIG. 9, the user interface apparatus 200 can be disposed inside a vehicle and in particular on the passenger compartment.

For example, the user interface apparatus 200 can be disposed on at least one of the following: a region 801 of a vehicle dash board, a region 802 of an inner surface of a door, a region 803 of a console, a region of an inner surface of a roof, a region 804 of a seat, a region of a sun visor, a region of an A-pillar, a region of a B-pillar, and a region of a C-pillar.

The user interface device 200 may also be formed to be integral with vehicle interior design. For example, the user interface apparatus 200 can be formed to be integral with a finishing material of the dash board 801, the inner surface of the door 802, the console 803, the inner surface of the roof, the seat 804, the sun visor, the A-pillar, the B-pillar, or the C-pillar (e.g., synthetic resin, fabric, wood, leather, and metal).

Specifically, a surface 817 (FIG. 12) included in the cover 810 of the user interface apparatus 200 may be formed of the same material as the above finishing material. As above, the user interface apparatus 200, which is formed to be integral with vehicle interior design to avoid a sense of incompatibility, may be referred to as a translucent touch garnish (TTG).

If an event has not occurred, the user interface apparatus 200 appears to be integral with the vehicle interior design, thereby not causing a sense of incompatibility. If an event has occurred, the user interface apparatus 200 is activated and therefore enabled to receive a user's touch input through the touch sensor 213*a* and control a vehicle device in response to the touch input. Here, the event may be a user input received via the input unit 210, a signal generated by the internal camera 220 or the biometric sensing unit 230, or information, data, and signals received via the interface 245.

Figure 10A:
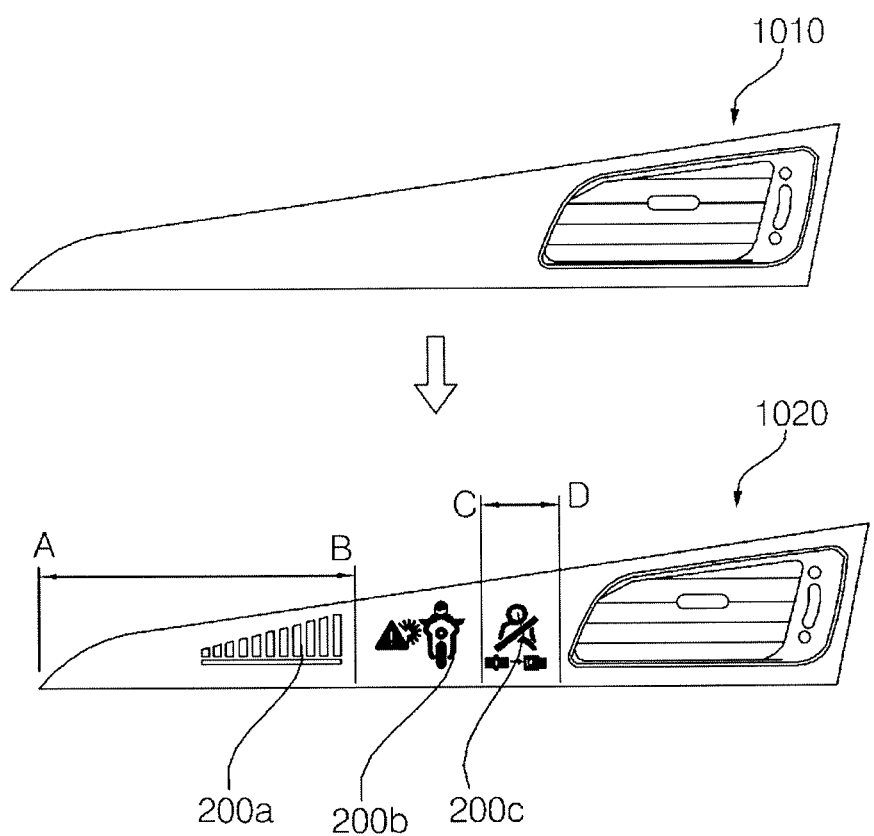
FIGS. 10A and 10B are views illustrating an example of a vehicle user interface apparatus according to an embodiment of the present invention.
Figure 10B:
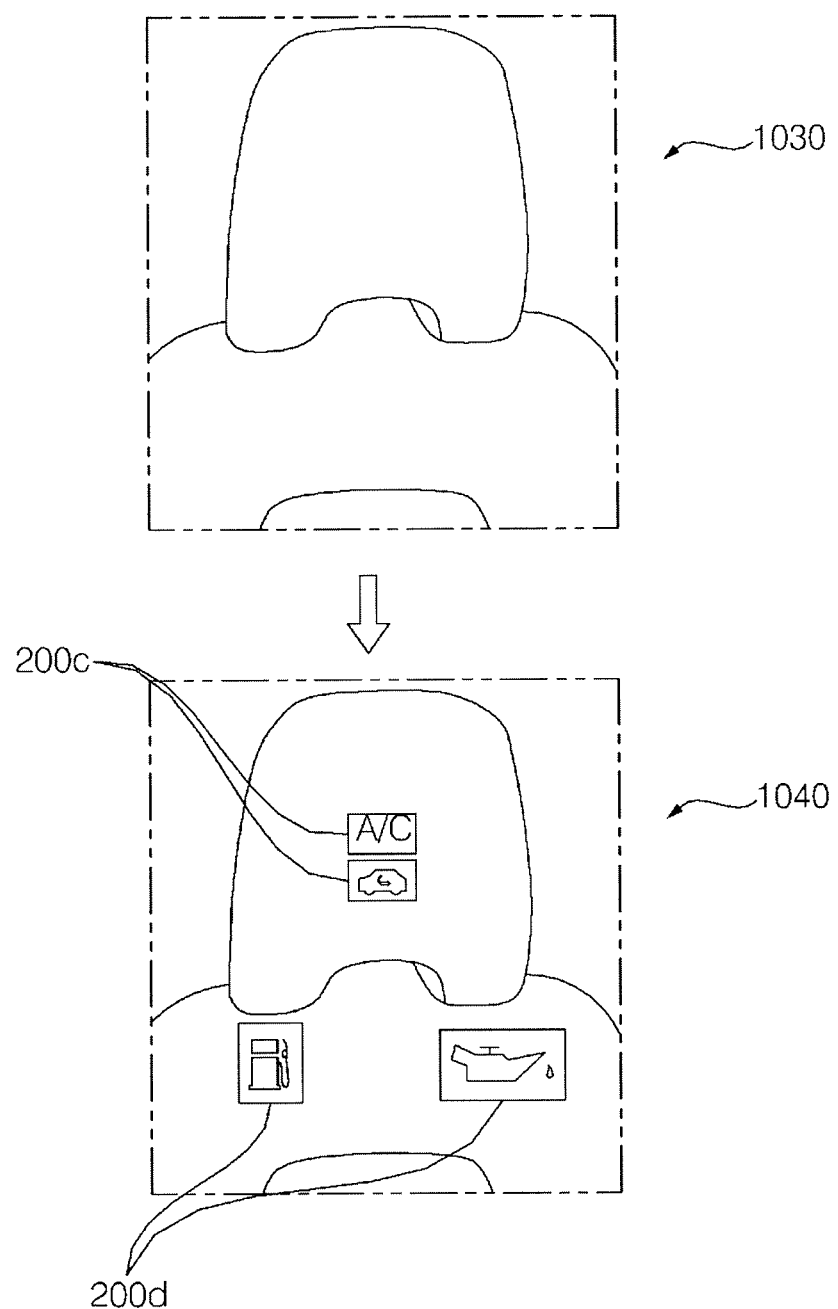

Next, FIGS. 10A and 10B are diagrams illustrating an example of a vehicle user interface apparatus according to an embodiment of the present invention. As illustrated in FIG. 10A, the user interface apparatus 200 may be disposed on a region of a dash board, a region of an instrument panel, or a region of a door trim.

As shown, the user interface apparatus 200 may be implemented as an audio volume control apparatus 200*a*. If an event has not occurred, the audio volume control apparatus 200*a* is not activated, as shown by reference numeral 1010. If an event has occurred, the audio volume control apparatus 200*a* is activated, as shown by the reference numeral 1020. Further, when the audio volume control apparatus 200*a* is activated, the processor 270 controls the light emitting unit 254 to output light to the outside. In this instance, the processor 270 can receive a user's touch input via the touch sensor 213*a*.

In response to the user's touch input, the processor 270 can provide an audio volume control signal to a vehicle multimedia device. Further, the event may be a user's input which is received via the input unit 210. For example, when at least one of a voice input, a gesture input, a touch input, and a mechanic input is received, the processor 270 can determine that an event has occurred. In particular, the event may be a touch input sensed by the touch sensor 213*a*. In this instance, the touch input may be referred to as a trigger input.

As shown in FIG. 10A, the user interface apparatus 200 may be implemented as an object detection warning indicator 200*b*. If an event has not occurred, the object detection warning indicator 200*b* is not to be activated, as shown in 1010. If an event has occurred, the object detection warning indicator 200*b* may be activated, as shown by the reference numeral 1020. When the object detection warning indicator 200*b* is activated, the processor 270 controls the light emitting unit 254 to output light to the outside. In this instance, the processor 270 can receive a user's touch input via the touch sensor 213*a*.

Further, the event may be receiving object detection information from an object detection device 300. For example, when information indicates an object approaching to a vehicle 100 is within a predetermined distance, the processor 270 can determine that an event has occurred. The user interface apparatus 200 may be provided as a Blind Spot Detection (BSD) output apparatus and as an unfastened safety belt warning indicator 200*c*.

If an event has not occurred, the unfastened safety belt warning indicator 200*c* is not to be activated, as shown by the reference numeral 1010. If an event has occurred, the unfastened safety belt warning indicator 200*c* is activated, as shown by the reference numeral 1020. When the unfastened safety belt warning indicator 200*c* is activated, the processor 270 controls the light emitting unit 254 to output light to the outside.

In this instance, the processor 270 can receive a user's touch input via the touch sensor 213*a*. Further, the event may be receiving seat belt status information. For example, upon receiving information related to an unfastened status of a seat belt, the processor 270 can determine that an event has occurred.

As illustrated in FIG. 10B, the user interface apparatus 200 may be disposed on a region of a seat. The user interface apparatus 200 may be implemented as an air conditioning control apparatus 200*e*. If an event has not occurred, the air conditioning control apparatus 200*e* is not activated, as shown by the reference numeral 1030.

If an event has occurred, the air conditioning control apparatus 200*e* is activated, as shown by the reference numeral 1040. When the air conditioning control apparatus 200*e* is activated, the processor 270 controls the light emitting unit 254 to output light to the outside. In this instance, the processor 270 can receive a user's touch input via the touch sensor 213*a*.

In response to the user's touch input, the processor 270 can provide an air conditioning control signal to a vehicle air conditioner. Further, the event may be a user's input that is received via the input unit 210. For example, when at least one of a voice input, a gesture input, a touch input, and a mechanic input is received, the processor 270 can determine that an event has occurred. In particular, the event may be a touch input sensed by the touch sensor 213*a*. In this instance, the touch input may be referred to as a trigger input.

The user interface apparatus 200 may be implemented as an On Board Diagnostics (OBD) information indicator 200*d*. If an event has not occurred, the OBD information indicator 200*d* is not activated, as shown by the reference numeral 1030. If an event has occurred, the OBD information indicator 200*d* is activated, as shown by the reference numeral 1040. When the OBD information indicator 200*d* is activated, the processor 270 controls the light emitting unit 254 to output light to the outside. In this instance, the processor 270 can receive a user's touch input via the touch sensor 231*a*.

Further, the event may be receiving sensing information via the sensing unit 120. For example, when fuel information with a value equal to or smaller than a reference value is received or engine oil information with a value equal to or small than a reference value is received, the processor 270 can determine that an event has occurred.

Figure 11:
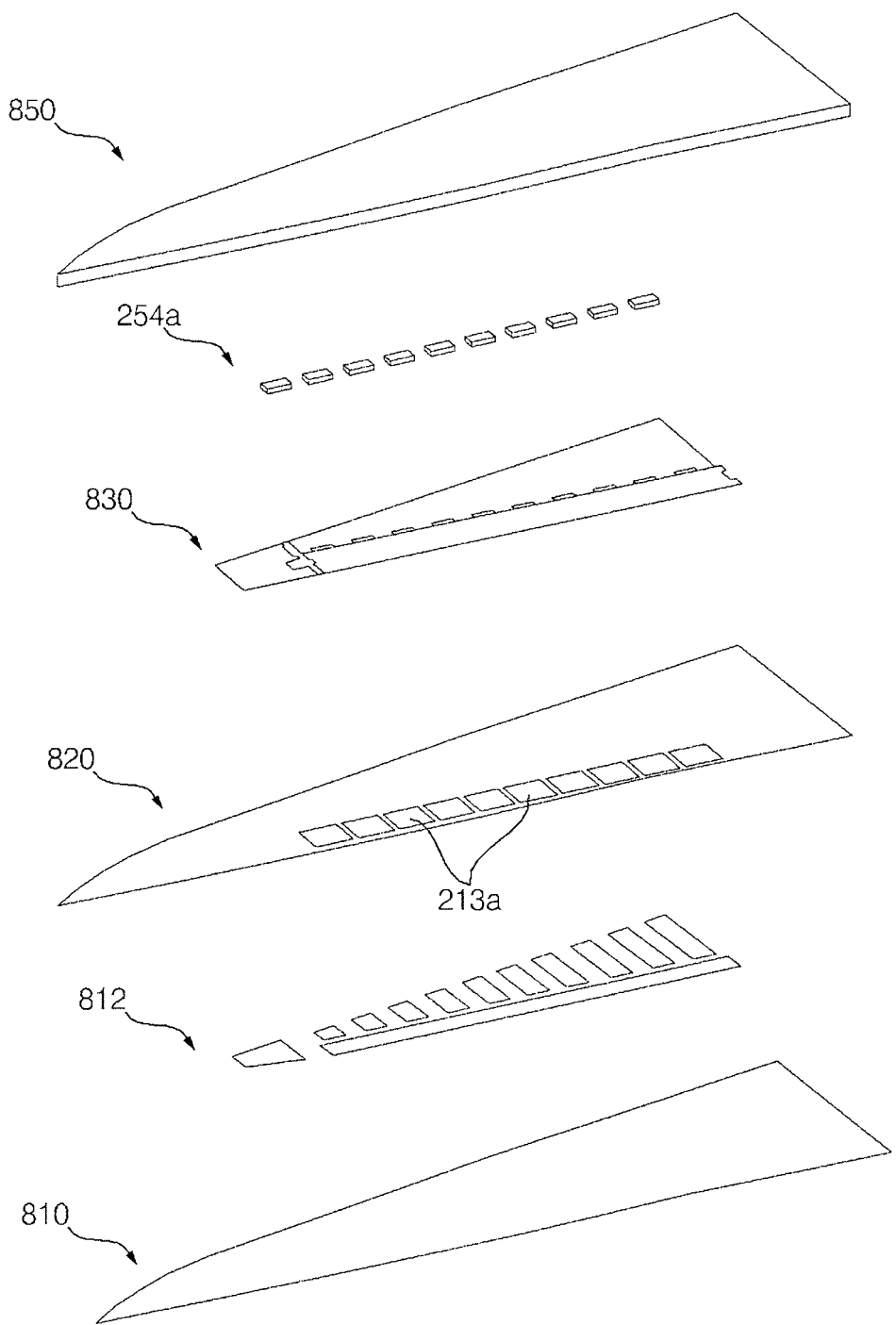
FIG. 11 is an exploded perspective view of a vehicle user interface apparatus according to an embodiment of the present invention.
Figure 12:
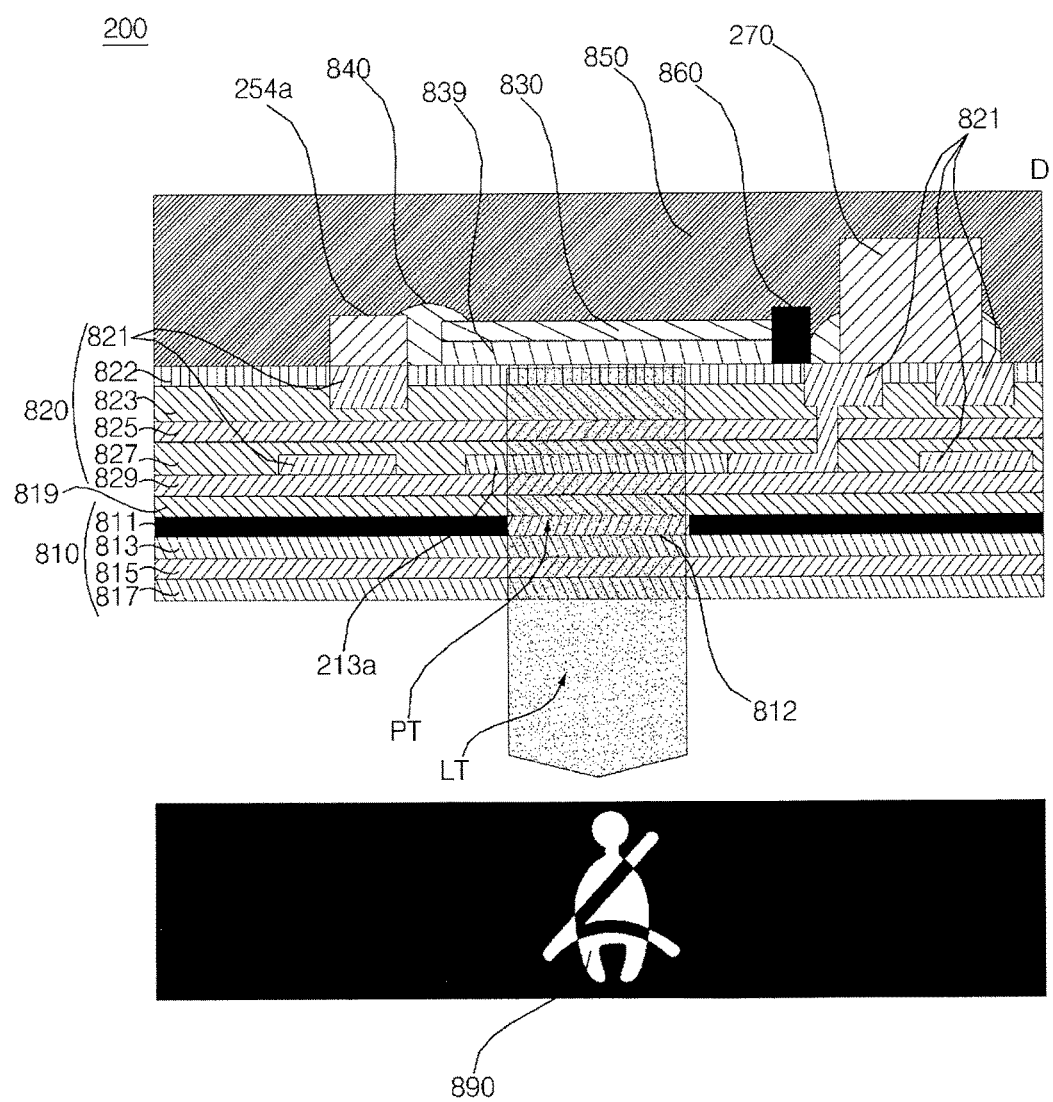
FIG. 12 is a cross section of a vehicle user interface apparatus according to an embodiment of the present invention.

Next, FIG. 11 is an exploded perspective view of a vehicle user interface apparatus according to an embodiment of the present invention. In particular, FIG. 11 is a view, cut away, taken along the line A-B shown in FIG. 10. Also, FIG. 12 is a cross section of a vehicle user interface apparatus according to an embodiment of the present invention. Specifically, FIG. 12 is a view, cut away, taken along the line C-D shown in FIG. 10.

In more detail, FIG. 11 shows an example of a vehicle user interface apparatus including a plurality of light sources, a plurality of touch sensors, and a plurality of patterns, and FIG. 12 shows an example of a vehicle user interface apparatus including a single light source, a single touch sensor, and a single pattern.

Figure 13:
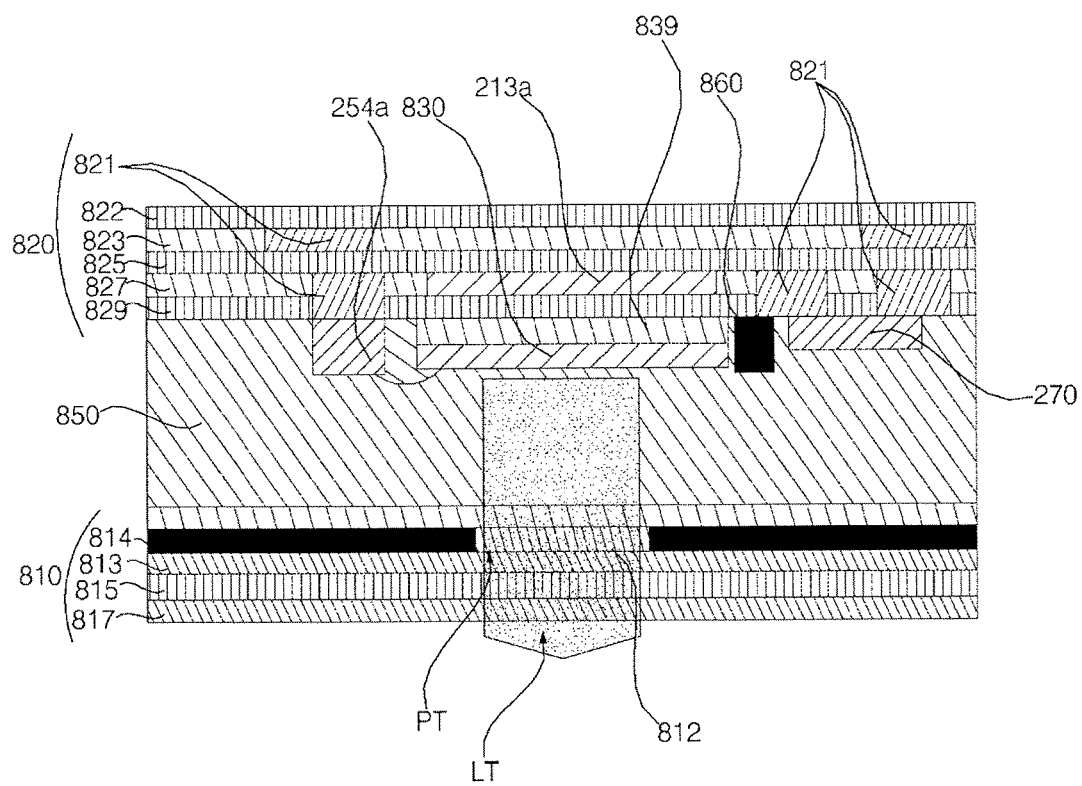
FIG. 13 is a cross section of a vehicle user interface apparatus according to an embodiment of the present invention.
Figure 13:

Referring to FIGS. 11 to 13, the structure of a vehicle user interface apparatus 200 is described. The user interface apparatus 200 may include a cover 810, a transparent flexible printed circuit board (FPCB) 820, a light source 254a, a touch sensor 213a, a processor 270, a light guide film (LGF) 830, an optical clear film (OCR) 840, a color film 812, a plastic member 850, and a light shield structure 860.

The cover 810 covers a light emitting unit 254, the touch sensor 213a, and the processor 270. When light is generated by the light emitting unit 254, the cover 810 transmits the light into a passenger compartment to form a shape 890. The cover 810 includes a pattern member 811, a film member 813, a first transparent film 815, and a surface 817. The pattern member 811 includes a pattern PT corresponding to the shape 890 and transmits light LT through the pattern PT.

Further, the pattern member 811 may be divided into a region on which the pattern PT is formed, and a region on which the pattern PT is not formed. Thus, the pattern member 811 transmits the light LT to the outside from the region on which the pattern PT is formed. The pattern member 811 also shields the light LT in the region on which the pattern PT is not formed.

In addition, the pattern member 811 may be printed with a shielding ink, and the pattern PT formed on the pattern member 811 may be referred to as a pictogram. Also, the film member 813 may have a prescribed light transmissivity to output the light, transmitted through the pattern PT, to the outside. Here, the outside indicates the passenger compartment of the vehicle 100.

The film member 813 may be a transflective film and be formed of a polymer material, such as polyethylene terephalate (PET), poly carbonate (PC), polystyrene (PS), acrylate butadiene styrene (ABS), and the like. The film member 813 may be laminated on the transparent flexible printed circuit board 820 by, for example, a hot-melt technique.

The first transparent sheet 815 controls transmissivity of light that is transmitted through the film member 813 and may be formed of a transparent material, such as polyethylene terephalate (PET), poly carbonate (PC), poly imide (PI), polystyrene (PS), and polyacrylonitile (PAN). The first transparent sheet 815 may be formed of a heat resistant material which has been heat annealed. As a result, the first transparent sheet 815 may have heat resistant properties.

Further, the surface 817 may be formed of the same material as a material forming a vehicle interior part. For example, the surface 817 may be formed of a synthetic resin material, a fabric material, a leather material, a wood material, or a metal material. Also, the surface 817 may be divided into a region corresponding to a location of a pattern PT, and a region not corresponding to the location of the pattern PT.

In addition, the region of the surface 817 corresponding to the pattern PT may be thinner than the region of the surface 817 not corresponding to the pattern PT. For example, a region of the surface 817 vertically overlapping the pattern PT may be thinner than a region of the surface 817 not vertically overlapping the pattern PT. Due to this structure, light transmitted through the pattern PT can be brightly output to the outside.

Further, the hardness of the surface 817 can be improved by hard coating. As the hardness is improved, the surface 817 has good durability despite a countless number of the user's touch. For example, the surface 817 may be coated with a self-healing material. Thus, when the surface is scratched, the self-healing material can repair the scratch by itself. In particular, the self-healing material is in a flexible structure of high-density polymers. Therefore, when the scratch occurs, the structure is only transformed, not ruptured.

On the transparent flexible printed circuit board 820, the light emitting unit 254, the touch sensor 213a, and the processor 270 can be disposed. Further, the transparent flexible printed circuit board 820 may be formed of polyethylene terephalate (PET), polycarbonate (PC), polyimide (PI), aramid, or the like. The transparent flexible printed circuit board 820 may include a circuit board 821, a second transparent sheet 822, a first adhesive sheet 823, a third transparent sheet 825, a second adhesive sheet 827, and a fourth transparent sheet 829.

On the circuit board 821, the light emitting unit 254, the touch sensor 213a, and the processor 270 can be mounted. In addition, the circuit board 821 may be formed by etching a copper foil or be formed by silk screen printing with a silver paste. The second transparent sheet 822 also controls transmissivity of light.

Further, the second transparent sheet 822 may be formed of a transparent material, such as polyethylene terephalate (PET), polycarbonate (PC), polyimide (PI), polystyrene (PS), and polyacrylonitile (PAN). The second transparent sheet 822 may be formed of a heat resistant material which has been heat annealed. Therefore, the second transparent sheet 822 can have heat resistant properties.

In addition, the first adhesive sheet 823 may be adherent to the second transparent sheet 822, the third transparent sheet 825, and a region of the circuit board 821. With a circuit being mounted, the first adhesive sheet 823 may be formed of a low-temperature and low-pressure thermosetting adhesive which can be press-adherent. Also, the first adhesive sheet 823 may be a thin walled adhesive sheet to minimize thickness of the user interface apparatus 200. Also, the first adhesive sheet 823 may be a transparent adhesive sheet through which light can be transmitted.

The third transparent sheet 825 controls transmissivity of light and may be formed of a transparent material, such as polyethylene terephalate (PET), polycarbonate (PC), polyimide (PI), polystyrene (PS), and polyacrylonitile (PAN). The third transparent sheet 825 may also be formed of a heat resistant material which has been heat annealed. Therefore, the third transparent sheet 825 can have heat resistant properties.

Further, the second adhesive sheet 827 may be adherent to the third transparent sheet 825, the fourth transparent sheet 829, a region of the circuit board 821, and the touch sensor 213a. With a circuit being mounted, the second adhesive sheet 827 may be formed of a low-temperature and low-pressure thermosetting adhesive which can be press-adherent. The second adhesive sheet 827 may also be a thin walled adhesive sheet in to minimize thickness of the user interface apparatus 200. The second adhesive sheet 827 may be a transparent adhesive sheet through which light can be transmitted.

In addition, the fourth transparent sheet 829 controls transmissivity of light and may be formed of a transparent material, such as polyethylene terephalate (PET), polycarbonate (PC), polyimide (PI), polystyrene (PS), and polyacrylonitile (PAN). Also, the fourth transparent sheet 829 may be formed of a heat resistant material which has been heat annealed. Therefore, the fourth transparent sheet 829 can have heat resistant properties. Further, the cover 810 and the transparent flexible printed circuit board 820 can be adhered to each other by a third adhesive sheet 819.

With a circuit being mounted, the third adhesive sheet 819 may be formed of a low-temperature and low-pressure thermosetting adhesive which can be press-adherent. The third adhesive sheet 819 may also be a thin walled adhesive sheet in an attempt to minimize thickness of the user interface apparatus 200. In addition, the third adhesive sheet 819 may be a transparent adhesive sheet through which light can be transmitted.

The light source 254a may be disposed on the transparent flexible printed circuit board 820. The light emitting unit 254 may be mounted on the transparent flexible printed circuit board 820 using an optical soldering technique. The optical soldering technique is a technique of melting a solder joint material into a joint by heat from absorption of light energy.

Further, the touch sensor 213a is positioned to correspond to a location of a pattern PT formed on the pattern member 811. For example, the touch sensor 213a is positioned such that at least part of the touch sensor 213a vertically overlaps the pattern PT. In another example, the touch sensor 213a may be positioned such that part of the touch sensor 213a overlaps the pattern PT in a direction of an optical path. The touch sensor 213a may also be disposed on the transparent flexible printed circuit board 820.

Further, the processor 270 can be disposed on the transparent flexible printed circuit board 820. When a first touch is sensed via the touch sensor 213a, the processor 270 controls the light emitting unit 254 to generate light in response to the first touch. Then, when a second touch is sensed via the touch sensor 213a, the processor 270 can provide a signal to control a vehicle device in response to the second touch. The first touch may be a trigger input.

In addition, the light guide film 830 transmits light, generated by the light emitting unit 254, to the cover 810. In particular, the light guide film 830 can uniformly transmit light, generated by the light emitting unit 254, to the cover 810. The light guide film 830 thus uniformly transmits light to the cover 810. The light guide film 830 may be formed of polycarbonate (PC), polymethyl methacrylate (PMMA), acrylate butadiene styrene (ABS), or the like.

The optical clear film 840 guides light, generated by the light emitting unit 254a, to the light guide film 830. The optical clear film 840 may also be formed of a urethane material, acrylic material, a silicon material, or the like. In addition, the color film 812 changes a wavelength of light generated by the light emitting unit 254 and can change a color of the light generated by the light emitting unit 254. For example, if white light is output from the light emitting unit 254, the color of the light can be changed into red, green, blue, or a combination thereof when the light is passing through the color film 812. Further, the color film 812 may be positioned to correspond to a location of a pattern PT formed on the pattern member 811.

The plastic member 850 supports reflection of light generated by the light emitting unit 254 and may be injection resin, such as polycarbonate (PC), polycarbonate acrylate butadiene styrene (PC/ABS), acrylate butadiene styrene (ABS), and polyamide (PA). The plastic member 850 may be injection molded on the transparent flexible printed circuit board 820 on which the film member 813 is laminated. For example, the plastic member 850 may be insert injection molded when the light emitting unit 254, the touch sensor 231a, and the processor 270 are disposed on the cover 810.

The plastic member 850 may also be a colored injection resin to shield and reflect light. Thus, the plastic member 850 may include an additive for supporting reflection of light. Also, the light shield structure 860 shields the travel of light and can shield not just light guided to the cover 810 through the light guide film 830, but light travelling in a different direction.

Next, FIG. 13 is a cross section of a vehicle user interface apparatus according to an embodiment of the present invention. Specifically, FIG. 13 is a view cut away taken along the line C-D shown in FIG. 10. In addition, the vehicle user interface apparatus described with reference to in FIG. 13 has the same configuration as that of the vehicle user interface apparatus described above with reference to FIG. 12. However, components of the vehicle user interface apparatus of FIG. 13 are arranged differently from those of the vehicle user interface apparatus of FIG. 12.

The user interface apparatus of FIG. 12 is configured so the cover 810, the transparent flexible printed circuit board 820, and the plastic member 850 are disposed in the order named. For example, the user interface apparatus shown in FIG. 12 is configured so the transparent flexible printed circuit board 820 is disposed on the cover 810, and the plastic member 850 is disposed on the transparent FPCB.

Further, the user interface apparatus of FIG. 13 is configured so the cover 810, the plastic member 850, and the transparent flexible printed circuit board 820 are disposed in the order named. For example, the user interface apparatus of FIG. 13 is configured so the plastic member 850 is disposed on the cover 810, and the transparent flexible printed circuit board 820 is disposed on the plastic member 850. The descriptions about the user interface apparatus of FIG. 12, except the arranged order of components, is applicable to the user interface apparatus of FIG. 13.

Figure 14:
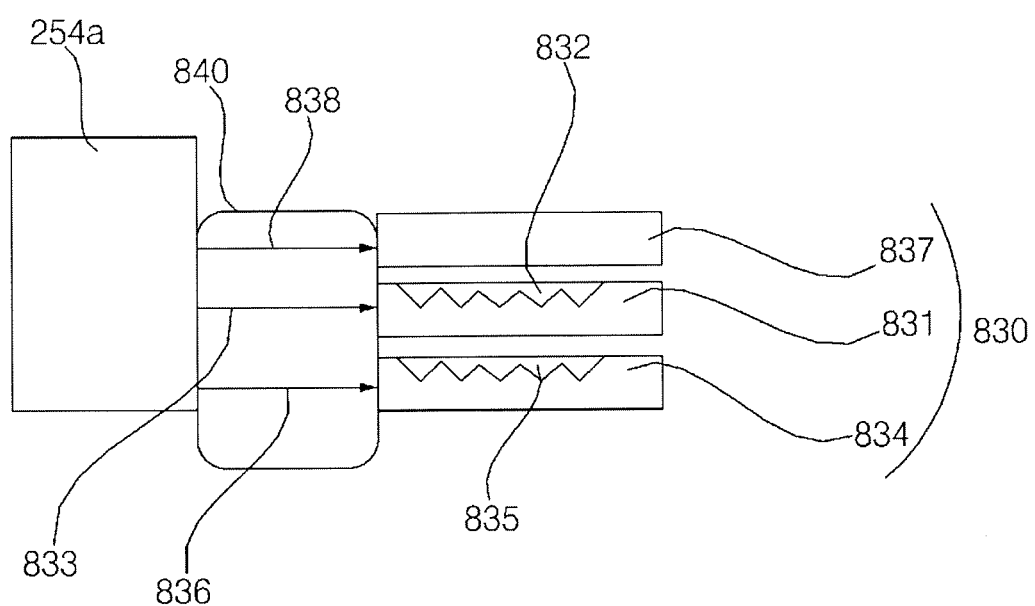
FIG. 14 is a view illustrating a Light Guide Film (LGF) according to an embodiment of the present invention.

Next, FIG. 14 is a diagram illustrating a light guide film according to an embodiment of the present invention. Referring to FIG. 14, a light guide film 830 includes a first light guide film 831, a second light guide film 834, and a third light guide film 837. The first light guide film 831 is provided on the second light guide film 834. Also, the first light guide film 831 includes a first etching portion 832.

One side of the first light guide film 831 comes into contact with the second light guide film 834, and the other side thereof comes into contact with the third light guide film 837. In addition, the first etching portion 832 causes scattering of light, which is generated by the light source 254a and passes through the optical clear film 840. Due to the scattering of light, light output through a pattern PT to the outside can show various colors. As a result, a user can easily recognize a shape 890 formed by the pattern PT, and thus, it is possible to draw the user's attention.

Further, the first etching portion 832 may be formed to correspond to a pattern PT formed on a pattern member 811. Alternatively, the first etching portion 832 may be formed to correspond to a shape 890 formed by the pattern PT. For example, the first etching portion 832 may be similar to the pattern PT in size and shape. The first etching portion 832 may be provided on a surface of the first light guide film 831, which comes into contact with the third light guide film 837.

In addition, light is introduced into the first light guide film 831 along a path 833 that is different from a path 836 along which light is introduced into the second light guide film 834. In addition, light is introduced into the first light guide film 831 along the path 833 that is different from a path 838 along which light is introduced into the third light guide film 837.

The second light guide film 834 is also interposed between the first light guide film 831 and a cover 810, and the second light guide film 834 includes a second etching portion 835. One side of the second light guide film 834 comes into contact with the fourth adhesive sheet 839, and the other side thereof comes into contact with the first light guide film 831.

Further, the second etching portion 835 causes scattering of light, which is generated by the light source 254*a* and passes through the optical clear film 840. Due to the scattering of light, light output through the pattern PT to the outside can show various colors. As a result, a user can easily recognize the shape 890 formed by the pattern PT, and thus, it is possible to draw the user's attention.

In addition, the second etching portion 835 may be formed to correspond to a pattern PT formed on the pattern member 811. Alternatively, the second etching portion 835 may be formed to correspond to the shape 890 formed by the pattern PT. For example, the second etching portion 835 may be similar to the pattern PT in size and shape.

The second etching portion 835 may also be provided on a surface of the second light guide film 834, which comes into contact with the first light guide film 831. Light is introduced into the second light guide film 834 along the path 836 that is different from the path 833 along which light is introduced into the first light guide film 831. Light is also introduced into the second light guide film 834 along the path 836 that is different from the path 838 along which light is introduced into the third light guide film 837.

In addition, the third light guide film 837 is provided on the first light guide film 831. One side of the third light guide film 837 comes into contact with the first light guide film 831, and the other side thereof comes into contact with the plastic member 850. Light is introduced into the third light guide film 837 along the path 838 that is different from the path 833 along which light is introduced into the first light guide film 831. Light is also introduced into the third light guide film 837 along the path 838 that is different from the path 836 along which light is introduced into the second light guide film 824.

Figure 15:
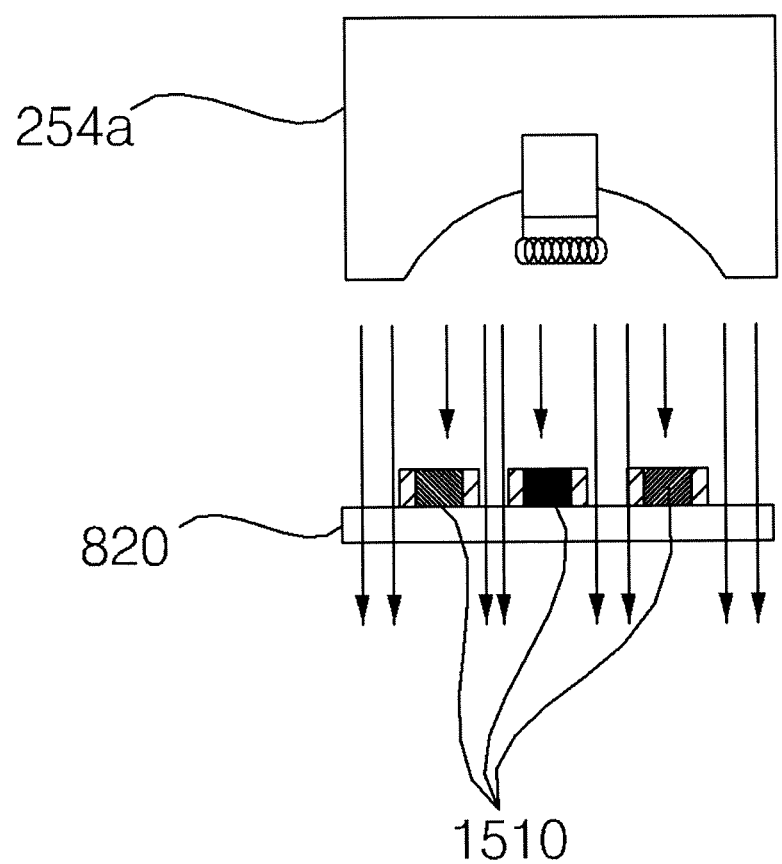
FIG. 15 is a view illustrating a light soldering technique according to an embodiment of the present invention.

Next, FIG. 15 is a diagram illustrating an optical soldering technique according to an embodiment of the present invention. Referring to FIG. 15, the light source 254*a* is mounted on the transparent flexible printed circuit board 820 by an optical soldering technique. For example, the light source 254*a* can be mounted on the circuit board 821 using the optical soldering technique.

In addition, the optical soldering technique is a technique of melting a solder material into a joint by heat from absorption of light energy. In employing the optical soldering technique to bond the light source 254*a* to the transparent flexible printed circuit board 820, visible light is transmitted so energy is transferred to an adhesion region 1510 by means of the light, while the light simply passes through a non-adhesion region. Therefore, energy can be supplied only to the adhesion region 1510. When using the optical soldering technique, it is possible to minimize thermal damage to a device through control of absorption and transmissivity of light.

Figure 16:
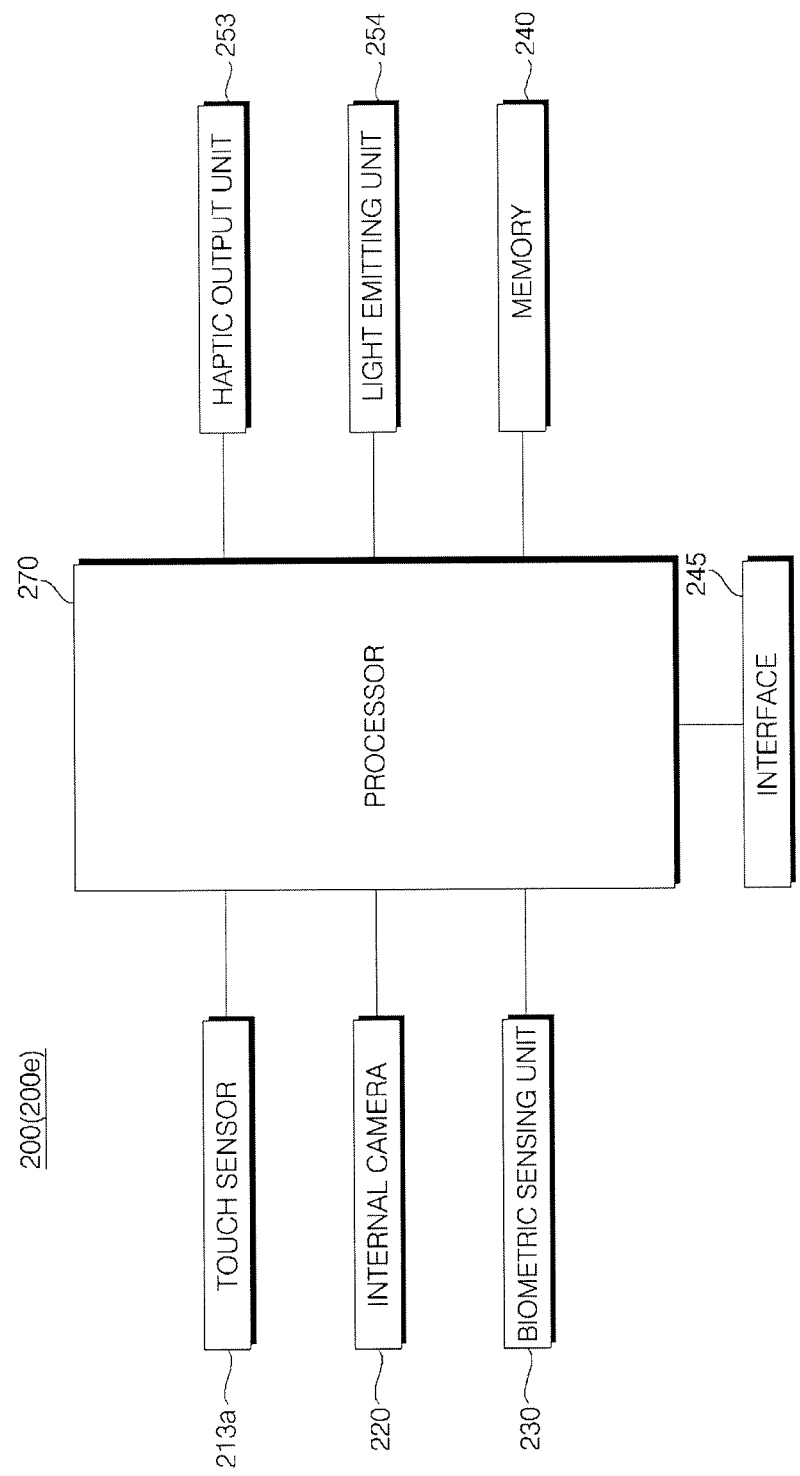
FIG. 16 is a block diagram illustrating a vehicle user interface apparatus according to an embodiment of the present invention, in which the apparatus is implemented as an ignition control apparatus.

Next, FIG. 16 is a block diagram illustrating a vehicle user interface apparatus implemented as an ignition control apparatus 200*e*. In this instance, the user interface apparatus 200 may be referred to as the ignition control apparatus 200*e*.

The user interface apparatus 200 includes a touch sensor 213*a*, an interface 245, a light emitting unit 254, and a processor 270. The touch sensor 213*a* can sense a user's touch and a touch sensed by the touch sensor 213*a* can be defined as a touch input.

Further, the touch sensor 213*a* can be controlled by the processor 270 and be activated or inactivated under the control of the processor 270. The interface 245 can also exchange information, a signal, or data with a different device included in a vehicle 100, transmit information, a signal, or data generated or processed by the processor 270 to a different device included in the vehicle 100, and receive information, a signal, or data from a different device included in the vehicle 100.

In addition, the interface 245 can receive vehicle information from a different device included in the vehicle 100. Specifically, the interface 245 can receive information from at least one of an object detection device 300, a communication device 400, a maneuvering device 500, a controller 170, a vehicle drive device 600, an operation system 700, a navigation system 770, and a sensing unit 120.

For example, the interface 245 can receive door opening/closing information, receive safety belt status information, receive brake pedal position information, receive gear lever position information, and receive vehicle speed information.

Further, the interface 245 can receive Idle Stop and Go function on/off information, receive vehicle location information, receive seat position information, and receive audio volume control information.

The light emitting unit 254 can also generate and output the light. Thus, the light emitting unit 254 may include at least one light source 254*a*. Further, the light source 254*a* can be positioned to correspond to a location of a pattern formed on a pattern member 811. A plurality of light sources 254*a* can also be provided.

For example, the light emitting unit 254 may include a plurality of light sources positioned to respectively correspond to the locations of a plurality of patterns formed on the pattern unit 811. A light source also includes at least one light emitting device. The light emitting device may also include various devices which convert electricity into light and include a light emitting diode (LED). The light emitting unit 254 is also controlled by the processor 270 and under the control of the processor 270, the light emitting unit 254 can generate and output the light.

Further, the processor 270 controls the overall operation of each unit of the user interface apparatus 200. For example, the processor 270 controls the light emitting unit 254 to generate light in response to an event, which as discussed above, can be based on a user's input received via the input unit 210. The event can also be based on information generated by the internal camera 220 or the biometric sensing unit 230, based on information, data, or a signal received via the interface 245 from a different device included in a vehicle 100, etc.

When light is generated by the light emitting unit 254, the processor 270 can activate the touch sensor 213*a*. If an event has not occurred, the processor 270 controls the touch sensor 213*a* not to be activated. In addition, when light is not generated by the light emitting unit 254, the processor 270 controls the touch sensor 213*a* to be not activated.

If an event has occurred, the processor 270 can activate the touch sensor 213*a*. The processor 270 also controls the light emitting unit 254 based on vehicle information. The vehicle information includes at least one of the following: vehicle location information, vehicle speed information, gear lever position information, door opening/closing information, safety belt status information, brake pedal position information, Idle Stop and Go function on/off information, passenger information, driver's biometric information, seat position information, and audio volume control information.

Upon receiving information related to opening of a driver's seat door, the processor 270 controls the light emitting unit 254 to generate light. Thus, when the driver opens a door and get into a vehicle, the user interface apparatus 200 causes the driver to recognize a location of the user interface apparatus 200. Similarly, upon receiving information related to a fastened status of a safety belt of a driver seat, the processor 270 controls the light emitting unit 254 to generate light. Thus, the vehicle can be turned on only when a driver has fastened a safety belt, and thus, the safety of the driver is secured.

In addition, upon receiving information related to a fastened status of safety belts of all seats on which passengers are located, the processor 270 controls the light emitting unit 254 to generate light. Thus, the vehicle can be turned on only when all the passengers have fastened safety belts, and thus, the safety of all the passengers is secured.

Further, upon receiving the brake pedal position information based on a pressed brake pedal, the processor 270 controls the light emitting unit 254 to generate light. Thus, it is possible to start the vehicle only when a driver is pressing a brake pedal, and thus, to prepare for an unexpected or dangerous situation which may happen after starting the vehicle.

Likewise, receiving gear lever position information indicative of a park position P or a neutral position N, the processor 270 controls the light emitting unit 254 to generate light. Upon receiving gear lever position information indicative of a drive position D or a reverse position R, the processor 270 controls the light emitting unit 254 not to generate light. In this instance, the processor 270 controls the touch sensor 213*a* not to be activated. Thus, it is possible to start the vehicle only when a gear lever is in the parking position P or the neutral position N, and thus, to prevent an accident which may happen after starting the vehicle.

Upon receiving gear lever position information indicative of the drive position D or the reverse position R when the vehicle is parked, the processor 270 can provide a signal to output a warning. When a vehicle speed value is not zero, the processor 270 controls the light emitting unit 254 not to generate light. For example, when the vehicle is travelling, the processor 270 controls the light emitting unit 254 not to generate light, thus the user interface apparatus is inactivated to prevent turning off the vehicle, thereby preventing an accident.

When an emergency situation occurs when the vehicle speed value is not zero, the processor 270 controls the light emitting unit 254 to generate light. For example, the processor 270 can determine an emergency situation by receiving an emergency light turn on signal via the interface 245. In another example, the processor 270 can determine an emergency situation by receiving information, acquired by an object detection device 300, via the interface 245.

The processor 270 can also determine an emergency situation by receiving information, acquired by the sensing unit 120, via the interface 245. Thus, it is possible to turn off the vehicle even when the vehicle is travelling, thereby preventing a more serious accident. Upon receiving information indicating that an engine is not being operated based on an Idle Stop and Go function, the processor 270 controls the light emitting unit 254 not to generate light. If a vehicle operates based on an Idle Stop and Go function, the vehicle is still in a driving state even though a vehicle speed value is zero and the engine is not being operated. In this instance, the ignition control apparatus can be inactivated to prevent turning off the vehicle.

When a location of the vehicle corresponds to a pre-registered area, the processor 270 controls the light emitting unit 254 to generate light. For example, the pre-registered area can be an area within a predetermined distance from a user's home or company. When the vehicle 100 is located in the pre-registered area, it is necessary to turn on or turn off the vehicle to pull the vehicle 100 out of a parking space or to park the vehicle 100 in a parking space. Thus, the user interface apparatus 200 can be activated to be ready to receive the user's input.

Further, the vehicle location information can be based on global positioning system (GSP) information acquired by a location information unit 420 or a vehicle surrounding image acquired by a camera 310. The processor 270 also controls the light emitting unit 254 to generate light based on seat position information. For example, the processor 270 can provide a signal to a seat adjustment device in response to a touch sensed by the touch sensor 213*a*.

When the light emitting unit 254 includes a plurality of light sources 254*a*, the pattern member 811 of the cover 810 can include a plurality of patterns which respectively correspond to the light sources 254*a* and through which light generated by the plurality of light sources 254*a* is transmitted. In this instance, the processor 270 controls at least one of the light sources 254*a* to generate light indicative of a particular seat position.

The processor 270 can also control the light emitting unit 254 to generate light based on audio volume control information. For example, the processor 270 can provide a signal to an audio volume control device in response to a touch sensed by the touch sensor 213*a*. When the light emitting unit 254 includes a plurality of light sources 254*a*, the pattern member 811 of the cover may include a plurality of patterns which respectively correspond to the light sources 254*a* and through which lights generated by the plurality of light sources 254*a* are transmitted. In this instance, the processor 270 controls at least one of the light sources 254*a* to generate light indicative of a particular audio volume level.

In addition, when light is generated by the light emitting unit 254, the processor 270 can activate the touch sensor 213*a*. The processor 270 can provide a signal to control a vehicle device in response to a touch input received by the activated touch sensor. In some embodiments, the user interface apparatus 200 may further include an internal camera 220, a biometric sensing unit 230, a memory 240, and a haptic output unit 254, or may include a combination thereof.

Further, the internal camera 220 can acquire passenger information, acquire an image of the inside of a vehicle, and provide location information of a passenger based on the acquired image. For example, the internal camera 220 can provide information indicating whether a passenger is located on a driver seat.

Upon receiving a touch input from a passenger other than a user located on the driver seat, the processor 270 can not provide a signal to control any one function among a plurality of control functions of the ignition device. As a control signal is generated only in response to a touch input of the user located on the driver seat, it is possible to prevent malfunction that may occur due to a wrong input of a passenger other than a driver.

In addition, the biometric sensing unit 230 can acquire the driver's biometric information, and when the driver's biometric information matches information pre-stored in the memory 240, the processor 270 controls the light emitting unit 254 to generate light. Therefore, only when a passenger is identified as a driver, the light emitting unit 254 is controlled to generate light and the touch sensor 213*a* is activated. Thus, a person other than a driver is not allowed to start the vehicle, so that it is possible to prevent vehicle theft.

Under the control of the processor 270, the haptic output unit 253 can output a vibration pattern corresponding to one of a plurality of control functions. The processor 270 controls the haptic output unit 253 to output a vibration pattern corresponding to one of the plurality of control functions. In addition, the haptic output unit 253 can be provided on a steering wheel, a safety belt, and a seat. In some embodiment, the haptic output unit 253 may be disposed on a region of a dash board. When the user interface apparatus 200 is implemented as an ignition control apparatus, the haptic output unit 253 can be disposed near an ignition button shape 1710.

For example, when a first function is used, the processor 270 controls the haptic output unit 253 to output a first vibration pattern, and when a second function is used, the processor 270 controls the haptic output unit 253 to output a second vibration pattern. When a third function is used, the processor 270 controls the haptic output unit 253 to output a third vibration pattern. Also, the first to third vibration patterns may be different in a vibration cycle, the number of vibration, or vibration duration.

Figure 17A:
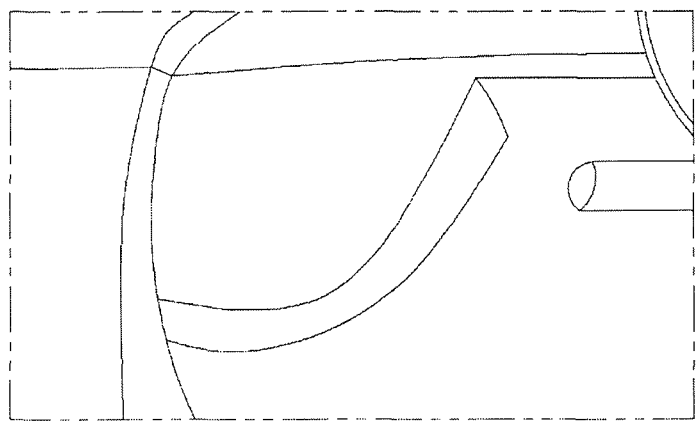
FIGS. 17A to 17C are illustrations of the operation of a vehicle user interface apparatus according to an embodiment of the present invention, in which the apparatus is implemented as an ignition control apparatus.
Figure 17B:
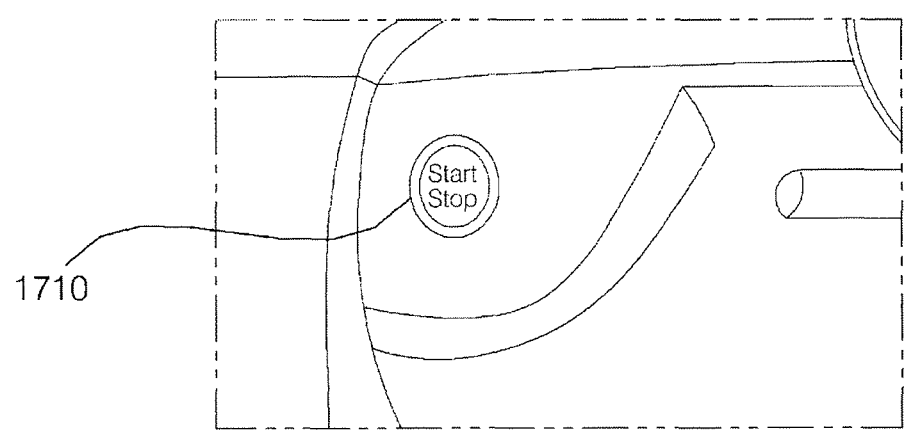
Figure 17C:
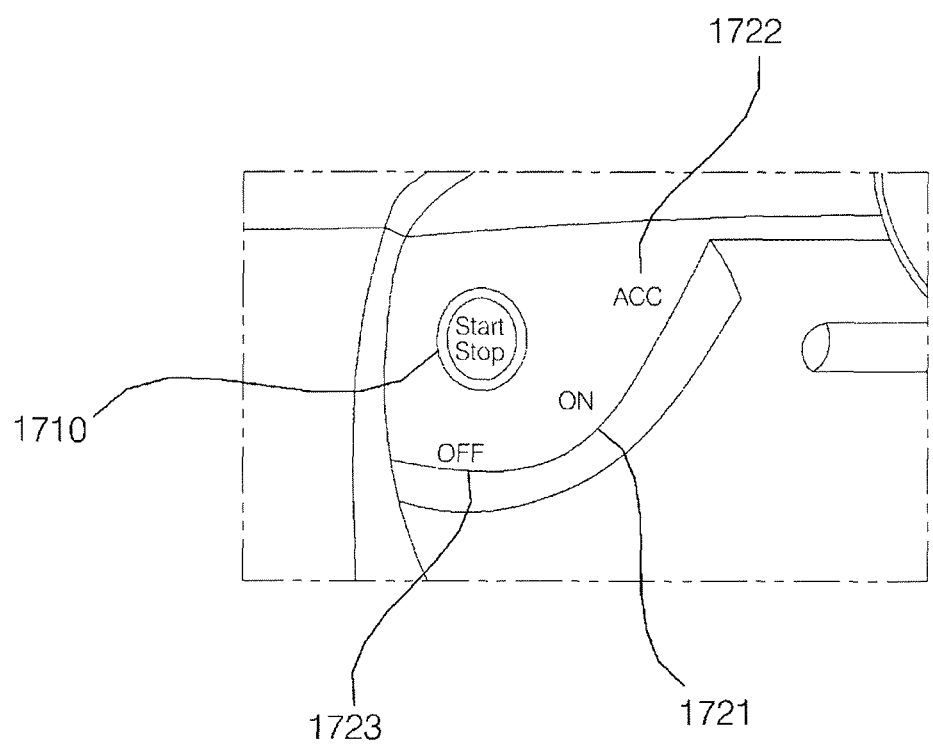

Next, FIGS. 17A to 17C are diagrams illustrating a vehicle user interface apparatus implemented as an ignition control apparatus. Referring to the drawings, when a user interface apparatus 200 is provided as an ignition control apparatus, a light emitting unit 254 can be located near a driver seat in the passenger compartment.

In this instance, a shape 1710, which is formed by light transmitted into the passenger compartment through a pattern of a pattern member 811, can be an ignition button shape. For example, an ignition button-shaped pattern PT can be formed on the pattern member 811. As light output from the light emitting unit 254 passes through the ignition button-shaped pattern PT, the ignition button shape 1710 can be formed. In this instance, the processor 270 can provide a signal to control any one function among a plurality of control functions of an ignition device in response to a touch input sensed via a touch sensor 213a.

As illustrated in FIG. 17A, when a user interface apparatus 200 is not needed, the user interface apparatus 200 is not activated. For example, if an event has not occurred, the user interface apparatus 200 does not to be activated. When the user interface apparatus 200 is not activated, the user interface apparatus 200 appears to be integral with vehicle interior design.

As illustrated in FIG. 17B, when the user interface apparatus 200 is needed, the user interface apparatus 200 can be activated. For example, if an event has occurred, the user interface apparatus 200 can be activated. When the user interface apparatus 200 is activated, the processor 270 controls the light emitting unit 254 to output light to the outside. In this instance, the processor 270 can receive a user's touch input via the touch sensor 213a. Further, as discussed above, the event can be receiving a user input via the input unit 210 or receiving information via the interface 245.

Further, the user interface apparatus 200 can also provide a signal to an ignition device to control any one function among a plurality of control functions. The plurality of control functions may include a first function of starting on a vehicle, a second function of turning on an electronic device of a first group provided in the vehicle, and a third function of turning off the vehicle. Also, the electronic device of the first group may be an accessory device, such as a vehicle air conditioner, a multimedia device, a wiper, and a diesel engine preheater.

As illustrated in FIG. 17C, when the user interface apparatus 200 is activated, it is possible to receive an input regarding each of the first to third functions. In response to a first touch input received via the touch sensor 213a when the user interface apparatus 200 is activated, the processor 270 can provide a first control signal of starting the vehicle to the ignition device. Here, the function of starting on the vehicle may be the first function.

In this instance, the processor 270 performs a control operation to generate light from a light source which corresponds to a first function 1721 among a plurality of light sources included in the light emitting unit 254. By the generated light, an ON shape 1721 may be displayed. Further, the first touch input may be a short touch input which is received via the touch sensor 213a when the vehicle is turned off.

In response to a second touch input received via the touch sensor 213a when the user interface apparatus 200 is activated, the processor 270 can provide, to the ignition device, a second control signal of turning on an electronic device of the first group provided in the vehicle. The function of turning on the electronic device of the first group provided in the vehicle may be the second function.

In this instance, the processor 270 performs a control operation to generate light from a light source which corresponds to a second function 1722 among a plurality of light sources included in the light emitting unit 254. By the generated light, an ACC shape 1722 may be displayed. Further, the second touch input may be a long touch input or a double touch input which is received via the touch sensor 213a when the vehicle is turned off.

In response to a third touch input received via the touch sensor 213a when the user interface apparatus 200 is activated, the processor 270 can provide a third control signal of turning off the vehicle to the ignition device. The function of turning off the vehicle may be the third function. In this instance, the processor 270 performs a control operation to generate light from one of a plurality of light sources included in the light emitting unit 254, which corresponds to a third function 1723. By the generated light, an OFF shape 1723 may be displayed. Further, the third touch input may be a short touch input which is received via the touch sensor 213a when the vehicle is turned off.

Figure 18:
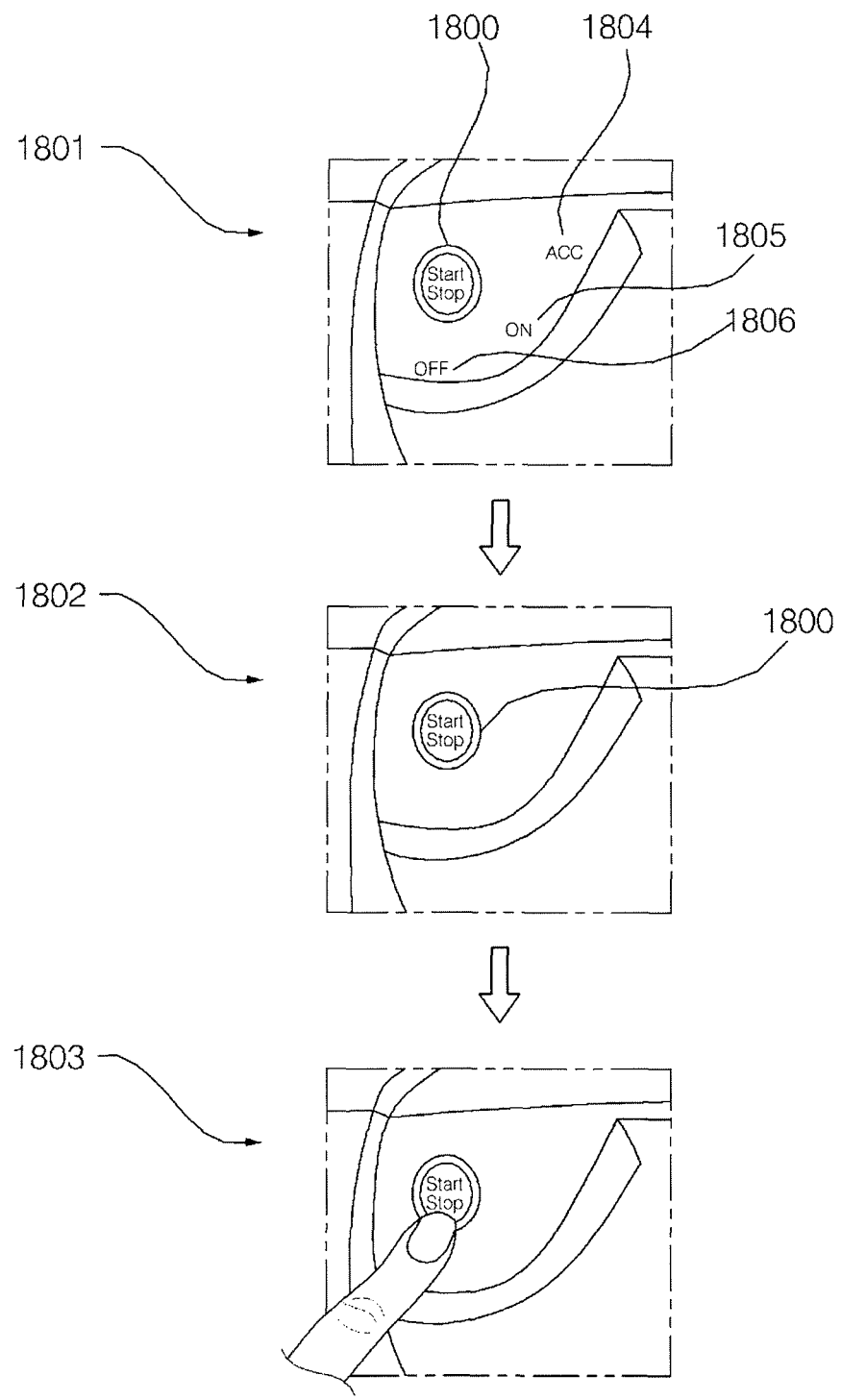
FIGS. 18 to 28 are views illustrating various operations of a vehicle user interface apparatus according to an embodiment of the present invention, in which the apparatus is implemented as an ignition control apparatus.

Next, FIGS. 18 to 28 are diagrams illustrating various operations of a vehicle user interface apparatus according to an embodiment of the present invention, in which the apparatus is implemented as a vehicle ignition control apparatus. Referring to FIG. 18, a user can open a door of a vehicle 100 and sit on the driver seat, when the vehicle 100 is turned off.

In this instance, the processor 270 can receive, via the interface 245, information related to opening of a door of the driver seat. Upon receiving the information related to opening of a door of the driver seat, the processor 270 controls the light emitting unit 254 to generate light. In this instance, the shape 1800 may be displayed as the generated light passes through a pattern PT. The processor 270 can activate a touch sensor 213a, as shown in 1801.

Further, a plurality of shapes 1800, 1804, 1805, and 1806 may be displayed. As shown in FIG. 18, an ignition button shape 1800, an ACC shape 1804, an ON shape 1805, and an OFF shape 1806 may be displayed. A plurality of light sources included in the light emitting unit 254 are also positioned to respectively correspond to locations of the ignition button shape 1800, the ACC shape 1804, the ON shape 1805, and the OFF shape 1806.

Further, the ACC shape 1804 may be a shape corresponding to a turned-on state of an electronic device of the first group, the ON shape 1805 may be a shape corresponding to a turned-on state of the vehicle, and the OFF state 1806 may be a shape corresponding to a turned-off state of the vehicle.

In addition, the processor 270 controls the light emitting unit 254 not to output the light when a predetermined time passes after light is generated. In this instance, a shape is not displayed because the light is no longer output. The processor 270 also controls the touch sensor 213a to be inactivated.

Further, a user can press and then depress a brake pedal. In this instance, the processor 270 can receive, via the interface 245, brake pedal position information based on a pressed brake pedal and control the light emitting unit 254 to generate light. In this instance, the shape 1800 can be displayed as the generated light passes through a pattern PT. The processor 270 can activate touch sensor 213a, as shown in 1801.

Further, a plurality of shapes 1800, 1804, 1805, and 1806 may be displayed. As illustrated in FIG. 18, the ignition button shape 1800, the ACC shape 1804, the ON shape 1805, and the OFF shape 1806 may be displayed. Further, the processor 270 controls the light emitting unit 254 not to output the light when a predetermined time passes after light is generated. In this instance, a shape is not displayed because the light is no longer output. The processor 270 also controls the touch sensor 213a to be inactivated.

In addition, a user can fasten a safety belt and the processor 270 can receive information related to a fastened status of the seat belt via the interface 245 and control the light emitting unit 254 to generate light. In this instance, the shape 1800 can be displayed as the generated light passes through a pattern PT. The processor 270 can activate the touch sensor 213a, as shown in 1801.

As discussed above, a plurality of shapes 1800, 1804, 1805, and 1806 can be displayed. As illustrated in FIG. 18, the ignition button shape 1800, the ACC shape 1804, the ON shape 1805, and the OFF shape 1806 can be displayed. Further, the processor 270 controls the light emitting unit 254 not to output the light when a predetermined time passes after light is generated. In this instance, a shape is not displayed because the light is no longer output. The processor 270 also controls the touch sensor 213a to be inactivated.

The user can also press a brake pedal when a gear lever is located in a park position P or a neutral position N. In this instance, via the interface 245, the processor 270 can receive gear lever position information indicative of the park position P or the neutral position N. The processor 270 can receive brake pedal position information based on the pressed brake pedal.

Upon receiving the brake pedal position information and gear lever position information indicative of the park position P or the neutral position N, the processor 270 controls the light emitting unit 254 to generate light. In this instance, the shape 1800 is displayed as the generated light passes through a pattern PT. The processor 270 also activates the touch sensor 213a, as shown in 1802.

Further, upon receiving brake pedal position information based on the pressed brake pedal, the processor 270 performs a control operation to output light of a first color from a light source positioned to correspond to a location of the ignition button shape 1800. In this instance, the processor 270 performs a control operation not to output light from light sources positioned to respectively correspond to locations of the ACC shape 1804, the ON shape 1805, and the OFF shape 1806.

A first light source, which generates light of a first color, and a second light source, which generates light of a second color, can be positioned to correspond to a location of the ignition button shape 1800. If an event has occurred when the vehicle is turned off, the processor 270 performs a control operation to output light from the first light source. In this instance, a shape may be displayed in the first color.

While pressing a brake pedal, a user can touch an ignition button shape. In this instance, the processor 270 can receive the user's touch input via the touch sensor 213a. In response to the touch input, the processor 270 controls the haptic output unit 253 to output a vibration pattern and/or controls the sound output unit 252 to output predetermined sound. Thus, the user can recognize that the vehicle is in a turned-on state.

In response to the touch input, the processor 270 can also provide a control signal to start the vehicle, as shown in 1803. Further, the vibration pattern and the sound and a touch pattern of the touch input (e.g., a short touch, a long touch, and a double touch) may be set by the user.

In addition, the first light source, which generates light of the first color, and the second light source, which generates light of the second color, are positioned to correspond to a location of the ignition button shape. When the vehicle is turned on by the user's touch input, the processor 270 performs a control operation to output light from the second light source. In this instance, a shape is displayed in the second color. Further, the processor 270 controls the light emitting unit 254 to change transparency, brightness, Chroma, and speed of flashing of the ignition button shape depending on whether the vehicle 100 is turned on or off.

Figure 19:
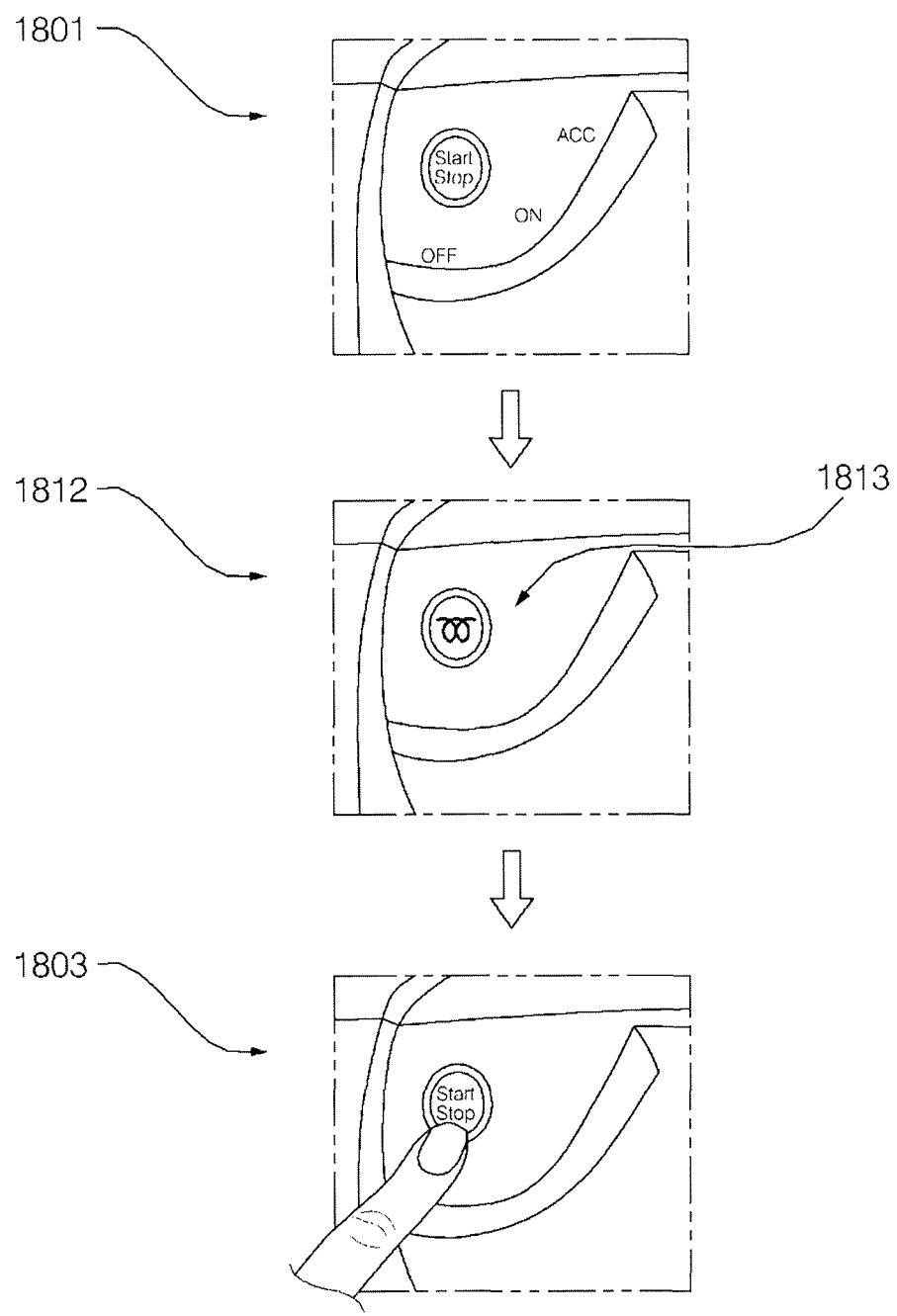

Referring to FIG. 19, a user can open a door and get into a vehicle 100, when the vehicle 100 is turned off. In this instance, the user interface apparatus 200 operates the same way as shown in 1801 and described above with reference to FIG. 18. The user can also press and then depress a brake pedal. In this instance, the user interface apparatus 200 can operate the same way as shown in 1801 and described above with reference to FIG. 18.

Similarly, the user can fasten a safety belt and the user interface apparatus 200 can operate the same way as shown in 1801 and described above with reference to FIG. 18. When a gear lever is located in the parking position P or the neutral position N, the user can apply a long touch or double touch to an ignition button shape without pressing the brake pedal.

In this instance, the processor 270 can receive the user's touch input via the touch sensor 213a and provide a control signal to turn on an electronic device of the first group provided in the vehicle in response to the touch input, as shown in 1812. The processor 270 also controls the light emitting unit 254 to generate light from a light source positioned to correspond to a location of an ACC shape.

Here, the electronic device of the first group may be an accessory device, such as a vehicle air conditioner, a multimedia device, a wiper, and a diesel engine preheater. If an error related to starting or driving the vehicle occurs, the processor 270 controls the light emitting unit 254 to output light corresponding to the error in order to provide a warning. In this instance, the light emitting unit 254 may include an additional light source to output the light corresponding to the error.

Further, the user can touch the ignition button shape while pressing the brake pedal. In this instance, the user interface apparatus 200 operates the same way as shown in 1803 and described above with reference to FIG. 18. However, if an error related to starting on or driving the vehicle occurs, the processor 270 can not provide a control signal to turn on the vehicle according to the user's settings.

Figure 20:
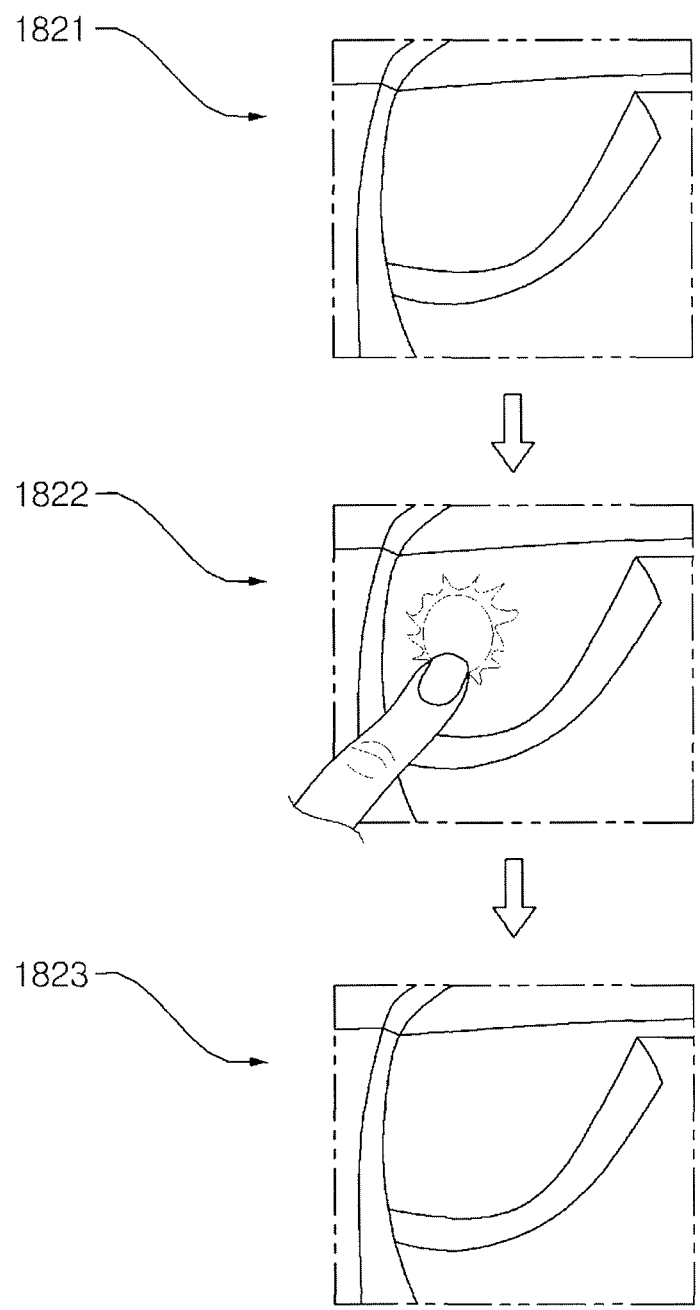

Referring to FIG. 20, when the vehicle is turned on, the user can change a position of a gear lever to any one of the drive position D and the reverse position R. In this instance, when the vehicle is turned on, the processor 270 receives, via the interface 245, gear lever position information indicative of the drive position D or the reverse position R. Upon receiving the gear lever position information indicative of the drive position D or the reverse position R when the vehicle is turned on, the processor 270 controls the light emitting unit 254 not to generate light. In this instance, a shape is not displayed because light is not output. The processor 270 also controls the touch sensor 213a to be inactivated, as shown in 1821.

The user can also depress a brake pedal and start to drive. In this instance, the processor 270 controls the light emitting unit 254 not to generate light and a shape is not displayed because light is not output. The processor 270 also controls the touch sensor 213a to be inactivated, as shown in 1821.

Further, in some embodiments, upon receiving gear lever position information indicative of the drive position D or the reverse position R, the processor 270 controls the light emitting unit 254 to output light which is different from light used for displaying the ignition button shape. While the vehicle is turned on and the ignition button shape is not displayed, the user can apply a touch. In response to the user's touch sensed via the touch sensor 213a when the vehicle is turned on and a gear lever is located in the drive position D or the reverse position R, the processor 270 controls the haptic output unit 253 to output a vibration pattern, as shown in 1822.

Then, in response to a touch no longer being sensed via the touch sensor 213a, the processor 270 controls the haptic output unit 253 to stop outputting the vibration pattern, as shown in 1823. In response to a touch sensed via the touch sensor 213a when the vehicle is turned on and the gear lever is located in the drive position D or the reverse position R, the processor 270 controls the sound output unit 252 to output predetermined sound, as shown in 1822.

In response to a touch no longer being sensed via the touch sensor 213a, the processor 270 controls the sound output unit 252 to stop outputting the sound, as shown in 1823. As a warning is also provided and thus the user can recognize that turning off the vehicle 100 is not possible.

Further, the processor 270 can receive information indicating the engine is not being operated based on an Idle Stop and Go function. In response to a touch sensed via the touch sensor 213a when the engine is not being operated based on the Idle Stop and Go function, the processor 270 controls the haptic output unit 253 to output a vibration pattern, as shown in 1822.

Then, in response to a touch no longer being sensed via the touch sensor 213a, the processor 270 controls the haptic output unit 253 to stop outputting the vibration pattern, as shown in 1823. In response to a touch sensed via the touch sensor 213a when the engine is not being operated based on the Idle Stop and Go function, the processor 270 controls the sound output unit 252 to output predetermined sound, as shown in 1822.

Then, in response to a touch no longer being sensed via the touch sensor 213a, the processor 270 controls the sound output unit 252 to stop outputting the sound, as shown in 1823. If the engine is not being operated based on the Idle Stop and Go function, a user can misunderstand that the vehicle is still turned on. In this instance, a warning is provided in response to a touch, so that the user can recognize that turning off the vehicle is not possible.

When an emergency situation occurs in which the vehicle needs to be turned off, the user can touch an ignition button area, in which the ignition button shape is not displayed (not activated), for more than a predetermined period of time. In this instance, via the touch sensor 213a, the processor 270 can sense a touch which remains for more than the predetermined period of time and provide a control signal to keep power supplied to electronic devices other than an engine.

Figure 21:
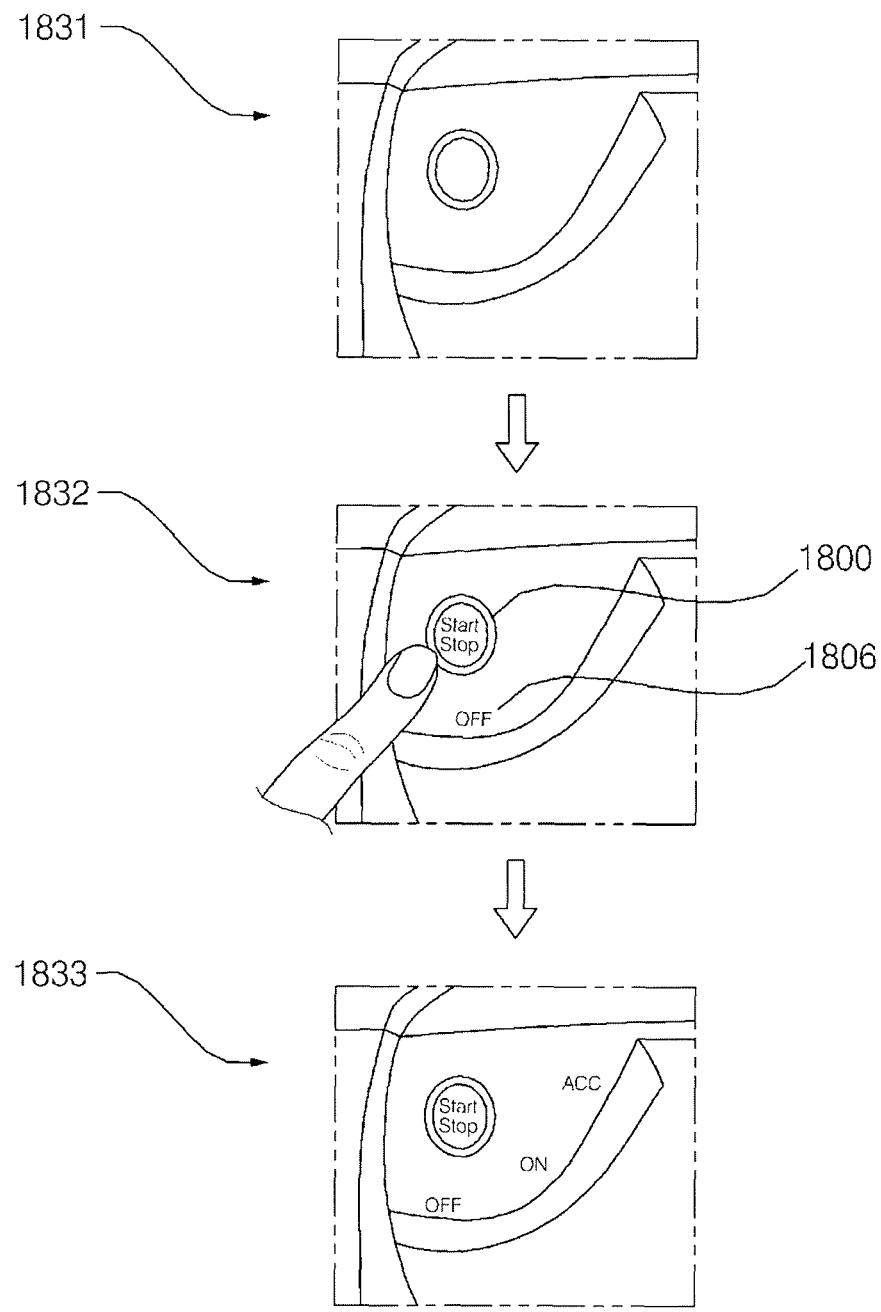

Referring to FIG. 21, the user can press a brake pedal to stop the vehicle, and change a gear lever to the park position P or the neutral position N. In this instance, while the vehicle is turned on, the processor 270 can receive, via the interface 245, gear lever position information indicative of the park position P or the neutral position N. Upon receiving the gear lever position information indicative of the park position P or the neutral position N when the vehicle is turned on, the processor 270 controls the light emitting unit 254 to generate light and the shape 1800 is displayed as the generated light passes through a pattern PT. The processor 270 also activates the touch sensor 213a, as shown in 1831.

When the gear lever is located in the parking position P or the neutral position N, the user can touch the ignition button shape. In this instance, the processor 270 can receive the user's touch input via the touch sensor 213a and control the haptic output unit 253 to output a vibration pattern. In response to the touch input, the processor 270 can also control the sound output unit 252 to output predetermined sound. Thus, the user can recognize that the vehicle is in a turned-off state.

In response to a touch input, the processor 270 can provide a control signal to turn off the vehicle, as shown in 1832. In this instance, the processor 270 performs a control operation to output light from a light source positioned to correspond to a location of the OFF shape 1806. The processor 270 also performs a control operation not to output light from the aforementioned light source after a predetermined time passes.

The user can, again, touch the ignition button shape 1800 and the processor 270 can provide a control signal to start the vehicle in response to the touch input. The user can depress a brake pedal and the processor 270 controls the light emitting unit 254 not to output light after a predetermined time passes. In this instance, the processor 270 controls the light emitting unit 254 to output light until the predetermined time passes, as shown in 1833.

The user can also open a door to get out the vehicle, and then lock the door. In this instance, the processor 270 controls the light emitting unit 254 not to output light and a shape is not displayed because the light is no longer output. The processor 270 also controls the touch sensor 213a to be inactivated.

Figure 22:
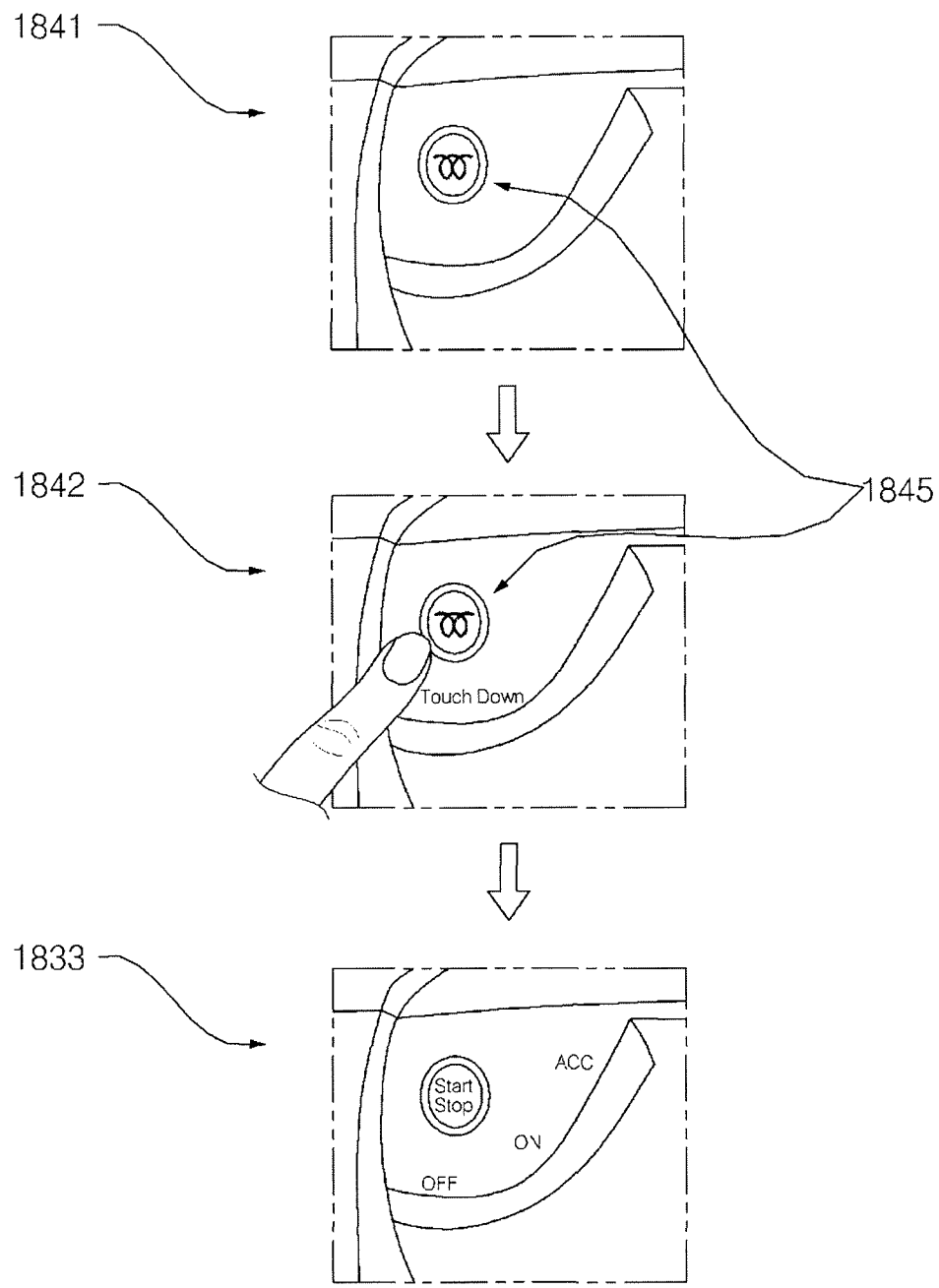

Referring to FIG. 22, the user can press a brake pedal to stop the vehicle, and change a gear lever to the park position P or the neutral position N. In this instance, the user interface apparatus 200 operates the same way as shown in 1831 and described above with reference to FIG. 21. If post-heating is necessary because an engine is heavily loaded due to high-speed driving, the processor 270 controls the light emitting unit 254 to output light from a light source positioned to correspond to a location of a post-heat warning shape, as shown in 1841.

When the gear lever is in the park position P or the neutral position N, the user can touch a post-heat warning shape 1845. In this instance, the processor 270 can receive the user's touch input via the touch sensor 213a and in response to the touch input, the processor 270 controls the haptic output unit 253 to output a vibration pattern. In response to the touch input, the processor 270 can also control the sound output unit 252 to output predetermined sound. Thus, the user can recognize that the vehicle is in a turned-on state for the post heating process.

Depending on the user's setting, the processor 270 can provide a control signal to automatically turn off the vehicle when the post-heating process is finished, as shown in 1842. In this instance, the processor 270 performs a control operation to output light from a light source positioned to correspond to a location of the OFF shape 1806.

Further, the user can depress a brake pedal. In this instance, the user interface apparatus 200 operates the same way as shown in 1833 and described above with reference to FIG. 21. The user can open a door to get off the vehicle, and then lock the door. In this instance, the user interface apparatus 200 operates the same way as shown in 1833 and described above with reference to FIG. 21.

Further, the user can depress the brake pedal and get off the vehicle during the post-heating process. In this instance, the processor 270 can continue to notify the post-heating process and provide a control signal to automatically turn off the vehicle when the post-heating process is finished.

Figure 23:
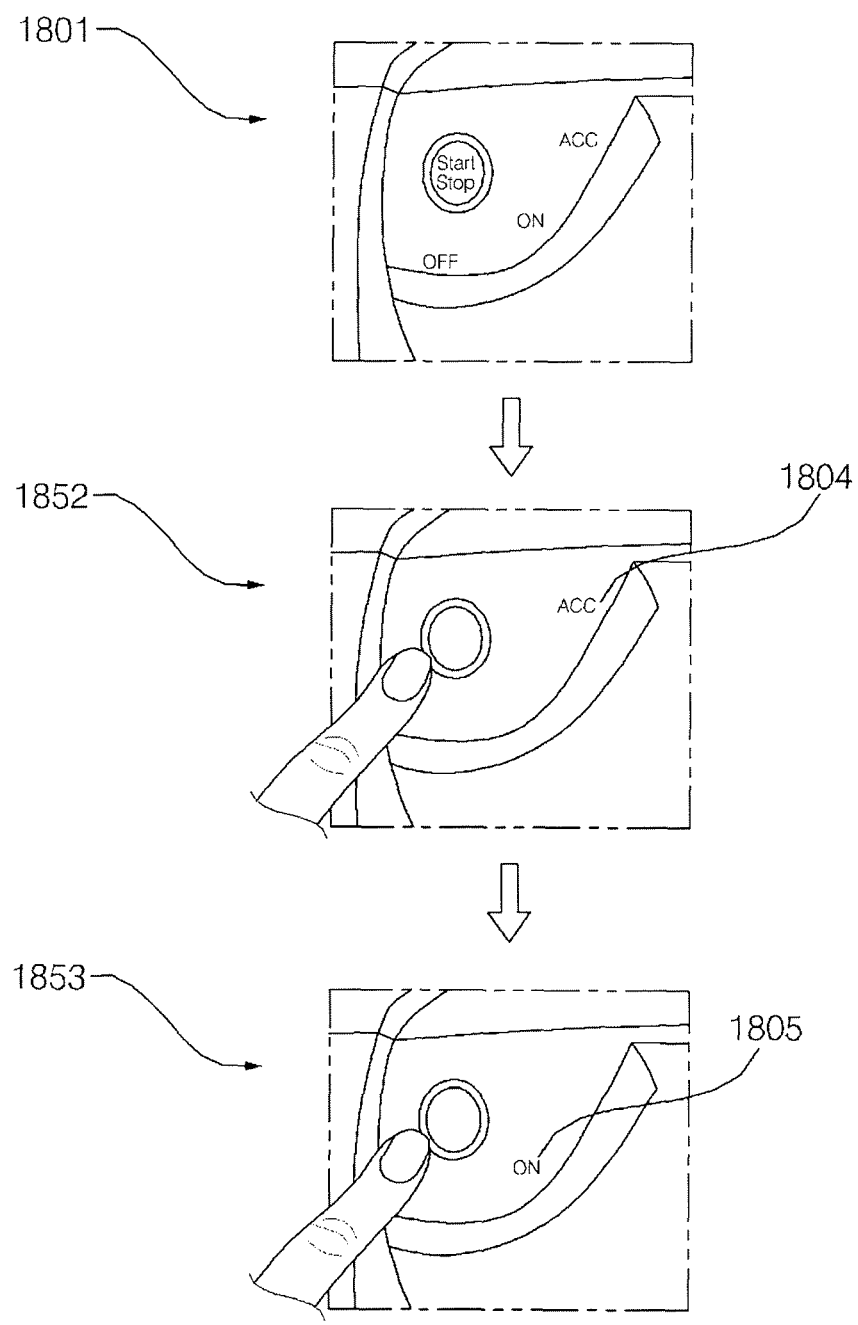

Referring to FIG. 23, the user can open a door and sit on the driver seat, when the vehicle 100 is turned off. In this instance, the user interface apparatus 200 operates the same way as shown in 1801 and described above with reference to FIG. 18. Without pressing a brake pedal, the user can touch the ignition button area in which the ignition button shape is not displayed (not activated). In this instance, the processor 270 can sense the touch via the touch sensor 213*a* and in response to a touch sensed when the brake pedal is not pressed, the processor 270 can provide a control signal to turn on an electronic device of the first group provided in the vehicle, as shown in 1852.

Further, the processor 170 controls the light emitting unit 254 to output a first light from a first light source positioned to correspond to the circumference of an ignition button. The processor 270 also controls the light emitting unit 254 to generate light from a light source positioned to correspond to a location of the ACC shape 1804, as shown in 1852.

The electronic device of the first group may be an accessory device, such as a vehicle air conditioner, a multimedia device, a wiper, and a diesel engine preheater. When the electronic device of the first group is turned on, the user can touch the ignition button area in which the ignition button shape is not displayed (not activated). In this instance, the processor 270 can sense the touch via the touch sensor 213*a* and in response to the touch sensed when the electronic device of the first group is turned on, the processor 270 can provide a control signal to turn on an electronic device of a second group provided in the vehicle, as shown in 1853.

The processor 270 controls the light emitting unit 254 to output a second light from a second light source positioned to correspond to the circumference of the ignition button. The processor 270 controls the light emitting unit 254 to generate light from a light source positioned to correspond to a location of the ON shape 1805, as shown in 1853. The electronic device of the second group may be an accessory device, such as a cluster and a lamp.

When the electronic devices of the first and second groups are turned on, the user can touch the ignition button area in which the ignition button shape is not displayed (not activated). In this instance, the processor 270 can sense the touch via the touch sensor 213*a* and in response to the touch sensed when the electronic devices of the first and second groups are turned on, the processor 270 can provide a control signal to turn off the vehicle. In this instance, electronic devices inside the vehicle, including the electronic devices of the first and second groups, may be turned off.

Figure 24:
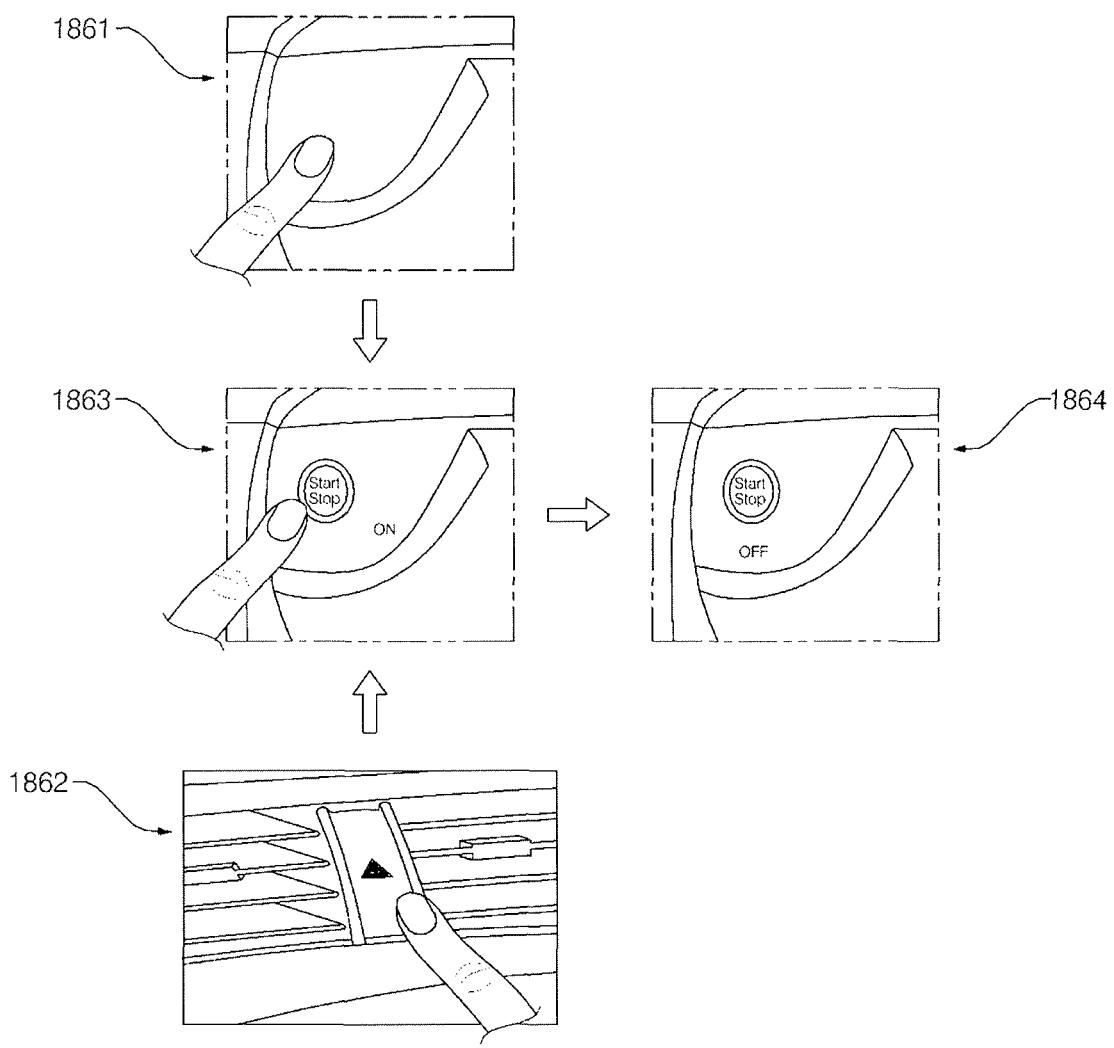

Referring to FIG. 24, the user can induce an emergency stop of the vehicle when an emergency situation occurs in the middle of driving. In this instance, the user can turn on an emergency lamp and touch the ignition button area in which the ignition button shape is not displayed (not activated).

For example, the emergency situation may be a flat tire, engine overheat, dozing off behind the wheel, or collision with an obstacle. When the vehicle is turned on, the processor 270 can receive an emergency lamp turn on signal, as shown in 1862, and sense the touch via the touch sensor 213*a*, as shown in 1861. The processor 270 controls the light emitting unit 254 to generate light and the shape 1800 is displayed as the generated light passes through a pattern PT. The processor 270 also activates the touch sensor 213*s*, as shown in 1863.

Further, the user can touch the ignition button shape in a predetermined touch pattern. In this instance, the processor 270 can receive the user's touch input via the touch sensor 213*a* and provide a control signal to turn on the vehicle in response to the touch input, as shown in 1864.

Figure 25:
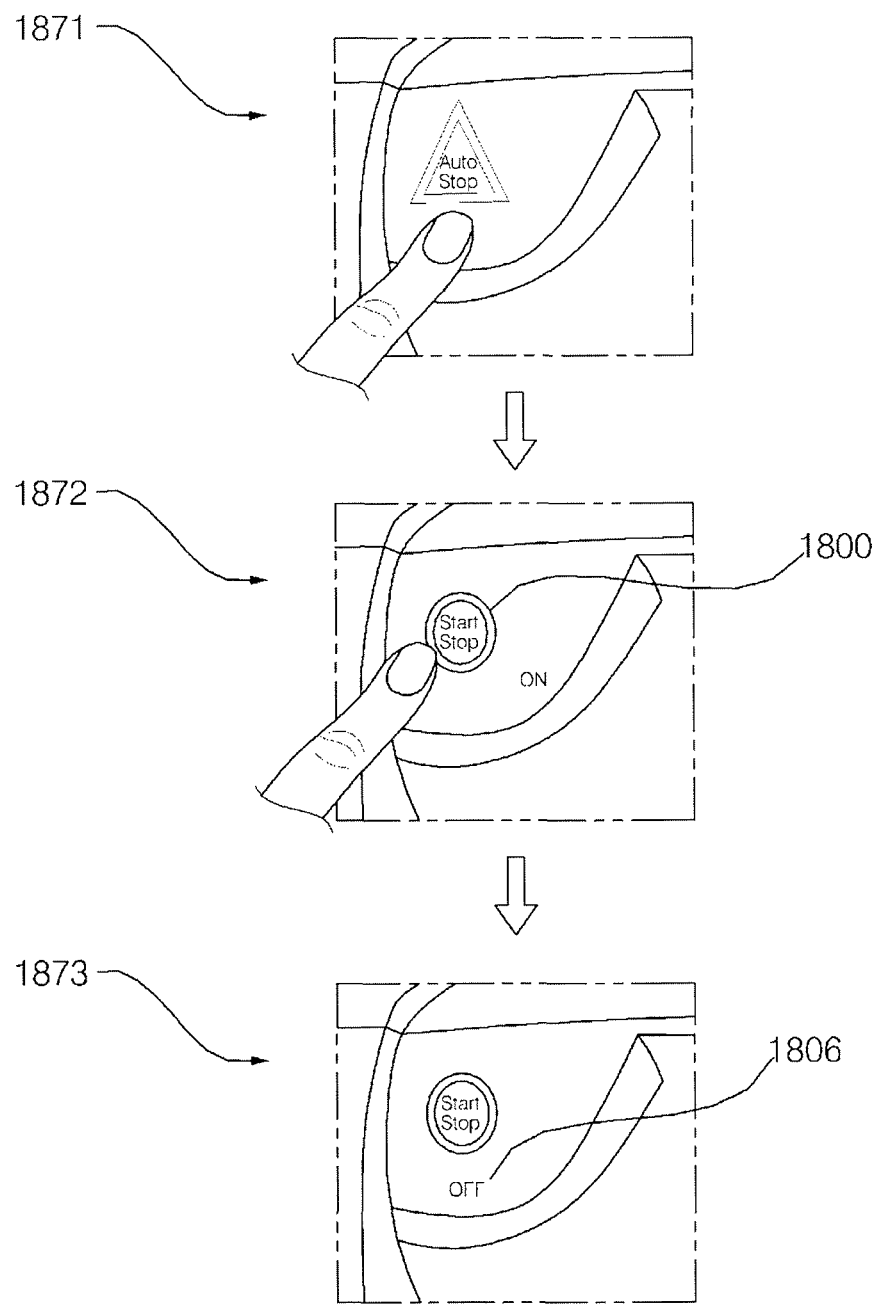

Referring to FIG. 25, when an engine is not being operated based on the Idle Stop and Go function, the user can touch the ignition button area in which the ignition button shape is not displayed (not activated). In this instance, the processor 270 can receive brake pedal position information based on a pressed brake pedal and information indicating the engine is not being operated based on the Idle Stop and Go function and control the light emitting unit 254 to output light corresponding to a first shape. The first shape may be an Idle Stop and Go operation indicating shape, as shown in 1871.

While pressing the brake pedal, the user can touch an area corresponding to the first shape. In this instance, the processor 270 can receive the user's touch input via the touch sensor 231*a* and provide a control signal to change a gear lever to the parking position P.

The processor 270 also controls the light emitting unit 254 to generate light and a second shape 1800 is displayed as the generated light passes through a pattern PT. The processor 270 also activates the touch sensor 213*a*. The second shape may be the ignition button shape 1800, as shown in 1872.

In addition, the processor 270 controls the light emitting unit 254 to output light from a light source positioned to correspond to a location of the ON shape 1805 in order to display the ON shape 1805. While pressing the brake pedal, the user can touch an area corresponding to the second shape. In this instance, the processor 270 can receive the user's touch input via the touch sensor 213*a* and control the haptic output unit 253 to output a vibration pattern. The processor 270 also controls the sound output unit 252 to output predetermined sound. Thus, the user can recognize that the vehicle is in a turned-off state.

In response to a touch input, the processor 270 can provide a control signal to turn off the vehicle, as shown in 1873. In this instance, the processor 270 performs a control operation to output light from a light source positioned to correspond to a location of the OFF shape 1806 and performs a control operation not to output light from the aforementioned light source after a predetermined time passes.

Figure 26:
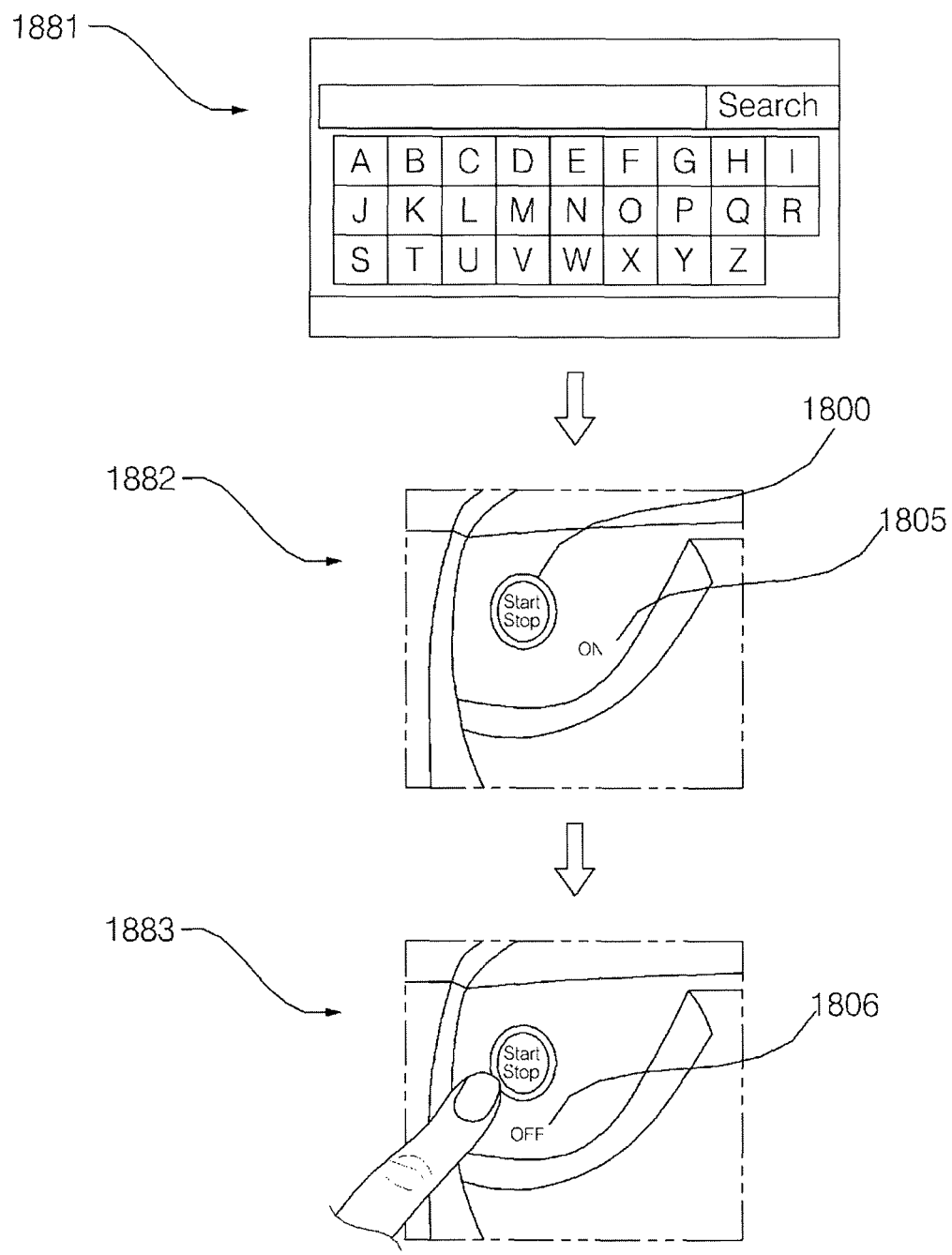

Referring to FIG. 26, the user can input a destination to a navigation system 770 via an input unit 210 of the user interface apparatus 200. The navigation system 770 then calculates a route to the input destination based on pre-stored map data and GPS information of the vehicle, as shown in 1881.

If the vehicle 100 is travelling by manual manipulation of the user, the navigation system 770 can provide the calculated route to the user through an output unit 250 of the user interface apparatus 200. If the vehicle 100 is autonomously travelling, the vehicle 100 can travel along the calculated route.

When arriving at the destination, the user can press a brake pedal and the processor 270 can receive location information of the vehicle 100 via the interface 245. In addition, the location information of the vehicle 100 can be based on GPS information acquired by a location information unit 420 or based on vehicle surrounding images acquired by a camera 310.

Further, the processor 270 can receive brake pedal position information based on the pressed brake pedal and upon receiving the brake pedal position information based on the pressed brake pedal when the vehicle 100 has arrived at the destination or is within a predetermined distance from the destination, the processor 270 controls the light emitting unit 254 to generate light. In this instance, the shape 1800 is displayed as the generated light passes through a pattern PT. The processor 270 also activates the touch sensor 213a, as shown in 1882. The shape 1800 may be the ignition button shape 1800.

Further, the processor 270 controls the light emitting unit 254 to output light from a light source positioned to correspond to a location of the ON shape 1805 in order to display the ON shape 1805. While pressing the brake pedal, the user can touch the ignition button shape 1800.

The processor 270 can receive the user's touch input via the touch sensor 213a and in response to the touch input, the processor 270 controls the haptic output unit 253 to output a vibration pattern. In response to the touch input, the processor 270 also controls the sound output unit 252 to output predetermined sound. Thus, the user can recognize that the vehicle is in a turned-off state.

In response to a touch input, the processor 270 can provide a control signal to turn off the vehicle, as shown in 1883. In this instance, the processor 270 performs a control operation to output light from a light source positioned to correspond to a location of the OFF shape 1806. The processor 270 performs a control operation not to output light from the aforementioned light source after a predetermined time passes.

Figure 27:
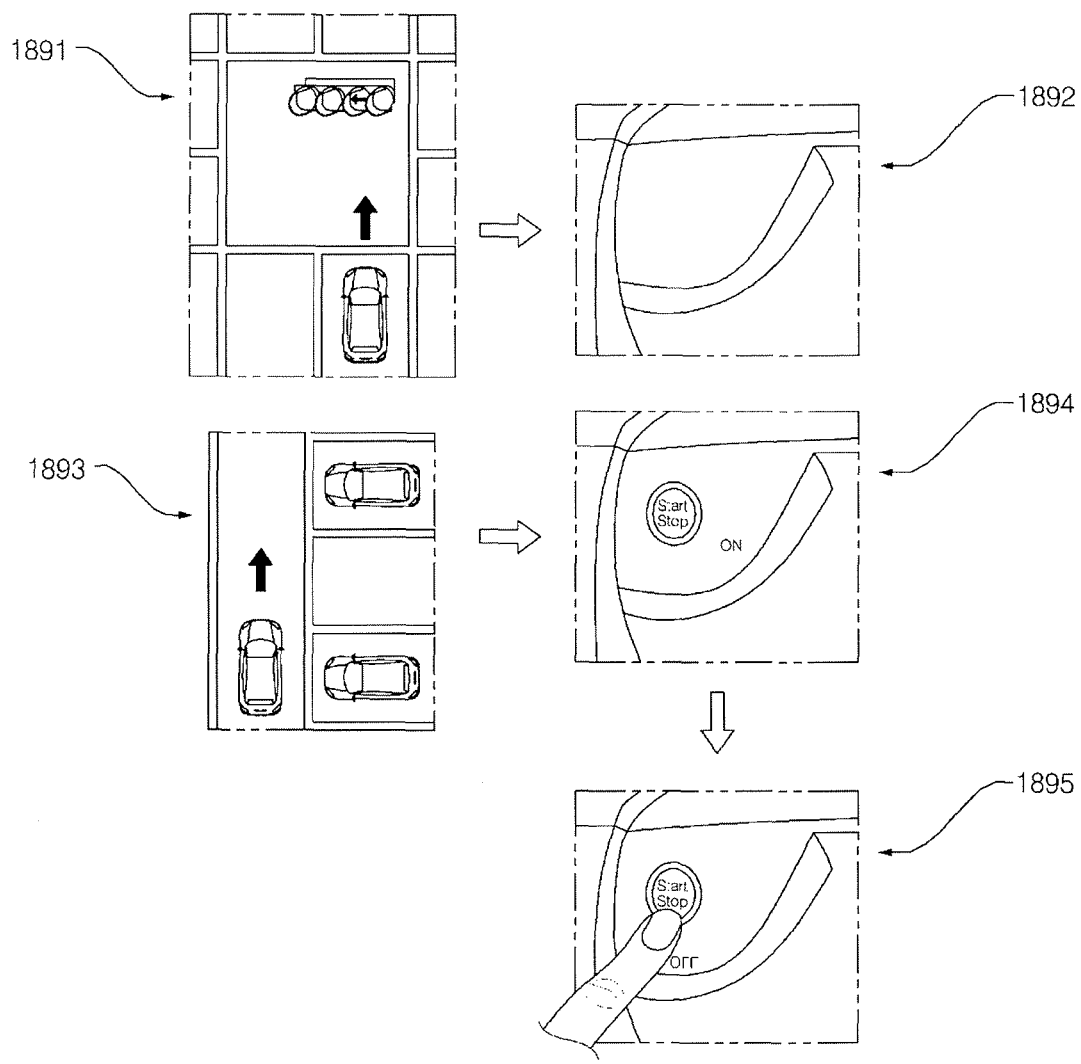

Referring to FIG. 27, the object detection device 300 can determine whether parking the vehicle 100 is available. For example, the object detection device 300 can acquire vehicle surrounding images using the camera 310 and determine, based on the acquired vehicle surrounding images, whether the vehicle 100 is located in a parking available area.

For example, if information on a road on which the vehicle 100 is located is acquired from vehicle surrounding images, the object detection device 300 can determine that the vehicle 100 is not located in a parking available area. In another example, if information on a parking lot on which the vehicle 100 is located (e.g., a parking sign plate, a parking line, and an already parked vehicle) is acquired from vehicle surrounding images, the object detection apparatus 300 can determine that the vehicle 100 is located in a parking available area.

In addition, the processor 270 can receive information as to whether the vehicle 100 is located in a parking available area from the object detection device 300 through the interface 245. Upon receiving gear lever position information indicative of the drive position D or the reverse position R when the vehicle 100 is not located in a parking available area, as shown in 1891, the processor 270 controls the light emitting unit 254 not to generate light. In this instance, a shape is not displayed because no light is output. The processor 270 also controls the touch sensor 213a to be inactivated, as shown in 1892.

When the vehicle 100 is located in a parking available area, as shown in 1893, the processor 270 controls the light emitting unit 254 to generate light. In this instance, the shape 1800 is displayed as the generated light passes through a pattern PT. The processor 270 also activates the touch sensor 213a, as shown in 1894. The shape 1800 may be the ignition button shape 1800.

In addition, the processor 270 controls the light emitting unit 254 to output light from a light source positioned to correspond to a location of the ON shape 1805 in order to display the ON shape 1805. When a gear lever is in the park position P or the neutral position N, the processor 270 can receive a user's touch input via the touch sensor 213a.

In this instance, the processor 270 can provide a control signal to turn off the vehicle in response to the touch input, as shown in 1895 and provide a control operation to output light from a light source positioned to correspond to a location of the OFF shape 1806. The processor 270 performs a control operation not to output light from the aforementioned light source after a predetermined time passes.

Figure 28:
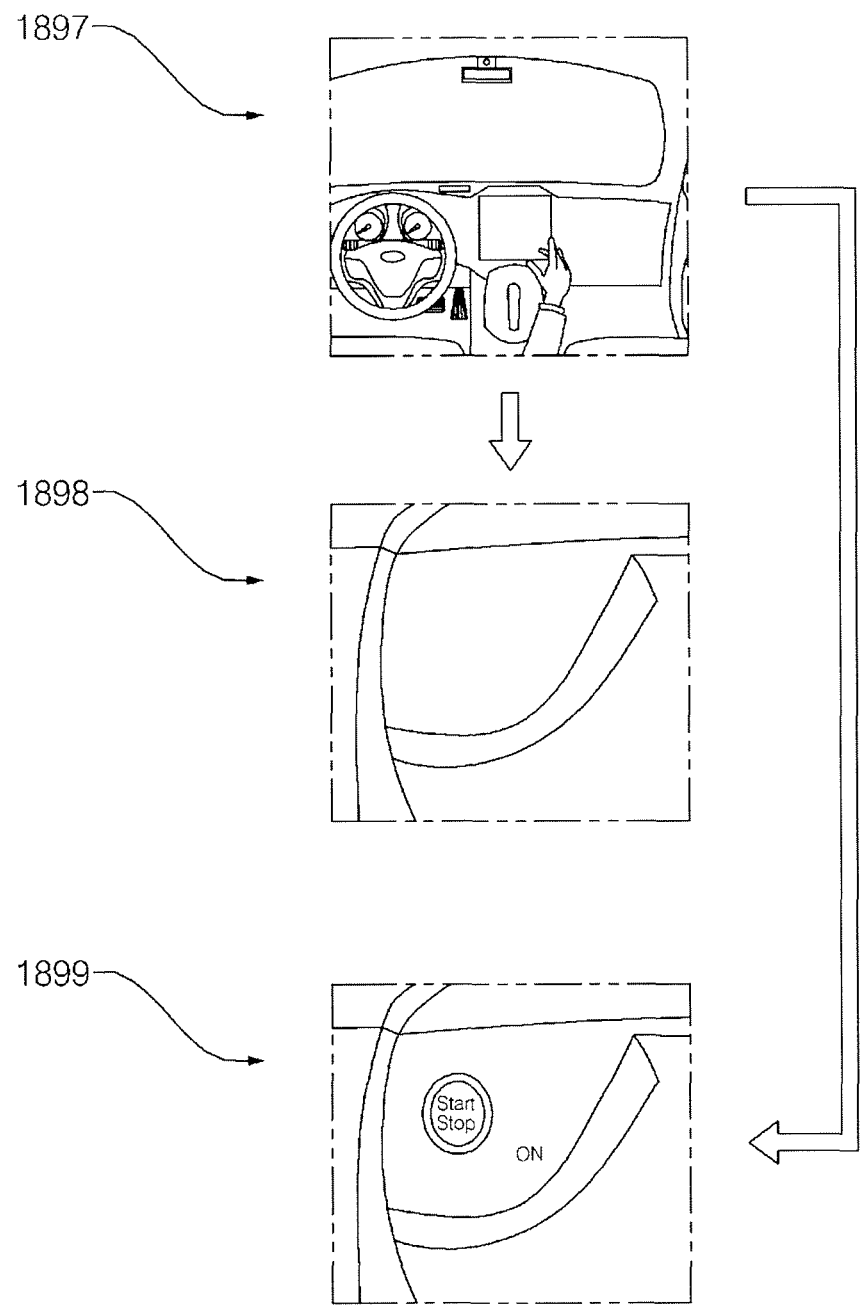

Referring to FIG. 28, the processor 270 controls the user interface apparatus 200 based on a user's gesture input received via a gesture input unit 212. Specifically, the processor 270 can determine that a gesture input is a trigger input, as shown in 1897. Upon receiving a gesture input when the vehicle 100 is travelling or an engine is not being operated based on an Idle Stop and Go function, the processor 270 controls the light emitting unit 254 not to output light. In this instance, a shape is not displayed because no light is output. The processor 270 also controls the touch sensor 213a to be inactivated, as shown in 1898 and the processor 270 can output a vibration pattern or sound for alarming.

Upon receiving a gesture input when the vehicle 100 is parked, the processor 270 controls the light emitting unit 254 to generate light. In this instance, the shape 1800 may be displayed as the generated light passes through a pattern PT. The processor 270 can activate the touch sensor 213a, as shown in 1899. The shape 1800 may be the ignition button shape 1800. The processor 270 also controls the light emitting unit 254 to output light from a light source positioned to correspond to a location of the ON shape 1805 in order to display the ON shape 1805.

Figure 29:
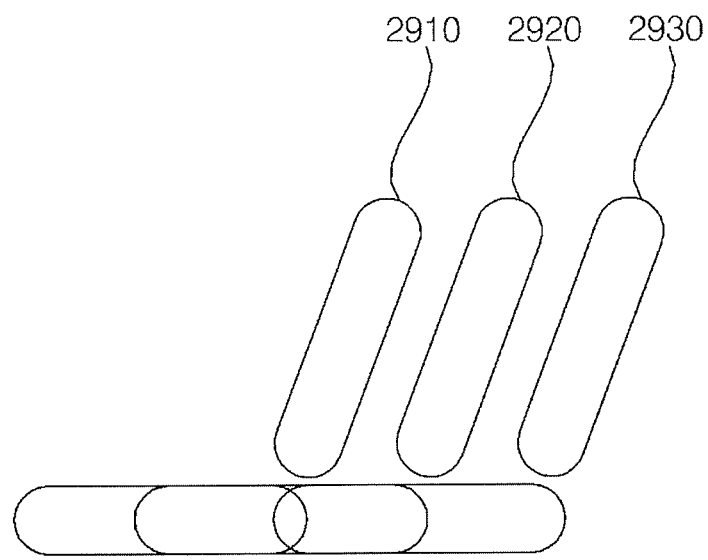
FIGS. 29 to 31 are views showing various examples of a vehicle user interface apparatus according to an embodiment of the present invention, in which the apparatus is implemented as a seat position control apparatus.
Figure 30:
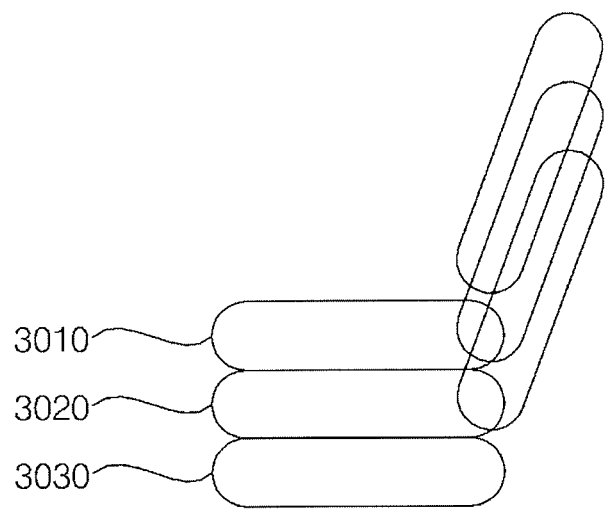
Figure 31:
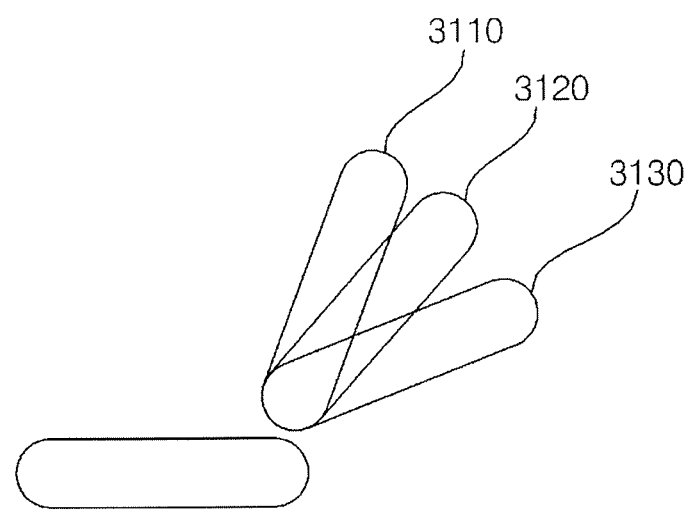

Next, FIGS. 29 to 31 are views illustrating various embodiments of a vehicle user interface apparatus according to an embodiment of the present invention, in which the apparatus is implemented as a seat position control apparatus. In response to a touch sensed by the touch sensor 213a, the processor 270 can provide a signal to a seat adjustment device.

When the light emitting unit 254 includes the plurality of light sources 254a, the pattern member 811 of the cover 810 may include a plurality of patterns which are positioned to correspond to locations of the plurality of light sources and through which lights generated by the plurality of light sources are transmitted respectively. In this instance, the processor 270 controls any one of the plurality of light sources to generate light indicative of a particular seat position.

Referring to FIG. 29, the processor 270 controls the light emitting unit 254 to generate light based on seat position information. The light emitting unit 254 may include a plurality of light sources and the pattern member 811 of the cover 810 may include a plurality of patterns PT. Further, the plurality of light sources may be positioned to respectively correspond to locations the patterns PT.

In addition, the touch input unit 213 may include a plurality of touch sensors 213a positioned to respectively correspond to locations of the plurality of patterns PT. If an event has occurred, the processor 270 controls the light emitting unit 254 to generate light in response to the event.

Here, the event may be a user's input received via the input unit 210. The user's input may be referred to as a trigger input. In some embodiments, the trigger input may be received by a touch sensor 213a. A shape 2910, 2920, or 2930 can also be displayed as generated light passes through a pattern PT.

When light is generated by the light emitting unit 254, the processor 270 can activate a touch sensor 213a. When the touch sensor 213a is activated, the processor 270 can receive a touch input via the touch sensor 213a, and the processor 270 can provide a control signal corresponding to the touch input to the seat adjustment device.

In some embodiments, the event may be receiving seat position information. For example, upon receiving seat position information indicative of a first state, the processor 270 controls the light emitting unit 254 to generate light from a light source positioned to correspond to a location of a first shape 2910.

Further, a seat position can be adjusted to any one among a plurality of position states in a forward-and-backward direction (e.g., an overall length direction). A plurality of shapes 2910, 2920, and 2930 respectively correspond to the plurality of position states. The processor 270 can receive a touch input via a touch sensor 213a that corresponds to one of the plurality of shapes 2910, 2920, and 2930 and provide a control signal to the seat adjustment device to adjust a seat position in response to the touch input.

For example, when the seat position is in the first state, the processor 270 can receive a touch input via a touch sensor corresponding to a second shape 2920. In this instance, the processor 270 can provide a control signal to the seat adjustment device to adjust the seat position to a second state. For example, when a seat position is in the first state, the processor 270 can receive a touch input via a touch sensor corresponding to a third shape 2930. In this instance, the processor 270 can provide a control signal to the seat adjustment device to adjust the seat position to a third state.

Referring to FIG. 30, a seat position may be adjusted to one of a plurality of position states in a top-and-down direction (e.g., an overall height direction). A plurality of shapes 3010, 3020, and 3030 may respectively correspond to the plurality of seat position states. Further, the processor 270 can receive a touch input via a touch sensor 213a corresponding to one of the plurality of shapes 3010, 3020, and 3030 and provide a control signal to the seat adjustment device to adjust a seat position in response to the touch input.

Referring to FIG. 31, a seat position may be adjusted in a manner in which a seat back is adjusted to one of a plurality of states. Further, the plurality of shapes 3110, 3120, and 3130 can respectively correspond to the plurality of position states. The processor 270 can receive a touch input via a touch sensor 213a corresponding to one of the plurality of shapes 3110, 3120, and 3130 and provide a control signal to the seat adjustment device to adjust a seat position in response to the touch input.

Figure 32:
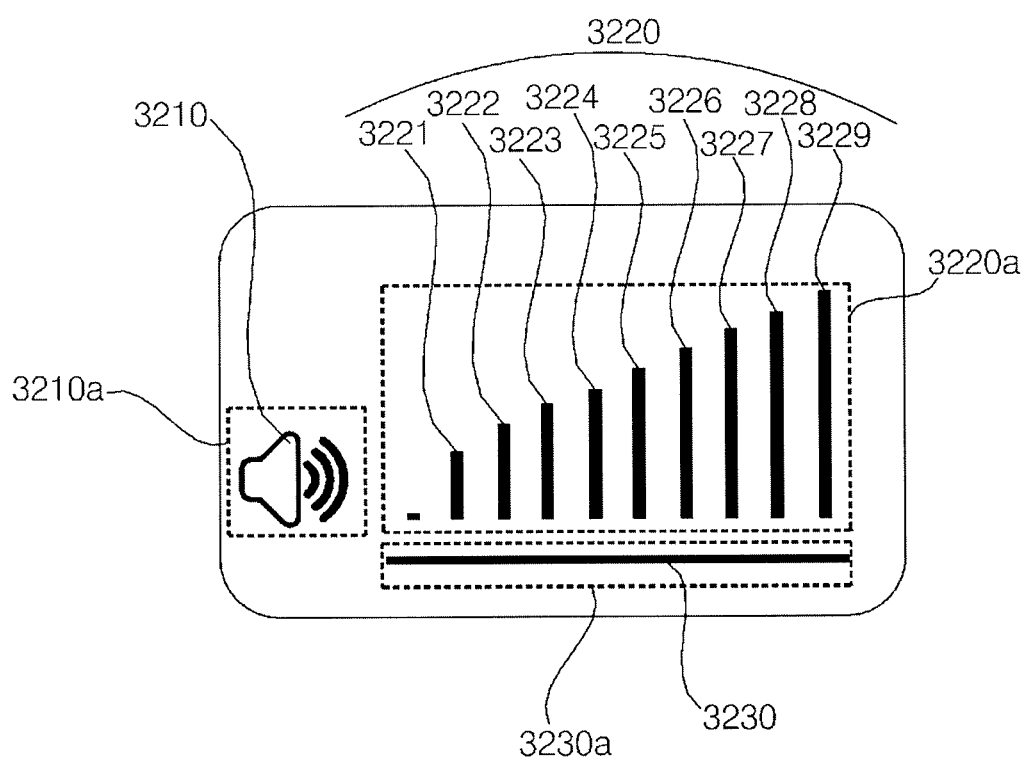
FIGS. 32 to 36 are views of various embodiments of a vehicle user interface apparatus according to an embodiment of the present invention, in which the apparatus provides a signal to perform control of multiple stages.

Next, FIGS. 32 to 36 are views illustrating various embodiments of a vehicle user interface apparatus according to an embodiment of the present invention, in which the apparatus provides a signal to control operation at multiple levels. Referring to FIG. 32, a plurality of shapes 3210, 3220, and 3230 are displayed. The cover 810 may include a plurality of areas 3210a, 3220a, 3230a which respectively correspond to the plurality of shapes 3210, 3220, and 3230.

Further, the plurality of areas 3210a, 3220a, and 3230a may include a notification area 3210a to output notification corresponding to information indicative an activated state of a touch sensor 213a. If an event has occurred, the processor 270 controls the light emitting unit 254 to output a first light through the notification area 3210a. The light emitting unit 254 may include a first light source that outputs the first light.

In addition, the plurality of areas 3210a, 3220a, and 3230a may respectively correspond to locations of touch sensors 213a, and include touch areas 3220a and 3230a to receive a touch input. The touch sensors 213a may also be positioned to correspond to locations of the touch areas 3220a and 3230a. For example, a first touch sensor may be positioned to correspond to a location of a first area 3220a, and a second touch sensor may be positioned to correspond to a location of a second area 3230a.

The processor 270 can provide a signal to a vehicle device to control operation at multiple levels. Further, the touch areas 3220a and 3230a may include the first area 3220a for displaying information on a level set by a touch input, and the second area 3230a for receiving a touch input. The touch areas 3220a and 3230a can also receive a drag input through the first area 3220a or the second area 3230a.

In addition, the processor 270 controls the light emitting unit 254 to output a second light through the notification area 3210a and the touch areas 3220a and 3230a in response to the drag input. The light emitting unit 254 may include a second light source that outputs the second light.

Further, the processor 270 can provide a control signal, which corresponds to the drag input, to the vehicle device. The second light can also be brighter than the first light. When a touch down input intended to apply a drag input is received, the processor 270 controls the light emitting unit 254 to output light such that the output light reaches a point where the touch down input is received in the touch areas 3220a and 3230a. In this instance, the processor 270 can provide a signal to control the vehicle device to operate at a level which corresponds to the touch down input among multiple levels.

Figure 33:
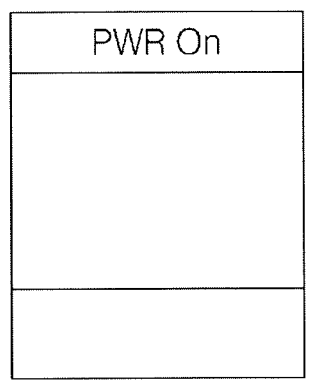
Figure 34:
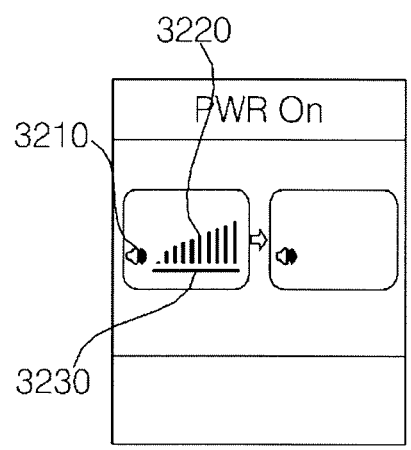

Referring to FIG. 33, if an event has not occurred, the processor 270 controls the light emitting unit 254 not to output light. In this instance, no light is generated, no light is output through a pattern PT, and therefore, no shape is displayed. Referring to FIG. 34, upon receiving vehicle door opening information or vehicle starting-on information via an interface, the processor 270 controls the light emitting unit 254 to output light. Further, the light emitting unit 254 may include a plurality of light sources. For example, the light emitting unit 254 may include a first light source, a second light source, and a third light source.

If an event has occurred, the processor 270 controls the light emitting unit 254 to output light from the first light source, the second light source, and third light source. Further, a plurality of patterns PT may be formed on the pattern member 811. For example, the pattern member 811 may include a first pattern corresponding to the first light source, a second pattern corresponding to the second light source, and a third pattern corresponding to the third light source.

A first shape 3210 may be displayed by the first pattern and the first light generated from the first light source, and a second shape 3220 may be displayed by the second pattern and the second light generated from the second light source. The third shape 3230 can also be displayed by the third pattern and the third light generated from the third light source.

As light is output from the first, second, and third light sources, the first shape 3210, the second shape 3220, and the third shape 3230 are displayed. The processor 270 controls the light emitting unit 254 so the first light source outputs the first light but the second and third light sources no longer output light after a predetermined time passes. In this instance, only the first shape 3210 is displayed.

Figure 35:
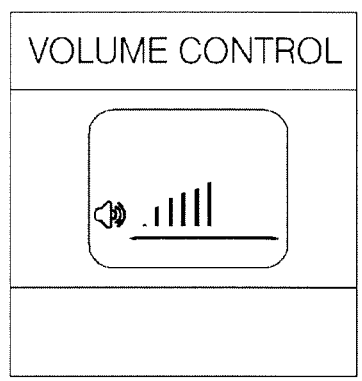

Referring to FIG. 35, a touch sensor 213a can be positioned to correspond to a location of the second pattern, and the processor 270 can receive a user's touch input via the touch sensor 213a. When a touch input is received, the processor 270 controls the light emitting unit 254 to output light from the third light source. In this instance, the third shape 3230 is displayed.

When the third shape 3230 is displayed, the processor 270 can receive the user's drag input and provide a control signal corresponding to the drag input to the vehicle device. For example, the processor 270 can provide a signal to the vehicle device in order to control the vehicle device to operate at a level corresponding to a point where the drag input is received.

In this instance, the processor 270 performs a control operation to output light from the second light source such that the output light reaches a section corresponding to the level, so that the second shape 3220 may be displayed partially or fully. In some embodiments, there may be provided a plurality of touch sensors 213a which are positioned to respectively correspond to locations of the second pattern and the third pattern.

Figure 36:
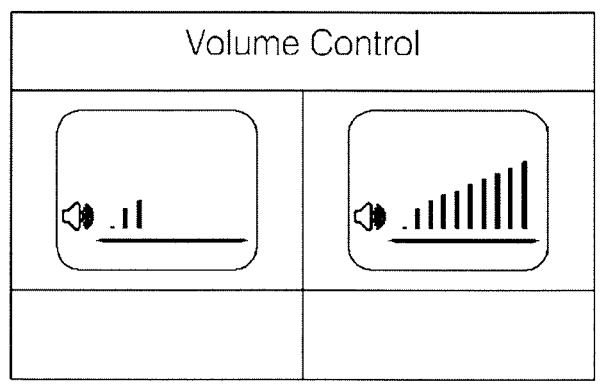

Referring to FIG. 36, when the third shape 3230 is displayed, the processor 270 can receive a user's touch input. When a touch input is received in a left-hand side of a touch sensor 213a positioned to correspond to a location of the third shape 3230, the processor 270 can provide a control signal to the vehicle device to decrease a level in response to the touch input. In this instance, the processor 270 performs a control operation to output light such that the output light reaches a section corresponding to a level set by the touch input, so that the second shape 3220 may be displayed partially or fully.

When a touch input is received in a right-hand side of a touch sensor 213a positioned to correspond to a location of the third shape 3230, the processor 270 can provide a control signal to the vehicle device to increase a level in response to the touch input. In this instance, the processor 270 performs a control operation to output light such that the output light reaches a section corresponding to a level set by the touch input, so that the second shape 3220 may be displayed partially or fully.

Figure 37:
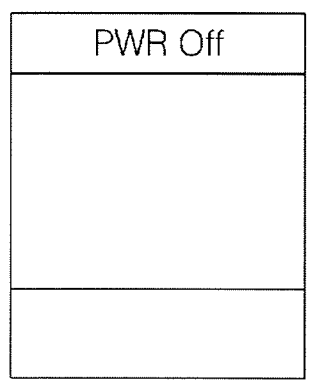
FIGS. 37 to 40 are views of various embodiments of a vehicle user interface apparatus according to an embodiment of the present invention, in which the apparatus is implemented as an object detection warning indicator and an unfastened seat belt warning indicator.
Figure 40:
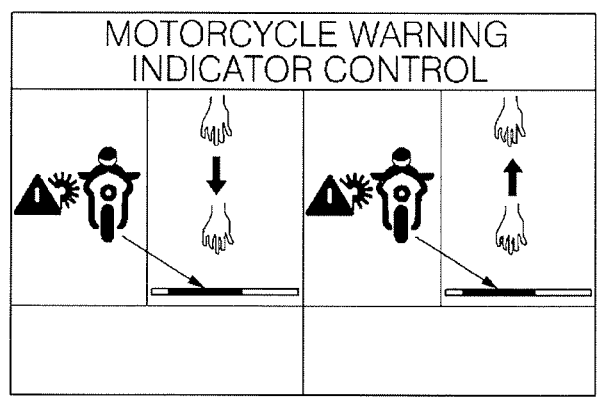

Next, FIGS. 37 and 40 are views illustrating various embodiments of a vehicle user interface apparatus according to an embodiment of the present disclosure, in which the apparatus is implemented as an object detection warning indicator and an unfastened seat belt warning indicator.

Referring to FIG. 37, if an event has not occurred, the processor 270 controls the light emitting unit 254 not to output light.

In this instance, no light is generated, no light is output to the outside through a pattern PT, and therefore, no shape is displayed. In this embodiment, the event may be receiving information related to a fastened/unfastened status of a seat belt, or receiving object detection information.

Figure 38:
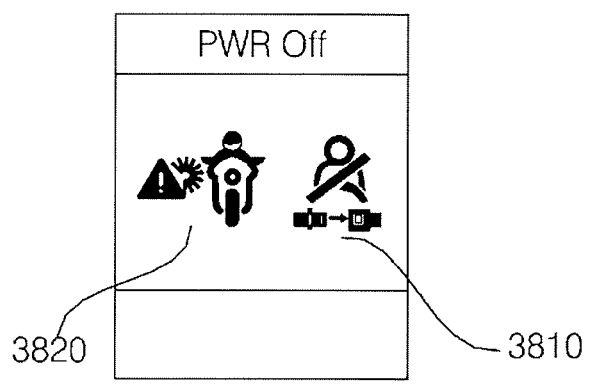

Referring to FIG. 38, upon receiving vehicle door opening information or vehicle starting-on information, the processor 270 controls the light emitting unit 254 to output light. Further, the light emitting unit 254 may include a plurality of light sources. For example, the light emitting unit 254 may include a first light source and a second light source.

In addition, a plurality of patterns PT may be formed on the pattern member 811. For example, the pattern member 811 may include a first pattern corresponding to the first light source, and a second pattern corresponding to the second light source. As light is output from the first and second light sources, a first shape 3810 and a second shape 3820 may be displayed.

Figure 39:
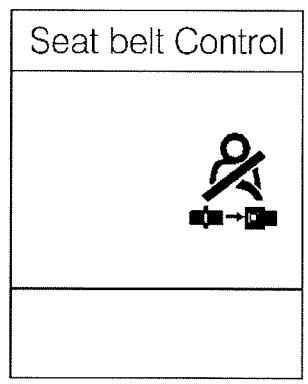

Referring to FIG. 39, upon receiving information related to an unfastened status of a seat belt, the processor 270 controls the light emitting unit 254 to output light from the first light source and the first shape 3210 is displayed. Referring to FIG. 40, the processor 270 controls a light output pattern in response to a user's gesture input received via the gesture input unit 212.

For example, upon receiving a gesture in which a user's hand is approaching the user interface apparatus 200, the processor 270 controls the light emitting device 254 such that the amount of light increases gradually, the color of light becomes bright gradually, the flashing interval becomes short gradually, or the flashing duration becomes short gradually. In this instance, the processor 270 controls the sound output unit 252 to gradually increase volume.

In another example, upon receiving a gesture in which the user's hand is moving away from the user interface apparatus 200, the processor 270 controls the light emitting unit 254 such that the amount of light decreases gradually, the color of light becomes dark gradually, the flashing interval becomes long gradually, or the flashing duration becomes long gradually. In this instance, the processor 270 controls the sound output unit 252 to gradually decrease volume.

The embodiments of the present invention include several advantages. First, an input unit is activated only when necessary to receive a user's input, and therefore, it is possible to prevent an error input that is not intended by the user. In addition, when a user interface apparatus is not activated, the exterior appearance thereof appears to be integral with vehicle interior design, thereby creating a sense of unity. The present invention also enables fast and massive production of products fitting to vehicle interior design. A slim design can also be achieved.

The present invention as described above may be implemented as code that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the embodiments set forth herein in all terms, but should be considered by way of example. The scope of the present invention should be determined by the reasonable interpretation of the accompanying claims and all changes in the equivalent range of the present invention are intended to be included in the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternatives uses will also be apparent to those skilled in the art.

What is claimed is:

1. A vehicle user interface apparatus for a vehicle, comprising:
   a light emitting unit configured to emit light;
   a touch sensor configured to sense a touch;
   a processor configured to:
   control the light emitting unit to emit the light in response to an event,
   activate the touch sensor when the light is emitted, and
   provide a signal to control a vehicle device corresponding to a touch input received through the activated touch sensor; and
   a cover covering the light emitting unit, the touch sensor, and the processor, the cover configured to transmit the light into a passenger compartment with a specific shape when the light is emitted,
   wherein the cover includes:
   a pattern member having a pattern corresponding to the specific shape, the pattern member configured to transmit the light through the pattern;
   a film member having a prescribed light transmissivity to output the light, transmitted through the pattern, to an outside, wherein the touch sensor is positioned to correspond to a location of the pattern; and
   a surface formed of the same material as a material forming a vehicle interior part and provided on the film member, wherein a region of the surface corresponding to the location of the pattern is thinner than a region of the surface not corresponding to the location of the pattern,
   wherein, when a predetermined time passes after light is generated, the processor is configured to control the light emitting unit not to output the light and deactivate the touch sensor,
   wherein the light emitting unit is located near a driver seat in the passenger compartment,
   wherein the shape is an ignition button shape,
   wherein the processor is further configured to provide a signal to control any one function among a plurality of control functions of an ignition device in response to the touch input,
   wherein the processor is further configured to control the light emitting unit based on vehicle information, and
   wherein the processor is further configured to:
   receive vehicle speed information included in the vehicle information,
   control the light emitting unit not to emit light when a vehicle speed value is not zero, and
   control the light emitting unit to emit light when an emergency situation occurs when the vehicle speed value is not zero.

2. The vehicle user interface apparatus according to claim 1, wherein the surface includes a synthetic resin material, a fabric material, a leather material, a wood material, or a metal material.

3. The vehicle user interface apparatus according to claim 1, further comprising:
   a transparent flexible printed circuit board on which the touch sensor and the processor are disposed.

4. The vehicle user interface apparatus according to claim 1, further comprising:
   a light guide film configured to transmit the light emitted by the light emitting unit to the cover,
   wherein the light guide film includes:
   a first light guide film;
   a second light guide film interposed between the first light guide film and the cover;
   a third light guide film provided on the first light guide film, and
   wherein an etching portion is provided on the first light guide film or the second light guide film and the etching portion is formed to correspond to the shape.

5. The vehicle user interface apparatus according to claim 4, wherein the etching portion is provided on a surface of the first light guide film, which comes into contact with the third light guide film, or the etching portion is provided on a surface of the second light guide film, which comes into contact with the first light guide film,
   wherein light is introduced into the first light guide film and the second light guide film along different paths, and
   wherein the light guide film uniformly transmits the light emitted by the light emitting unit to the cover.

6. The vehicle user interface apparatus according to claim 4, further comprising at least one of:
   an optical clear film to guide the light emitted by the light emitting unit to the light guide film;
   a color film to change a wavelength of the light emitted by the light emitting unit; and
   a plastic member to support reflection of the light emitted by the light emitting unit.

7. The vehicle user interface apparatus according to claim 6, wherein the plastic member comprises an injection molded plastic member including the light emitting unit, the touch sensor, and the processor disposed on the cover.

8. The vehicle user interface apparatus according to claim 1, wherein the processor is further configured to:
   control the light emitting unit to emit light in response to a first touch when the first touch is sensed by the touch sensor, and
   provide the signal to control the vehicle device in response to a second touch when the second touch is sensed by the touch sensor.

9. The vehicle user interface apparatus according to claim 1, further comprising:
   a circuit board on which the light emitting unit is mounted using an optical soldering technique.

10. The vehicle user interface apparatus according to claim 1, wherein the plurality of control functions includes:
    a first function of starting the vehicle;
    a second function of turning on an electronic device provided in the vehicle; and
    a third function of turning off the vehicle.

11. The vehicle user interface apparatus according to claim 1, further comprising:
a haptic output unit configured to output a vibration pattern corresponding to one of the plurality of control functions based on control of the processor.

12. The vehicle user interface apparatus according to claim 1,
wherein the vehicle information includes at least one of vehicle location information, the vehicle speed information, gear lever position information, door opening/closing information, safety belt status information, brake pedal position information, Idle Stop and Go function on/off information, passenger information, driver's biometric information, seat position information, and audio volume control information.

13. The vehicle user interface apparatus according to claim 12, wherein the processor is further configured to:
receive the door opening/closing information, and
control the light emitting unit to emit light upon receiving information related to opening of a driver's seat door.

14. The vehicle user interface apparatus according to claim 12, wherein the processor is further configured to:
receive the safety belt status information, and
control the light emitting unit to emit light upon receiving information related to a fastened status of a safety belt of a driver seat or emit light upon receiving information related to a fastened status of safety belts of all seats on which passengers are located.

15. The vehicle user interface apparatus according to claim 12, wherein the processor is further configured to:
receive the brake pedal position information,
control the light emitting unit to emit light upon receiving the brake pedal position information based on a pressed brake pedal,
receive the gear lever position information,
control the light emitting unit to emit light upon receiving gear lever position information indicative of a parking position P or a neutral position N,
receive the gear lever position information, and
control the light emitting unit not to emit light upon receiving the gear lever position information indicative of a drive position D or a reverse position R.

16. The vehicle user interface apparatus according to claim 15, wherein the processor is further configured to provide a signal to output a warning upon receiving the gear lever position information indicative of the drive position D or the reverse position R when the vehicle is parked.

17. The vehicle user interface apparatus according to claim 12, wherein the processor is further configured to:
receive the Idle Stop and Go function on/off information, and
control the light emitting unit not to emit light upon receiving information indicating an engine of the vehicle is not being operated based on an Idle Stop and Go function.

18. The vehicle user interface apparatus according to claim 12, further comprising:
a biometric sensing unit to acquire a driver's biometric information,
wherein the processor is further configured to control the light emitting unit to emit light when the driver's biometric information matches pre-stored information.

19. The vehicle user interface apparatus according to claim 12, wherein the processor is configured to:
receive the vehicle location information, and
control the light emitting unit to emit light when a location of the vehicle corresponds to a pre-registered area, and
wherein the vehicle location information is based on global positioning system (GPS) information or vehicle surrounding image information.

20. The vehicle user interface apparatus according to claim 12, further comprising:
an internal camera to acquire passenger information,
wherein the processor is further configured not to provide a signal to control any one function among the plurality of control functions of the ignition device upon receiving a touch input from a passenger other than a user who is located in the driver seat.

21. The vehicle user interface apparatus according to claim 12, wherein the processor is further configured to:
receive the seat position information,
control the light emitting unit to emit light based on the seat position information, and
provide a signal to a seat adjustment device in response to a touch sensed by the touch sensor,
wherein the light emitting unit comprises a plurality of light sources,
wherein the cover comprises a plurality of patterns which are formed respectively corresponding to the plurality of light sources and through which lights emitted by the plurality of light sources are transmitted, and
wherein the processor is further configured to control at least one of the plurality of light sources to emit light indicative of a particular seat position.

22. The vehicle user interface apparatus according to claim 12, wherein the processor is further configured to:
receive the audio volume control information,
control the light emitting unit to emit light based on the audio volume control information, and
provide a signal to an audio volume control device in response to the touch sensed by the touch sensor,
wherein the light emitting unit comprises a plurality of light sources,
wherein the cover comprises a plurality of patterns which are formed respectively corresponding to the plurality of light sources and through which lights emitted by the plurality of light sources are transmitted, and
wherein the processor is configured to control at least one of the plurality of light sources to emit light indicative of a particular audio volume level.

23. The vehicle user interface apparatus according to claim 1, wherein the processor is further configured to at least one of change a position of light output from the light emitting unit based on the event and adjust a color of the light output from the light emitting unit based on the event.

24. The vehicle user interface apparatus according to claim 1, wherein the vehicle device is any one of a vehicle multimedia device, a vehicle air conditioner, a vehicle window device, a vehicle lamp, a trunk opening/closing device, a hood opening/closing device, a sunroof opening/closing device, a gas tank door opening/closing device, a sun visor folding control device, a door lock device, and a seat adjustment device, and
wherein the processor is further configured to provide a signal to control any one of the vehicle multimedia device, the vehicle air conditioner, the vehicle window device, the vehicle lamp, the trunk opening/closing device, the hood opening/closing device, the sunroof opening/closing device, the gas tank door opening/closing device, the sun visor folding control device, the door lock device, and the seat adjustment device.

25. The vehicle user interface apparatus according to claim 1, wherein the light emitting unit is disposed on any one of a vehicle dashboard, an inner surface of a door, a console, an inner surface of a roof, a seat, a sun visor, an A-pillar, a B-pillar, and a C-pillar.

26. The vehicle user interface apparatus according to claim 1, further comprising:
an interface,
wherein the processor is configured to:
control the light emitting unit to emit light upon receiving vehicle door opening information or vehicle starting-on information via the interface, and
control dimming of light generated by the light emitting unit when a predetermined time passes after the vehicle door opening information or the vehicle starting-on information is received.

27. A vehicle comprising the vehicle user interface apparatus according to claim 1.

* * * * *